(12) United States Patent
Tsutsui

(10) Patent No.: US 10,936,410 B2
(45) Date of Patent: Mar. 2, 2021

(54) MEMORY SYSTEM AND INFORMATION PROCESSING SYSTEM

(71) Applicant: SEMICONDUCTOR ENERGY LABORATORY CO., LTD., Atsugi (JP)

(72) Inventor: Naoaki Tsutsui, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 320 days.

(21) Appl. No.: 15/162,035

(22) Filed: May 23, 2016

(65) Prior Publication Data

US 2016/0350182 A1 Dec. 1, 2016

(30) Foreign Application Priority Data

May 26, 2015 (JP) .............................. JP2015-106706

(51) Int. Cl.
*G06F 11/00* (2006.01)
*G06F 11/10* (2006.01)
(Continued)

(52) U.S. Cl.
CPC ...... *G06F 11/1052* (2013.01); *G06F 11/2221* (2013.01); *G11C 11/405* (2013.01); (Continued)

(58) Field of Classification Search
CPC ............. G06F 11/1052; G06F 11/1076; G06F 11/1008; G06F 11/106; G06F 11/1006; (Continued)

(56) References Cited

U.S. PATENT DOCUMENTS 4,010,453 A 3/1977 Lewis
4,547,868 A 10/1985 Childers et al.
(Continued)

FOREIGN PATENT DOCUMENTS

EP 0907128 A 4/1999
JP 03-154945 A 7/1991
(Continued)

OTHER PUBLICATIONS

Ohmaru.T "Eight-Bit CPU With Nonvolatile Registers Capable of Holding Data for 40 Days at 85° C. Using Crystalline In—Ga—Zn Oxide Thin Film Transistors", Extended Abstracts of the 2012 International Conference on Solid State Devices and Materials, pp. 1144-1145, dated in 2012.

(Continued)

*Primary Examiner* — Albert Decady
*Assistant Examiner* — Osman M Alshack
(74) *Attorney, Agent, or Firm* — Nixon Peabody LLP; Jeffrey L. Costellia

(57) ABSTRACT

A memory system that includes an error check and correct (ECC) circuit is provided. The memory system includes a memory, a circuit, and a processor. The memory system has a function of receiving write data from the outside. The memory includes a user data region, a first management region, and a second management region. The user data region stores the write data. The circuit has a function of performing ECC processings on the write data read from the user data region. The first management region stores data that indicates whether the user data region has stored the write data or not. The second management region stores data that indicates whether the circuit has performed the ECC processings on the write data read from the user data region or not.

12 Claims, 43 Drawing Sheets

(51) Int. Cl.

| | | |
|---|---|---|
| *G06F 11/22* | (2006.01) | |
| *G11C 29/38* | (2006.01) | |
| *G11C 29/44* | (2006.01) | |
| *G11C 11/408* | (2006.01) | |
| *H01L 27/108* | (2006.01) | |
| *G11C 11/405* | (2006.01) | |
| *H01L 27/12* | (2006.01) | |
| *G11C 29/52* | (2006.01) | |
| *G06F 11/30* | (2006.01) | |
| *G11C 29/04* | (2006.01) | |

(52) U.S. Cl.
CPC ............ *G11C 11/408* (2013.01); *G11C 29/38* (2013.01); *G11C 29/44* (2013.01); *H01L 27/10814* (2013.01); *H01L 27/1225* (2013.01); *G06F 11/3037* (2013.01); *G11C 29/52* (2013.01); *G11C 2029/0411* (2013.01); *G11C 2211/4016* (2013.01)

(58) Field of Classification Search
CPC ............ G06F 11/1068; G06F 11/1044; G06F 11/1056; G11C 11/405; G11C 11/408; G11C 29/52; G11C 2029/0411; G11C 2211/4016; H04L 27/10814; G11B 20/1833
USPC .......................................... 714/763, 764, 766
See application file for complete search history.

(56) References Cited

U.S. PATENT DOCUMENTS

| | | | |
|---|---|---|---|
| 5,252,846 A | 10/1993 | Tanaka et al. | |
| 5,266,509 A | 11/1993 | Chen | |
| 5,364,805 A | 11/1994 | Taura et al. | |
| 6,011,729 A | 1/2000 | Choi | |
| 6,337,824 B1 | 1/2002 | Kono et al. | |
| 6,421,289 B1 | 7/2002 | Lu et al. | |
| 6,460,145 B1 | 10/2002 | Sassa et al. | |
| 6,787,825 B1 | 9/2004 | Gudesen et al. | |
| 6,810,490 B2 | 10/2004 | Sassa et al. | |
| 6,841,813 B2 | 1/2005 | Walker et al. | |
| 6,982,897 B2 | 1/2006 | Luk et al. | |
| 7,129,538 B2 | 10/2006 | Lee et al. | |
| 7,137,027 B2 | 11/2006 | Shiota et al. | |
| 7,190,602 B2 | 3/2007 | Johnson et al. | |
| 7,353,424 B2 | 4/2008 | Sassa et al. | |
| 7,447,936 B2 | 11/2008 | Shiota et al. | |
| 7,674,650 B2 | 3/2010 | Akimoto et al. | |
| 7,889,538 B2 | 2/2011 | Toda | |
| 7,939,890 B2 | 5/2011 | Yamauchi | |
| 8,008,137 B2 | 8/2011 | Wu et al. | |
| 8,072,798 B2 | 12/2011 | Takeyama | |
| 8,103,899 B2 | 1/2012 | Shiota et al. | |
| 8,278,162 B2 | 10/2012 | Akimoto et al. | |
| 8,482,974 B2 | 7/2013 | Saito et al. | |
| 8,484,409 B2 | 7/2013 | Honda | |
| 8,588,000 B2 | 11/2013 | Kamata | |
| 8,604,476 B2 | 12/2013 | Kato et al. | |
| 8,614,916 B2 | 12/2013 | Nagatsuka et al. | |
| 8,619,470 B2 | 12/2013 | Kato | |
| 8,654,567 B2 | 2/2014 | Saito | |
| 8,669,778 B1 | 3/2014 | Or-Bach et al. | |
| 8,730,730 B2 | 5/2014 | Koyama et al. | |
| 8,737,109 B2 | 5/2014 | Yamazaki et al. | |
| 8,780,629 B2 | 7/2014 | Furutani et al. | |
| 8,809,853 B2 | 8/2014 | Saito et al. | |
| 8,976,571 B2 | 3/2015 | Kamata | |
| 9,059,029 B2 | 6/2015 | Arai | |
| 9,240,244 B2 | 1/2016 | Nagatsuka et al. | |
| 9,318,374 B2 | 4/2016 | Atsumi et al. | |
| 9,373,724 B2 | 6/2016 | Shimizu et al. | |
| 9,852,023 B2* | 12/2017 | Tsutsui ............... | G11C 29/52 |
| 2001/0004273 A1 | 6/2001 | Sugimoto et al. | |
| 2002/0139980 A1 | 10/2002 | Yamazaki | |
| 2004/0156251 A1 | 8/2004 | Shiota et al. | |
| 2007/0034873 A1 | 2/2007 | Yamazaki et al. | |
| 2007/0194323 A1 | 8/2007 | Takano et al. | |
| 2007/0211535 A1 | 9/2007 | Kim | |
| 2008/0023696 A1 | 1/2008 | Yukawa et al. | |
| 2008/0288814 A1 | 11/2008 | Kitahara | |
| 2008/0316826 A1 | 12/2008 | Yamauchi | |
| 2009/0158124 A1* | 6/2009 | Kawai ............... | G06F 3/0614 |
| | | | 714/763 |
| 2009/0200536 A1 | 8/2009 | Van Schaijk et al. | |
| 2009/0241010 A1* | 9/2009 | Yano ............... | G06F 11/1072 |
| | | | 714/764 |
| 2010/0032668 A1 | 2/2010 | Yamazaki et al. | |
| 2010/0107021 A1 | 4/2010 | Nagadomi et al. | |
| 2010/0314676 A1 | 12/2010 | Akiyama et al. | |
| 2011/0122670 A1 | 5/2011 | Yamazaki et al. | |
| 2011/0128777 A1 | 6/2011 | Yamazaki et al. | |
| 2011/0176348 A1 | 7/2011 | Yamazaki et al. | |
| 2011/0176377 A1 | 7/2011 | Koyama | |
| 2011/0205774 A1 | 8/2011 | Takemura | |
| 2011/0271032 A1* | 11/2011 | Yamada ............... | G06F 11/106 |
| | | | 711/102 |
| 2011/0286256 A1 | 11/2011 | Kamata | |
| 2012/0001243 A1 | 1/2012 | Kato | |
| 2012/0033483 A1 | 2/2012 | Koyama | |
| 2012/0099368 A1 | 4/2012 | Kamata | |
| 2012/0106226 A1* | 5/2012 | Saito ............... | G11C 11/404 |
| | | | 365/51 |
| 2012/0112191 A1 | 5/2012 | Kato et al. | |
| 2012/0120715 A1 | 5/2012 | Saito | |
| 2012/0246540 A1* | 9/2012 | Lee ............... | G06F 12/0246 |
| | | | 714/758 |
| 2012/0317340 A1* | 12/2012 | So ............... | G06F 11/1068 |
| | | | 711/103 |
| 2013/0061088 A1* | 3/2013 | Nomura ............... | G06F 11/073 |
| | | | 714/6.13 |
| 2013/0070506 A1 | 3/2013 | Kajigaya | |
| 2013/0254463 A1* | 9/2013 | Matsunaga ......... | G06F 12/0246 |
| | | | 711/103 |
| 2014/0298086 A1* | 10/2014 | Haneda ............... | G11C 7/10 |
| | | | 714/6.3 |
| 2015/0131386 A1* | 5/2015 | Yeh ............... | G11C 16/14 |
| | | | 365/185.29 |
| 2015/0154125 A1* | 6/2015 | Ishii ............... | G06F 11/1048 |
| | | | 714/768 |
| 2015/0263007 A1 | 9/2015 | Yamazaki et al. | |
| 2016/0211266 A1 | 7/2016 | Kurokawa | |
| 2016/0253236 A1 | 9/2016 | Tsutsui | |
| 2016/0329103 A1* | 11/2016 | Watanabe .......... | G11C 16/0483 |
| 2016/0336055 A1 | 11/2016 | Kato | |
| 2016/0351243 A1 | 12/2016 | Ishizu et al. | |
| 2017/0117283 A1 | 4/2017 | Matsuzaki et al. | |

FOREIGN PATENT DOCUMENTS

| | | |
|---|---|---|
| JP | 11-110306 A | 4/1999 |
| JP | 2001-351386 A | 12/2001 |
| JP | 2004-240793 A | 8/2004 |
| JP | 2005-078378 | 3/2005 |
| JP | 2011-187950 | 9/2011 |

OTHER PUBLICATIONS

Kobayashi.H et al. "Processor with 4.9-μs break-even time in power gating using crystalline In—Ga—Zn-oxide transistor", Cool Chips XVI, pp. 1-3, dated on Apr. 17, 2013.

Sjokvist.N "Zero Area Overhead State Retention Flip Flop Utilizing Crystalline In—Ga—Zn Oxide Thin Film Transistor with Simple Power Control Implemented in a 32-bit CPU", SSDM 2013 (Extended Abstracts of the 2013 International Conference on Solid State Devices and Materials), pp. 1088-1089, dated on Sep. 24, 2013.

Tamura.H et al. "Embedded SRAM and Cortex-M0 Core with Backup Circuits Using a 60-nm Crystalline Oxide Semiconductor for Power Gating", IEEE Cool Chips XVII, 3pages, dated on Apr. 14, 2014.

(56) References Cited

OTHER PUBLICATIONS

Isobe.A et al. "A 32-bit CPU with Zero Standby Power and 1.5-clock Sleep/2.5-clock Wake-up Achieved by Utilizing a 180-nm C-axis Aligned Crystalline In—Ga—Zn Oxide Transistor", 2014 Symposium on VLSI Circuits Digest of Technical Papers, pp. 49-50, dated on Jun. 10, 2014.

Atsumi.T et al. "DRAM Using Crystalline Oxide Semiconductor for Access Transistors and Not Requiring Refresh for More Than Ten Days", IMW 2012 (4th IEEE International Memory Workshop), pp. 99-102, dated in 2012.

Nagatsuka.S et al. "A 3bit/cell Nonvolatile Memory with Crystalline In—Ga—Zn—O TFT", IMW 2013 (5th IEEE International Memory Workshop), pp. 188-191, dated on May 26, 2013.

Ishizu.T et al. "SRAM with C-Axis Aligned Crystalline Oxide Semiconductor: Power Leakage Reduction Technique for Microprocessor Caches", IMW 2014 (6th IEEE International Memory Workshop), pp. 103-106, dated on May 18, 2014.

Onuki.T et al. "DRAM with Storage Capacitance of 3.9 fF using CAAC-OS Transistor with L of 60 nm and having More Than 1-h Retention Characteristics", SSDM 2014 (Extended Abstracts of the 2014 International Conference on Solid State Devices and Materials), pp. 430-431, dated on Sep. 8, 2014.

Matsuzaki.T et al. "A 128kb 4b/cell Nonvolatile Memory with Crystalline In—Ga—Zn Oxide FET Using Vt Cancel Write Method", ISSCC 2015 (Digest of Technical Papers. IEEE International Solid-State Circuits Conference), pp. 306-307, dated on Feb. 22, 2015.

Kobayashi.Y et al. "Scaling to 100nm Channel Length of Crystalline In—Ga—Zn-Oxide Thin Film Transistors with Extremely Low Off-State Current", SSDM 2013 (Extended Abstracts of the 2013 International Conference on Solid State Devices and Materials), pp. 930-931, dated on Sep. 24, 2013.

Yakubo.Y et al. "High-speed and Low-leakage Characteristics of 60-nm C-axis Aligned Crystalline Oxide Semiconductor FET with GHz-ordered Cutoff Frequency", SSDM 2014 (Extended Abstracts of the 2014 International Conference on Solid State Devices and Materials), pp. 648-649, dated on Sep. 8, 2014.

Murotani.T et al. "A 4-level storage 4Gb DRAM", ISSCC 97 (Digest of Technical Papers. IEEE International Solid-State Circuits Conference), pp. 74-75.

\* cited by examiner

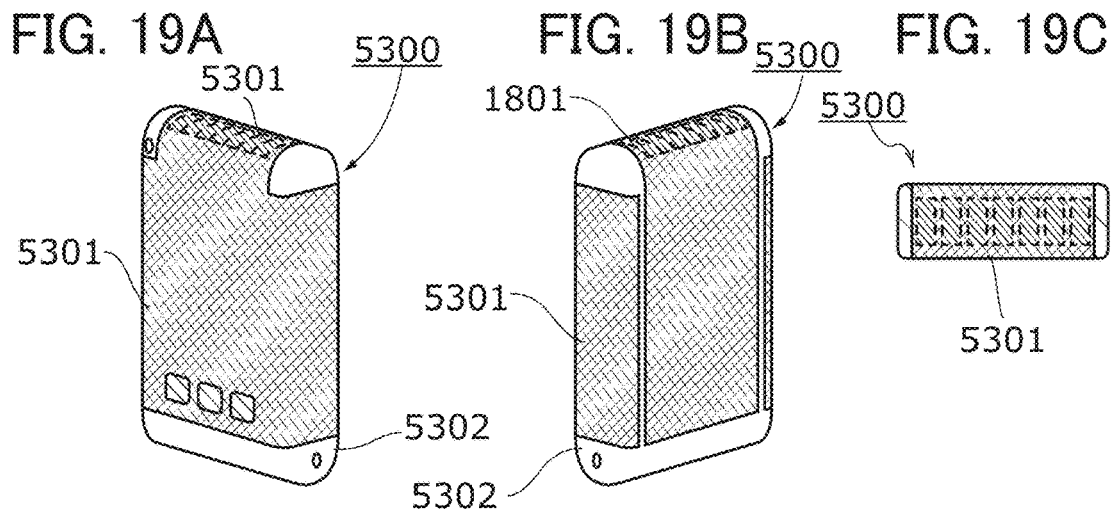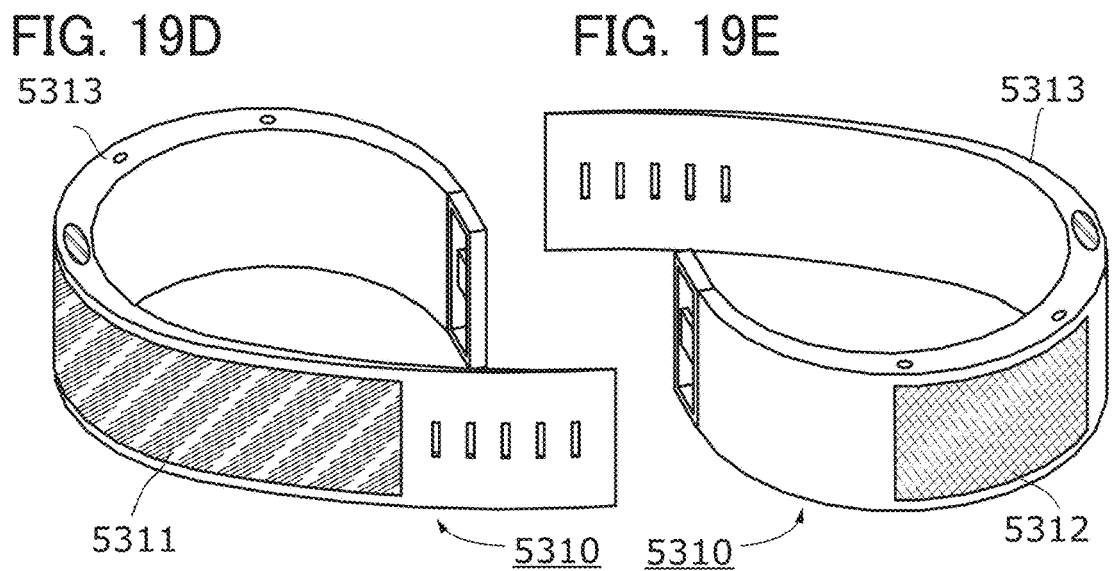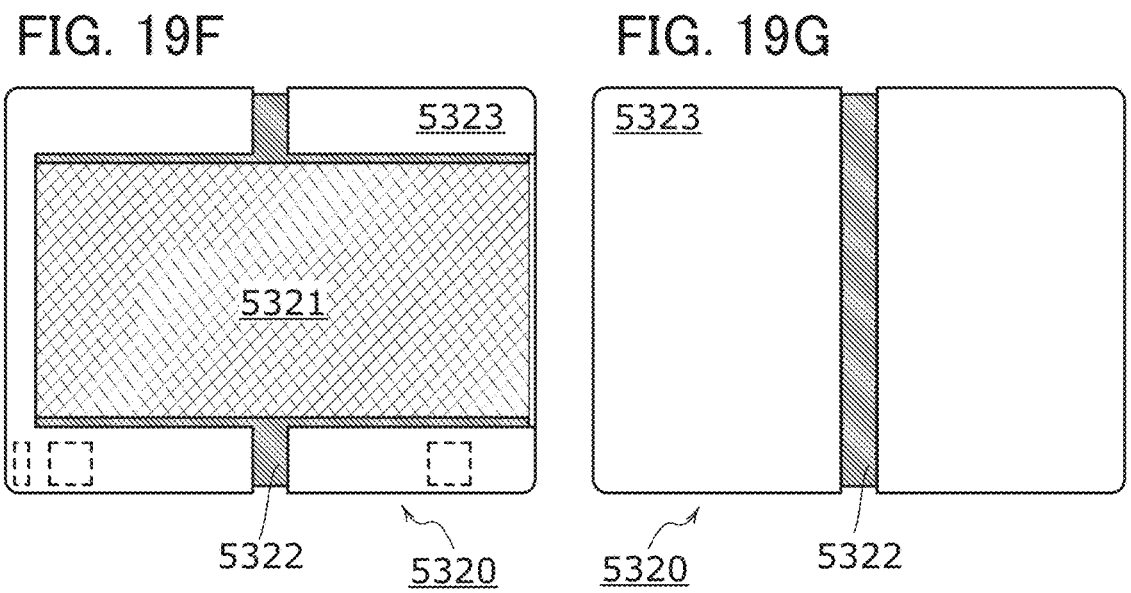

FIG. 21A
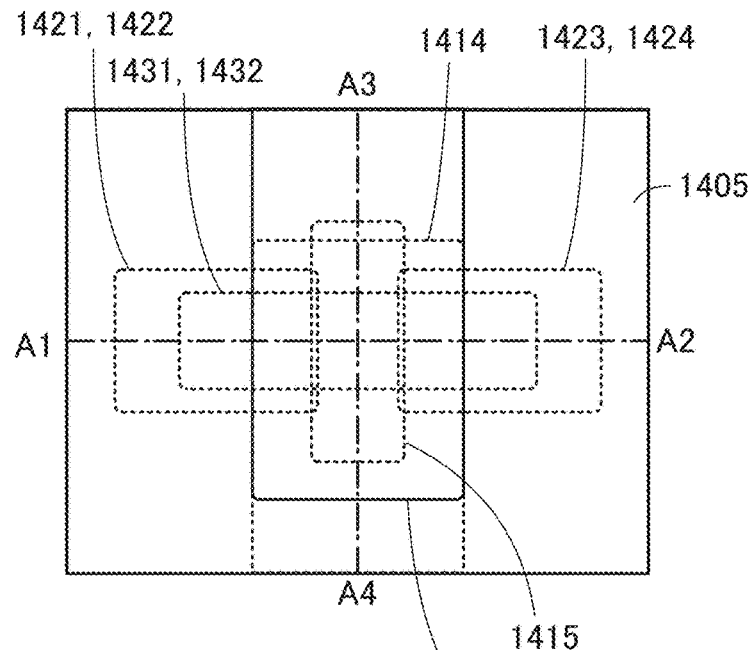
FIG. 21B
FIG. 21C
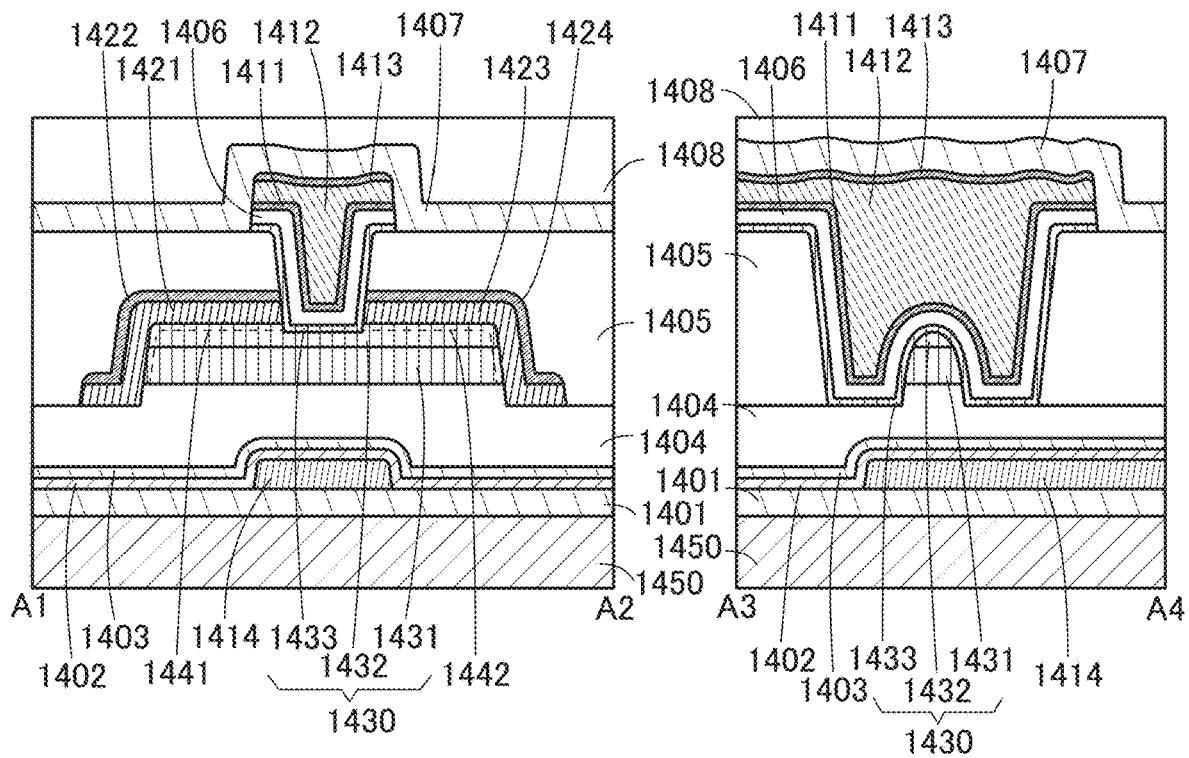

FIG. 28A
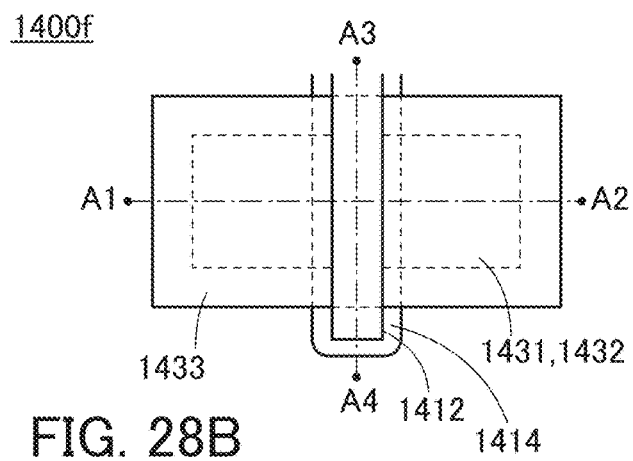
FIG. 28B
FIG. 28C
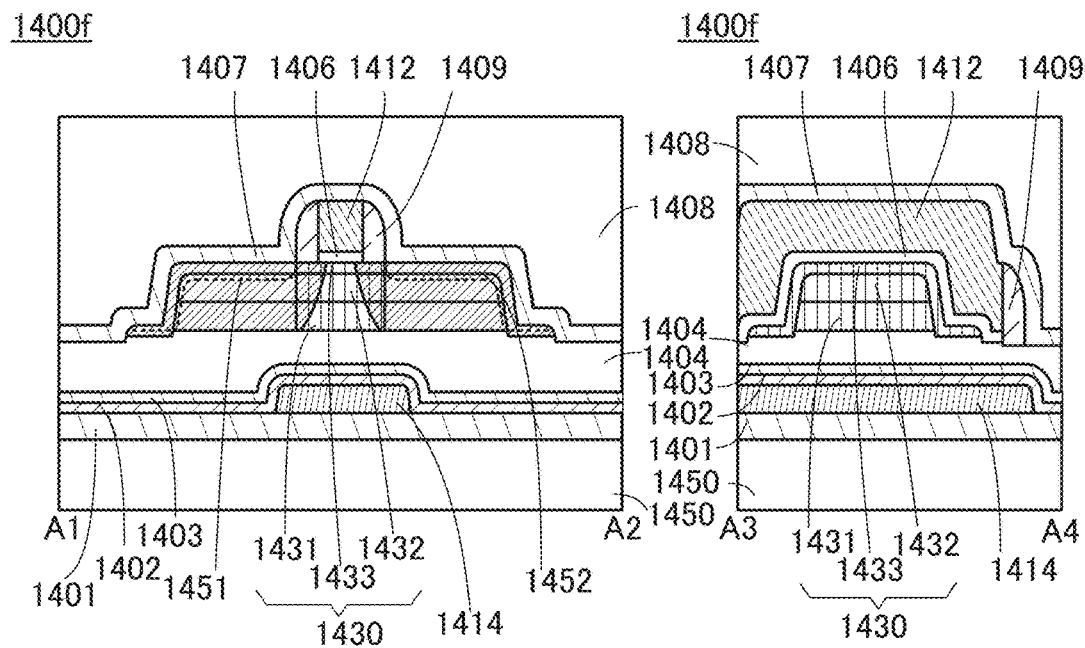
FIG. 28D
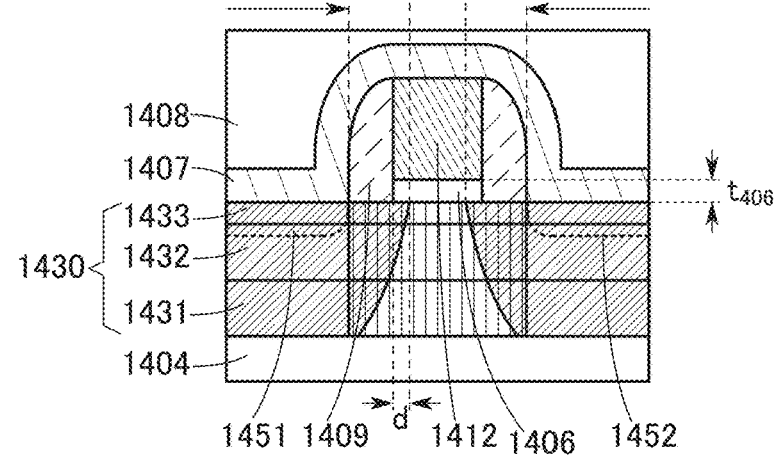

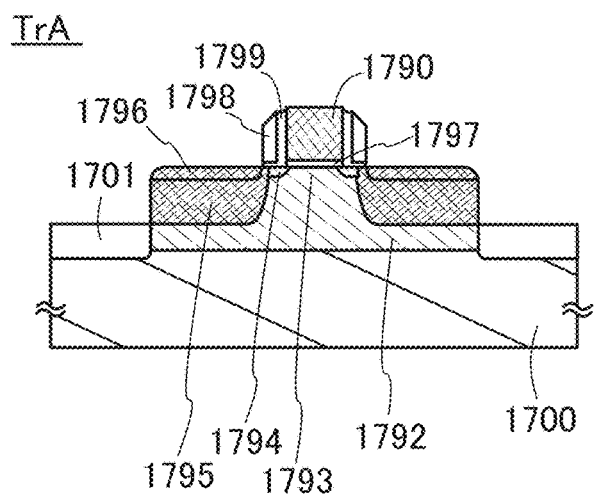
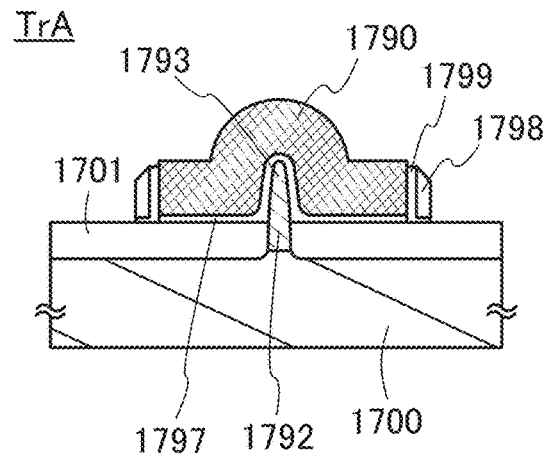
FIG. 32A
FIG. 32B

MEMORY SYSTEM AND INFORMATION PROCESSING SYSTEM

BACKGROUND OF THE INVENTION

1. Field of the Invention

The present invention relates to memory systems and information processing systems.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a storage device, a processor, an electronic device, a method for driving any of them, a method for manufacturing any of them, a method for testing any of them, and a system including any of them.

2. Description of the Related Art

As memory cells used in random access memories (RAM), 1T1C (one transistor-one capacitor)-type memory cells and 2T-type or 3T-type memory cells are known. These memory cells store data by charging and discharging retention nodes with write transistors.

It has been proposed that a transistor whose channel formation region is formed using an oxide semiconductor (hereinafter also referred to as an oxide semiconductor transistor or an OS transistor) is employed as a write transistor in these memory cells. For example, Patent Document 1 discloses a memory cell that can retain data even in the situation in which power is not supplied, by including the OS transistor as a write transistor. A memory including an OS transistor can be used as a nonvolatile memory.

Patent Document

Patent Document 1: Japanese Published Patent Application No. 2011-187950

Non-Patent Document

Non-Patent Document 1: T. Ohmaru et al., "Eight-bit CPU with Nonvolatile Registers Capable of Holding Data for 40 Days at 85° C. Using Crystalline In—Ga—Zn Oxide Thin Film Transistors," *Ext. Abstr. Solid-State Devices and Materials*, 2012, pp. 1144-1145.

Non-Patent Document 2: H. Kobayashi et al., "Processor with 4.9-μs break-even time in power gating using crystalline In—Ga—Zn-oxide transistor," *Cool Chips XVI*, Session VI, 2013.

Non-Patent Document 3: S. Niclas et al., "Zero Area Overhead State Retention Flip Flop Utilizing Crystalline In—Ga—Zn Oxide Thin Film Transistor with Simple Power Control Implemented in a 32-bit CPU," *Ext. Abstr. Solid-State Devices and Materials*, 2013, pp. 1088-1089.

Non-Patent Document 4: H. Tamura et al., "Embedded SRAM and Cortex-M0 Core with Backup Circuits Using a 60-nm Crystalline Oxide Semiconductor for Power Gating," *Cool Chips XVII, Session XII*, 2014.

Non-Patent Document 5: A. Isobe et al., "A 32-bit CPU with Zero Standby Power and 1.5-clock Sleep/2.5-clock Wake-up Achieved by Utilizing a 180-nm C-axis Aligned Crystalline In—Ga—Zn Oxide Transistor," *IEEE Symp. VLSI circuits*, 2014, pp. 49-50.

Non-Patent Document 6: T. Atsumi et al., "DRAM Using Crystalline Oxide Semiconductor for Access Transistors and not Requiring Refresh for More Than Ten Days," *International Memory Workshop*, 2012, pp. 99-102.

Non-Patent Document 7: S. Nagatsuka et al., "A 3 bit/cell Nonvolatile Memory with Crystalline In—Ga—Zn—O TFT," *International Memory Workshop*, 2013, pp. 188-191.

Non-Patent Document 8: T. Ishizu et al., "SRAM with C-Axis Aligned Crystalline Oxide Semiconductor: Power Leakage Reduction Technique for Microprocessor Caches," *International Memory Workshop*, 2014, pp. 103-106.

Non-Patent Document 9: T. Onuki et al., "DRAM with Storage Capacitance of 3.9 fF using CAAC-OS Transistor with L of 60 nm and having More Than 1-h Retention Characteristics," *Ext. Abstr. Solid-State Devices and Materials*, 2014, pp. 430-431.

Non-Patent Document 10: T. Matsuzaki et al., "A 128 kb 4 bit/cell nonvolatile memory with crystalline In—Ga—Zn oxide FET using Vt cancel write method," *ISSCC Dig. Tech. Papers*, pp. 306-307, February, 2015.

Non-Patent Document 11: Y. Kobayashi et al., "Scaling to 100 nm Channel Length of Crystalline In—Ga—Zn—Oxide Thin Film Transistors with Extremely Low Off-State Current," *Ext. Abstr. Solid-State Devices and Materials*, 2013, pp. 930-931.

Non-Patent Document 12: Y. Yakubo et al., "High-speed and Low-leakage Characteristics of 60-nm C-axis Aligned Crystalline Oxide Semiconductor FET with GHz-ordered Cutoff Frequency," *Ext. Abstr. Solid-State Devices and Materials*, 2014, pp. 648-649.

SUMMARY OF THE INVENTION

A memory cell such as a 1T1C-type, 2T-type, or 3T-type memory cell stores data by charging and discharging of a retention node, so that deterioration does not occur in principle. Therefore, the memory cell is less likely to cause an error due to deterioration than a flash memory. When an OS transistor is used as a write transistor, soft-error tolerance can be increased. However, even in the memory cell, the number of defective memory cells may be increased because of the influence of variation in electrical characteristics of elements.

In recent years, a variety of electronic devices have been downsized. Accordingly, semiconductor devices that include the electronic devices need to be miniaturized. In addition, the amount of data processed in electronic devices has been increased, so that the increase in memory capacity of storage devices has been demanded. Examples of methods for increasing the memory capacity of storage devices include a method for using a 3-D structure in which a plurality of memory cell arrays are stacked and a method for multiplying memory cells.

When the number of memory cells is increased to increase the memory capacity of storage devices, the percentage of defective memory cells might also be increased. When memory cells are multiplied for a similar purpose, the range of retention potentials showing data is narrowed, so that there might be a difference between written data and read data because of the influence of variation in electrical characteristics of elements.

Therefore, just in case the number of defective memory cells is increased, it is necessary to form a system that manages the defective memory cells and performs error check and correct (ECC) processings.

It is an object of one embodiment of the present invention to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a novel storage device, a novel module, a novel electronic device, a novel system, or the like.

Another object of one embodiment of the present invention is to provide a novel storage device that performs error check and correct processings. Another object of one embodiment of the present invention is to provide a novel storage device in which retained data is not changed. Another object of one embodiment of the present invention is to provide a novel storage device with low power consumption. Another object of one embodiment of the present invention is to provide a novel storage device with high memory capacity.

Note that the objects of the present invention are not limited to the above objects. The above objects do not disturb the existence of other objects. The other objects are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1)

One embodiment of the present invention is a memory system that includes a memory, a circuit, and a processor. The memory system has a function of receiving write data from an outside. The memory includes a user data region, a first management region, and a second management region. The user data region includes a plurality of user data blocks. The user data block stores the write data. The circuit has a function of sequentially performing error check and correct processings on the write data read from the user data block. The first management region stores first data. The first data indicates whether the user data block has stored the write data or not. The first data has a first value showing that the user data block does not store the write data or a second value showing that the user data block stores the write data. The second management region stores second data. The second data indicates whether the circuit has performed the error check and correct processings on the write data read from the user data block or not. The second data has a third value showing that the circuit does not perform the error check and correct processings on the write data read from the user data block or a fourth value showing that the circuit has performed the error check and correct processings on the write data read from the user data block.

(2)

According to another embodiment of the present invention, in the memory system described in (1), the first management region includes a plurality of first blocks. The plurality of first blocks are associated with the plurality of user data blocks. When the write data is stored in the user data block, the processor sets a value of the first data to the second value in the first block corresponding to the user data block.

(3)

According to another embodiment of the present invention, in the memory system described in (1) or (2), the second management region includes a plurality of second blocks. The plurality of second blocks are associated with the plurality of user data blocks. When error check and correct processings are sequentially performed on the write data read from the user data block, the processor sets a value of the second data to the fourth value in the second block corresponding to the user data block.

(4)

According to another embodiment of the present invention, the memory system described in any of (1) to (3) has a function of receiving a logical address of the write data from an outside. The logical address includes index data and an offset within the block. The memory includes a third management region. The third management region includes a plurality of third blocks. The plurality of third blocks store the index data and third data. The third data indicates address data of the user data block. When the write data is read from the user data block, in the third management region, the processor refers to the address data from the index data and calculates a physical address from the address data and the offset within the block.

(5)

According to another embodiment of the present invention, in the memory system described in (4), when power is turned on, the processor erases the third data included in the plurality of third blocks of the third management region.

(6)

According to another embodiment of the present invention, in the memory system described in any of (1) to (5), when power is turned on, the processor writes the first value to the plurality of first blocks of the first management region and writes the third value to the plurality of second blocks of the second management region.

(7)

According to another embodiment of the present invention, in the memory system described in any of (1) to (6), the memory includes a plurality of memory cells. The memory cell includes a retention node and a transistor capable of controlling charging and discharging of the retention node. The transistor includes a channel formation region formed using an oxide semiconductor.

(8)

According to another embodiment of the present invention, in the memory system described in any of (1) to (7), the memory includes a plurality of memory cell arrays. The memory includes a structure where the plurality of memory cell arrays overlap.

(9)

According to another embodiment of the present invention, in the memory system described in any of (1) to (8), memory capacity of the memory is equal to or greater than one terabyte (1 TB).

(10)

Another embodiment of the present invention is an information processing system that includes the memory system described in any of (1) to (9) and a host device. The host device is connected to the memory system so that the host device can access the user data region.

According to one embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to another embodiment of the present invention, a novel storage device, a novel module, a novel electronic device, a novel system, or the like can be provided.

According to another embodiment of the present invention, a novel storage device that performs error check and correct processings can be provided. According to another embodiment of the present invention, a novel storage device in which retained data is not changed can be provided. According to another embodiment of the present invention, a novel storage device with low power consumption can be provided. According to another embodiment of the present invention, a novel storage device with high memory capacity can be provided.

Note that the effects of the present invention are not limited to the above effects. The above effects do not disturb the existence of other effects. The other effects are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings:

FIGS. 19A to 19G are schematic diagrams each illustrating a structure example of an information terminal;

FIGS. 21A to 21C are a top view and cross-sectional views illustrating a structure example of a transistor;

FIGS. 28A to 28D are a top view and cross-sectional views illustrating a structure example of a transistor;

FIGS. 32A and 32B are cross-sectional views illustrating a structure example of a memory cell;

DETAILED DESCRIPTION OF THE INVENTION

Embodiment 1

In this embodiment, a memory system including an OS transistor, an operating method thereof, and the like are described.

<Structure Example of Memory System>

Figure 1:
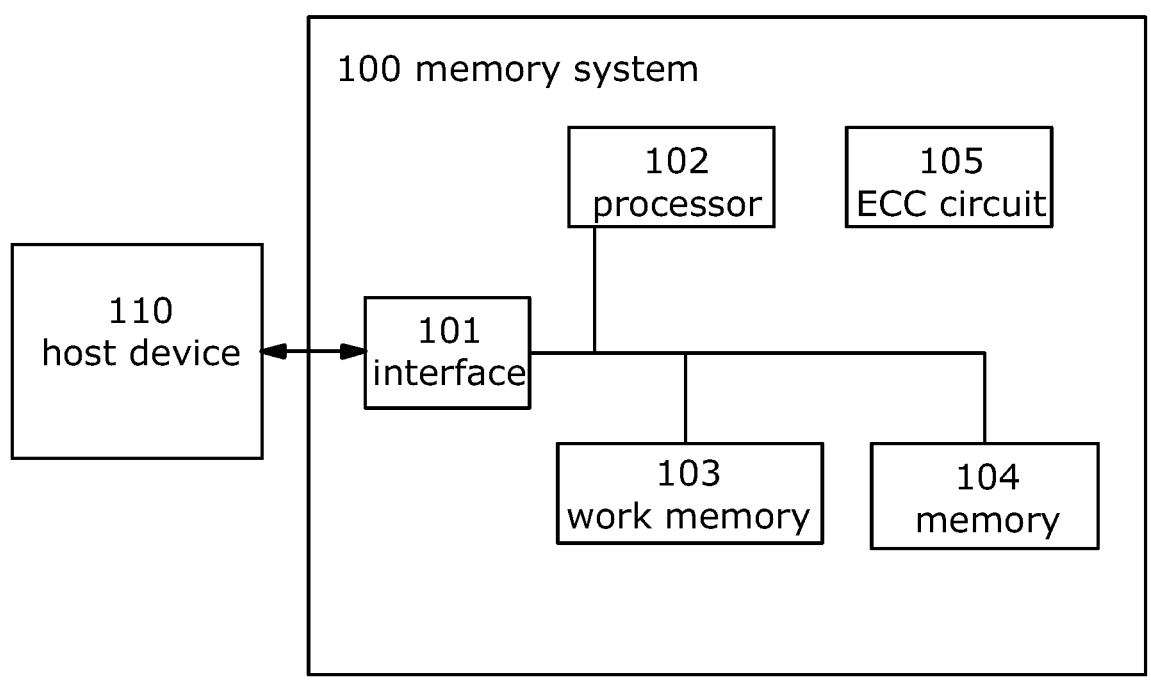
FIG. 1 is a block diagram illustrating a structure example of a memory system.

FIG. 1 is a block diagram illustrating a structure example of a memory system. A memory system 100 has a function of writing and reading data in response to an access request from a host device 110. The memory system 100 includes an interface (I/F) 101, a processor 102, a work memory 103, a memory 104, and an error check and correct (ECC) circuit 105.

The interface 101 is a controller for communication with the host device 110. The processor 102 has a function of controlling the entire operation of the memory system 100 in accordance with firmware stored in the memory 104 in response to an access request from the host device 110. The work memory 103 is a memory for temporarily storing data needed to execute firmware by the processor 102. The work memory 103 can be, for example, a memory such as a static random access memory (SRAM) or a dynamic random access memory (DRAM). The memory 104 includes a memory cell including an OS transistor. The ECC circuit 105 is a circuit for checking and correcting an error of the memory 104. For example, the ECC circuit 105 has a function of correcting an error by a BCH code, a Reed-Solomon code, a cyclic redundancy check (CRC) code, or the like.

<Structure of Memory 104>

Figure 2:
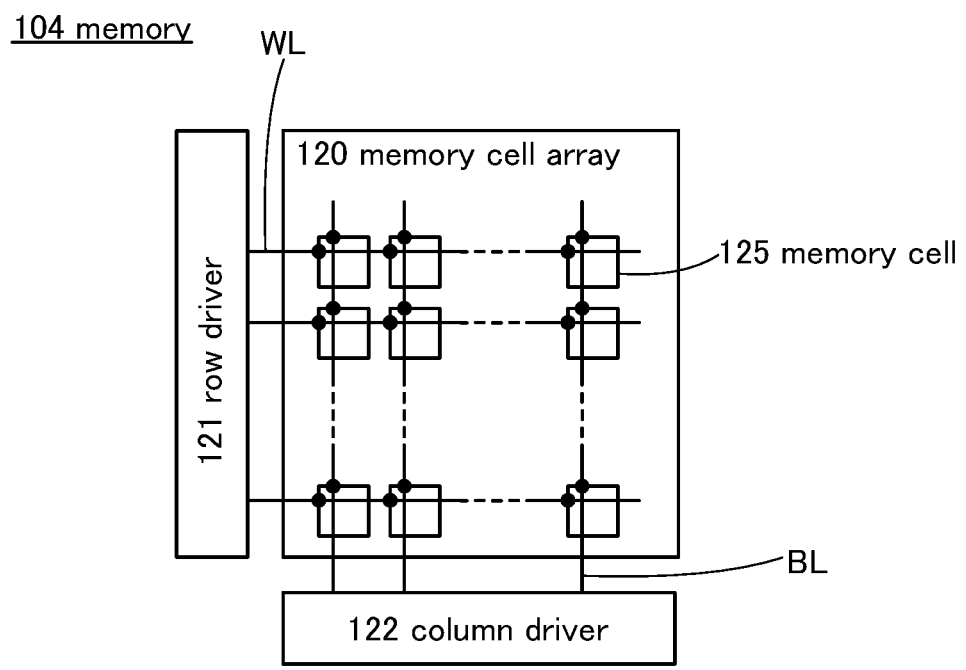
FIG. 2 is a block diagram illustrating a structure example of a memory.

FIG. 2 is a block diagram illustrating a structure example of the memory 104. The memory 104 includes a memory cell array 120, a row driver 121, and a column driver 122. The memory cell array 120 includes memory cells 125, wirings WL, and wirings BL. The number of memory cells 125 is m×n, where m memory cells 125 (m is an integer of 1 or more) are arranged in a column direction and n memory cells 125 (n is an integer of 1 or more) are arranged in a row direction. The memory cells 125 in one row are electrically connected to the wiring WL in the row. The memory cells 125 in one column are electrically connected to the wiring BL in the column.

The wiring WL is electrically connected to the row driver 121 and can function as a word line. The row driver 121 has a function of outputting a signal for selecting the memory cell 125 to which access is requested to the wiring WL. The wiring BL is electrically connected to the column driver 122 and can function as a bit line. The column driver 122 has a function of conditioning (e.g., precharging) the bit line, a function of writing data to the selected memory cell 125, and a function of reading the data from the memory cell 125.

The structure of the memory 104 in this embodiment is not limited to the structure illustrated in FIG. 2. Depending on circumstances or conditions, the memory 104 with a different structure can be used in the memory system 100. For example, the wiring WL may be changed into a write word line and a read word line, or the wiring BL may be changed into a write bit line and a read bit line. Alternatively, for example, a wiring for supplying a certain potential to circuit components (e.g., transistors and capacitors) of the memory cell 125 may be separately provided. Alternatively, for example, in accordance with the change in the number of wirings, necessary functions may be added to the row driver 121 and the column driver 122 or unnecessary functions may be eliminated from the row driver 121 and the column driver 122. In this manner, the structure of the memory 104 may be changed as appropriate depending on the structure of the memory cell array 120, the row driver 121, or the column driver 122, or an operating method thereof.

<Memory Cell 125>

FIGS. 3A to 3G each illustrate a circuit structure example of a memory cell that can be applied to the memory cell 125. Write transistors of memory cells 151 to 155 are OS transistors. Since the OS transistors have extremely low off-state current, deterioration of retained data that is caused by leakage current can be reduced when the OS transistors are used in the memory cells 151 to 155.

Here, off-state current refers to current that flows between a source and a drain when a transistor is off. For example, when the transistor is an n-channel transistor with a threshold voltage of higher than or equal to 0V and lower than or equal to 2 V, current that flows between the source and the drain when voltage between the gate and the source is negative can be referred to as off-state current. Extremely low off-state current means, for example, that off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm, more preferably lower than or equal to 10 yA/μm (y represents yocto and denotes a factor of $10^{-24}$).

An oxide semiconductor has a bandgap of 3.0 eV or higher; thus, an OS transistor has low leakage current due to thermal excitation and, as described above, extremely low off-state current. A channel formation region of an OS transistor is preferably formed using an oxide semiconductor containing at least one of indium (In) and zinc (Zn). Typical examples of such an oxide semiconductor include an In-M-Zn oxide (M is aluminum (Al), gallium (Ga), yttrium (Y), or tin (Sn), for example). By reducing impurities serving as electron donors, such as moisture or hydrogen, and also reducing oxygen vacancies, an i-type (intrinsic) or substantially i-type oxide semiconductor can be obtained. Here, such an oxide semiconductor can be referred to as a highly purified oxide semiconductor. By using a highly purified oxide semiconductor, the off-state current of the OS transistor that is normalized by channel width can be as low as several yoctoamperes per micrometer to several zeptoamperes per micrometer. An OS transistor will be described in Embodiment 5, and an oxide semiconductor will be described in Embodiment 7.

Figure 3A:
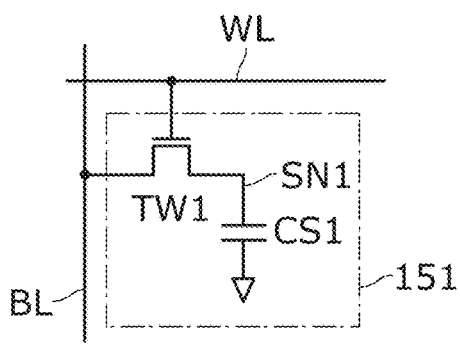
FIGS. 3A to 3G are circuit diagrams each illustrating a structure example of a memory cell.

The memory cell 151 in FIG. 3A includes a node SN1, a transistor TW1, and a capacitor CS1. The node SN1 is a retention node. The capacitor CS1 is a storage capacitor for holding charge of the node SN1. The transistor TW1 is a write transistor (OS transistor). The transistor TW1 has a function of controlling electrical continuity between the wiring BL and the node SN1. A gate of the transistor TW1 is electrically connected to the wiring WL.

By turning off the transistor TW1, the node SN1 is brought into an electrically floating state and the memory cell 151 retains data. Since the transistor TW1 is an OS transistor, leakage of charge from the node SN1 is reduced, so that the memory cell 151 can retain data for a long time.

Figure 3B:
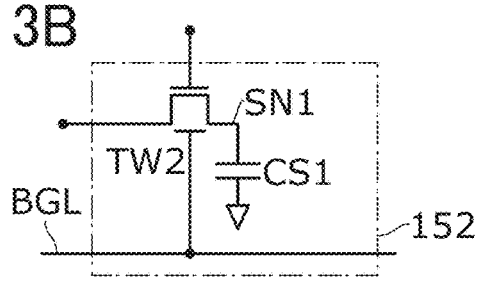
Figure 3C:
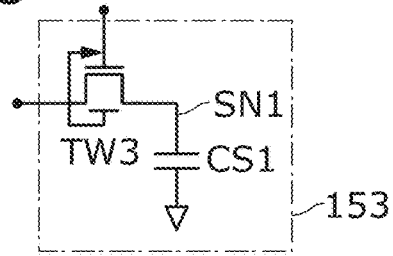

As illustrated in FIGS. 3B and 3C, transistors TW2 and TW3 with back gates can be used as write transistors. The transistors TW2 and TW3 are also OS transistors.

The back gate of the transistor TW2 in the memory cell 152 in FIG. 3B is electrically connected to a wiring BGL. The threshold voltage of the transistor TW2 can be controlled by the potential of the wiring BGL. In the case where a charge accumulation layer is provided as an insulating layer between the back gate and a channel formation region of the transistor TW2, charge can be injected into a charge accumulation layer of the transistor TW2 by using the wiring BGL at the time of manufacture of the memory cell 152. In the case of performing this step, the back gate of the transistor TW2 may be brought into an electrically floating state to operate the memory cell 152 without controlling the potential of the wiring BGL.

In the memory cell 153 in FIG. 3C, the back gate and a gate of the transistor TW3 are electrically connected to each other. When the transistor TW3 has such a structure, on-state current can be increased. The back gate of the transistor TW3 may be electrically connected to any of a gate, a source, or a drain of the transistor TW3.

Figure 3D:
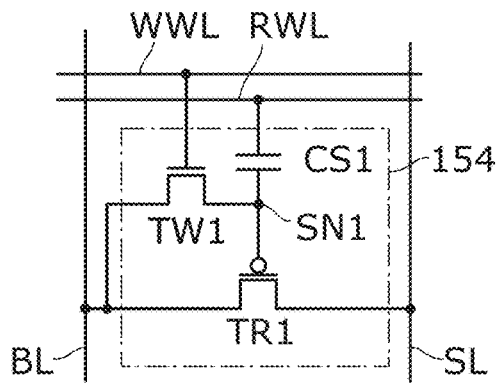

The memory cell 154 in FIG. 3D is electrically connected to wirings WWL, RWL, BL, and SL. The wiring WWL is a write word line, and a memory cell selection signal is input to the memory cell 154 from the row driver 121 through the wiring WWL. Signals are input from the column driver 122 to the wiring SL.

The memory cell 154 includes the node SN1, the capacitor CS1, the transistor TW1, and a transistor TR1. The transistor TR1 is a read transistor and controls electrical continuity between the wiring BL and the wiring SL. A gate of the transistor TR1 is electrically connected to the wiring WWL. The capacitor CS1 is capacitively coupled between the node SN1 and the wiring RWL. A constant potential may be input to the wiring RWL, or the potential of the wiring RWL may be controlled in accordance with a selected or non-selected state of the memory cell 154.

Figure 3E:
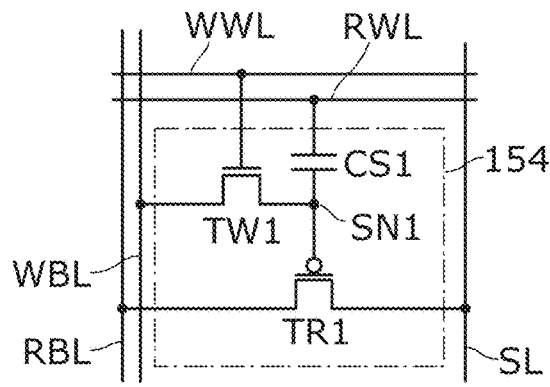

In the case of using the memory cell 154, bit lines (the wirings BL) can be separated into a write bit line (a wiring WBL) and a read bit line (a wiring RBL), as illustrated in FIG. 3E. In that case, the transistor TW1 controls electrical continuity between the wiring WBL and the node SN1, and the transistor TR1 controls electrical continuity between the wiring RWL and the wiring SL.

In the memory cell 154, the transistor TW1 may be replaced with the transistor TW2 or TW3. In addition, the transistor TR1 may be an n-channel transistor.

Figure 3F:
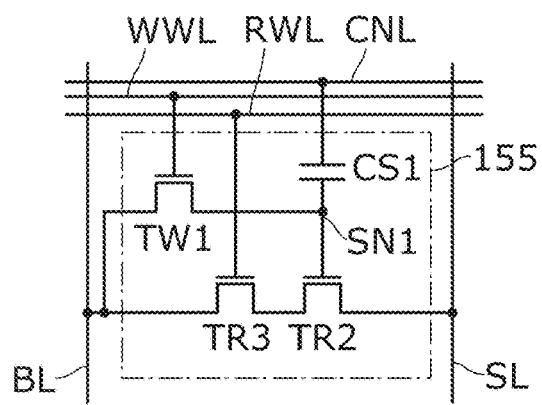

The memory cell 155 in FIG. 3F is electrically connected to the wirings WWL, BL, and SL, and a wiring CNL. The memory cell 155 includes the node SN1, the capacitor CS1, the transistor TW1, a transistor TR2, and a transistor TR3. The capacitor CS1 is capacitively coupled between the node SN1 and the wiring CNL. A fixed potential may be input to the wiring CNL, or the potential of the wiring CNL may be controlled in accordance with a selected or non-selected state of the memory cell 155. The transistors TR2 and TR3 are electrically connected in series between the wiring BL and the wiring SL. A gate of the transistor TR2 is electrically connected to the node SN1, and a gate of the transistor TR3 is electrically connected to the wiring RWL.

Figure 3G:
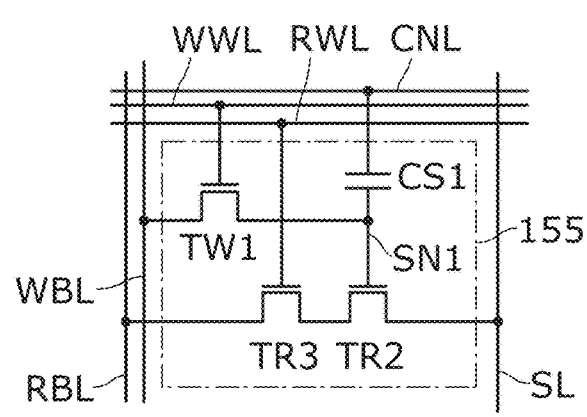

In the case of using the memory cell 155, bit lines (the wirings BL) can be separated into a write bit line (the wiring WBL) and a read bit line (the wiring RBL), as illustrated in FIG. 3G. In that case, the transistor TW1 controls electrical continuity between the wiring WBL and the node SN1, and the transistors TR2 and TR3 are electrically connected in series between the wiring RWL and the wiring SL.

In the memory cell 155, the transistor TW1 may be replaced with the transistor TW2 or TW3. In addition, the transistors TR2 and TR3 may be p-channel transistors.

The transistor TR1 in the memory cell 154 and the transistors TR2 and TR3 in the memory cell 155 are not particularly limited, and can be Si transistors formed using a silicon wafer, for example. In the case where the transistors TR1 to TR3 are n-channel transistors, the transistors TR1 to TR3 may be OS transistors.

<Operation Example of Memory Cell>

Figure 4:
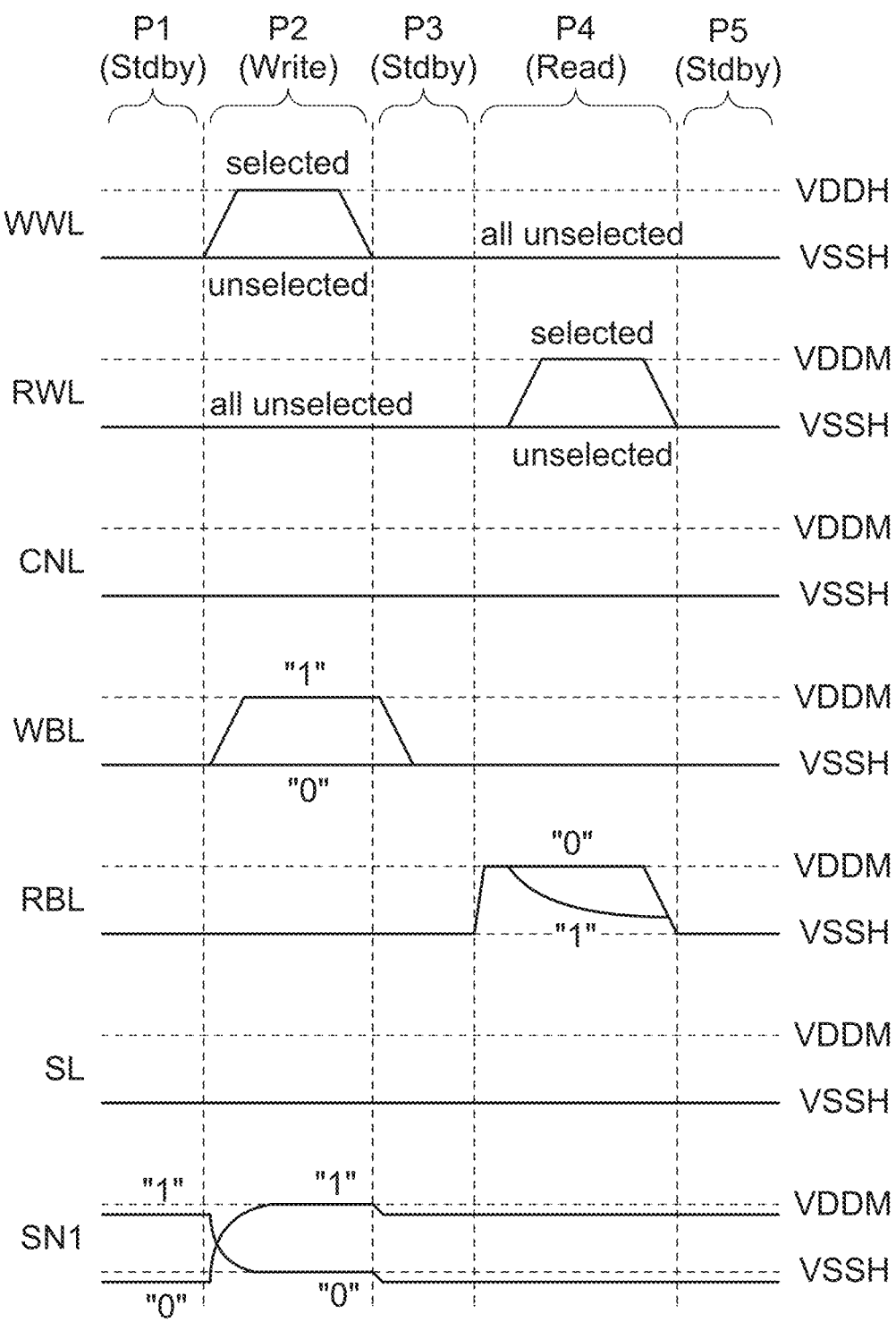
FIG. 4 is a timing chart illustrating an operation example of the memory cell.

Here, an example of a driving method of the memory cell 155 is described. FIG. 4 is a timing chart illustrating an operation example of the memory cell 155 in FIG. 3G. In FIG. 4, the low (L) potentials of the wirings WWL, RWL, WBL, RBL, SL, and CNL are VSSH. VSSH may be a ground potential (GND) or 0 V. The high (H) potential of the wiring WWL is VDDH, and the high (H) potentials of the wirings RWL, WBL, RBL, SL, and CNL are VDDM. Here, the threshold voltage of the transistor TW1 is higher than those of the transistors TR2 and TR3; thus, VDDH is higher than VDDM.

Periods P1, P3, and P5 are standby (Stdby) periods. In the periods P1, P3, and P5, the potentials of the wirings RWL, WWL, CNL, RBL, and SL are set at an L level. The memory cells 155 in all the rows are unselected. Here, the memory capacity of the memory cell 155 is one bit. In the period P1, the node SN1 that retains "1" is at an H level, and the node SN1 that retains "0" is at an L level.

<<Write Operation>>

A period P2 is a write period. The potential of the wiring WWL in a selected row is set at an H level, so that the transistor TW1 is turned on. In the case where "1" is written to the memory cell 155, the potential of the wiring WBL is set at an H level. In the case where "0" is written to the memory cell 155, the potential of the wiring WBL is set at an L level. In the selected memory cell 155, the potential of the node SN1 becomes VDDM or VSSM depending on the potential of the wiring WBL.

Next, the potential of the wiring WWL is set at an L level, so that the transistor TW1 is turned off. The node SN1 is brought into an electrically floating state, and the memory cell 155 retains data. Note that the wiring WWL and the node SN1 are capacitively coupled; thus, by turning off the transistor TW1, the potential of the node SN1 is slightly decreased. By setting the potential of the wiring WBL at an L level, the write operation is terminated. By setting the potential of the wiring WBL at an L level after bringing the node SN1 into a floating state, fluctuation in the potential of the node SN1 can be reduced.

<Read Operation>

A period P4 is a read period. First, the wiring RBL is precharged to be set at an H level. Next, the potential of the wiring RWL in an unselected row is maintained at an L level, and the potential of the wiring RWL in a selected row is set at an H level. The transistor TR3 in the selected memory cell 155 is turned on. In the case where the node SN1 retains "0," the transistor TR2 is off, so that the potential of the wiring RBL is maintained at an H level. In the case where the node SN1 retains "1," the transistor TR2 is turned on, so that the potential of the wiring RBL is decreased. By setting the potential of the wiring RWL at an L level and turning off the transistor TR3, the read operation is terminated. The column driver 122 determines that data read from the memory cell 155 is "0" or "1" based on the potential of the wiring RBL in the period P4.

<Storage Region of Memory 104>

Figure 5:
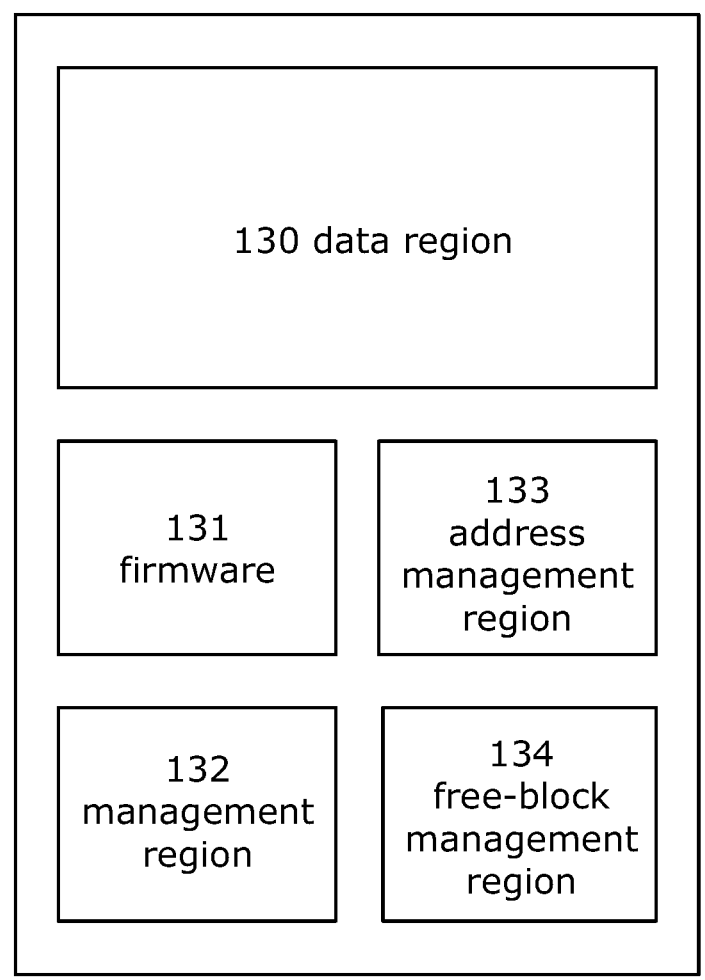
FIG. 5 is a block diagram illustrating a structure example of a memory storage region.

Here, the structure of a storage region of the memory 104 is described. FIG. 5 illustrates a structure example of the storage region of the memory 104. The memory 104 includes a user data region 130, a firmware region 131, an ECC management region 132, an address management region 133, and a free-block management region 134.

The user data region 130 is a data region that can be accessed by the host device 110. Data is written to the user data region 130 by write access of the host device 110. Data stored in the user data region 130 is read by read access of the host device 110.

Figure 6:
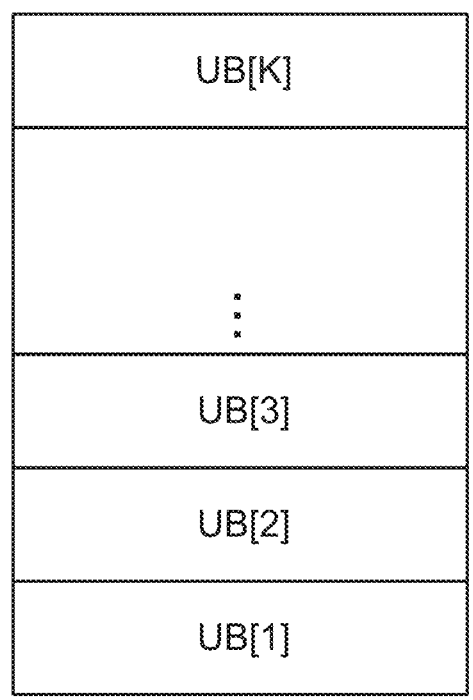
FIG. 6 is a schematic diagram illustrating a structure example of a user data region.

FIG. 6 schematically illustrates the structure of the user data region 130. The user data region 130 is divided into a plurality of blocks (fundamental units). The host device 110 accesses the user data region 130 in blocks. Here, the block of the user data region 130 is referred to as a block UB. In addition, a block UB in which data is not stored is referred to as a free block. For example, the user data region 130 in FIG. 6 includes a plurality of blocks UB (UB[1] to UB [K], where K is an integer of 2 or more). Note that FIG. 6 illustrates blocks UB[2] and UB[3] in addition to the blocks UB[1] and UB[K] and does not illustrate other blocks. The size of one block UB can be several tens of bits to thousands of bits.

The firmware region 131 is a storage region for storing firmware. The firmware is a program that defines a method for controlling the memory system 100 by the processor 102. In order to process an access request of the host device 110, the processor 102 controls the entire operation of the memory system 100 in accordance with firmware stored in the firmware region 131.

The ECC management region 132 is used for an ECC management table 135. The ECC management table 135 includes blocks ECCB[1] to ECCB[K]. The blocks ECCB[1] to ECCB[K] store data on an ECC history of the blocks UB[1] to UBM. In other words, the ECC management table 135 stores data on ECC of the blocks UB[1] to UB[K] for determining whether ECC of the user data region 130 is needed or not in relation to the blocks ECCB[1] to ECCB[K].

Figure 7:
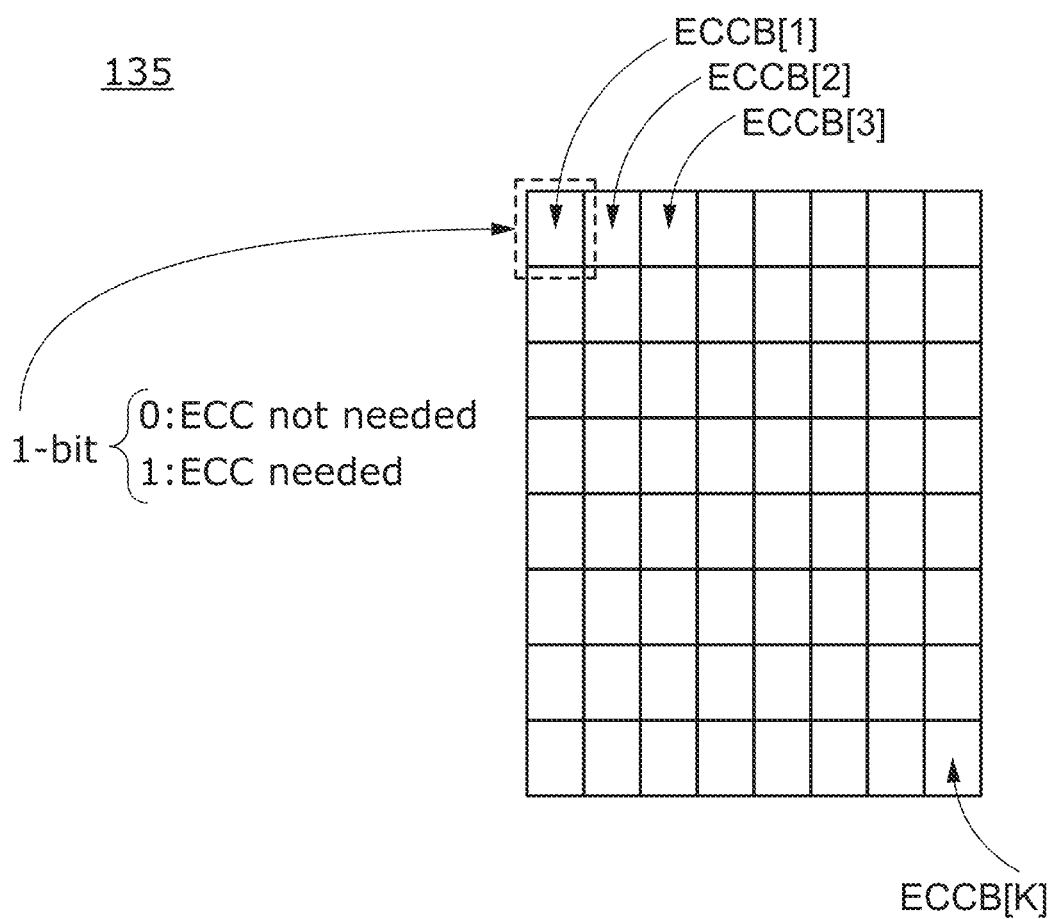
FIG. 7 is a schematic diagram illustrating a structure example of an ECC management table.

FIG. 7 illustrates an example of the ECC management table 135. Note that FIG. 7 illustrates the blocks UB[2] and UB[3] in addition to the blocks UB[1] and UB [K] and does not illustrate other blocks. The blocks ECCB[1] to ECCB[K] of the ECC management table 135 store 1-bit data of the blocks UB[1] to UB[K]. In FIG. 7, "0" indicates that ECC is not needed, and "1" indicates that ECC is needed.

Note that in the blocks ECCB[1] to ECCB[K] of the ECC management table 135, 1-bit block is assigned in each block UB; however, a block of 2 bits or more can be assigned in each block UB. The bit size of the ECC management table 135 is preferably as small as possible because the user data region 130 can be made larger.

The address management region 133 is used as a logical address conversion table 136. The address management region 133 includes blocks AB[1] to AB[K]. The blocks AB[1] to AB[K] each store data for associating a logical address 140 specified by the host device 110 with a physical address in the memory 104.

Figure 8:
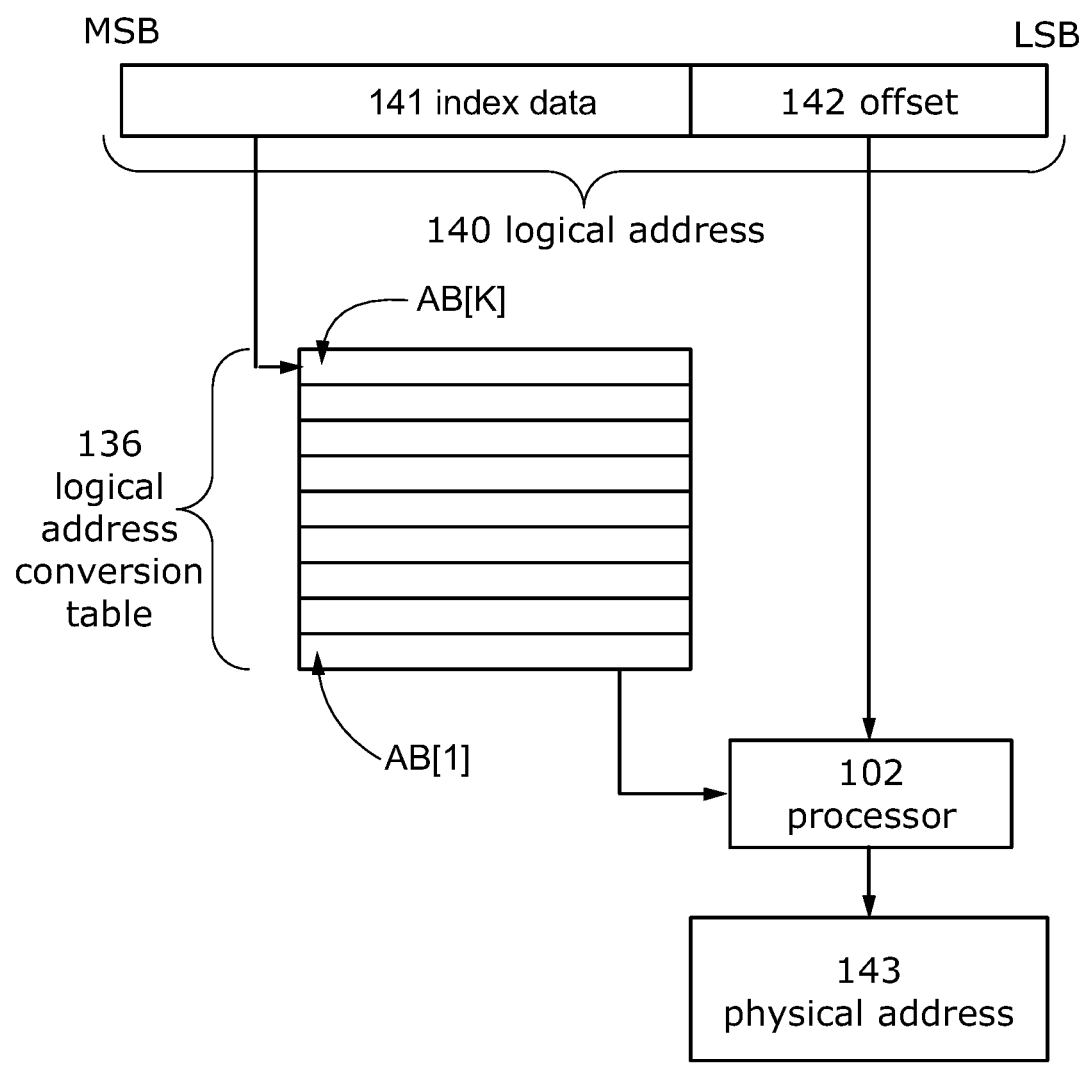
FIG. 8 is a schematic diagram illustrating a structure example of a logical address conversion table and an example of a method for calculating a physical address.

FIG. 8 illustrates examples of the logical address conversion table 136 and an association method. The logical address conversion table 136 stores data for associating a logical address with a physical address in each of the blocks. Index data 141 is stored on a most significant bit (MSB) side of the logical address 140, and an offset 142 within the block is stored on a least significant bit (LSB) side of the logical address 140. FIG. 8 illustrates operation in which data associated with the index data 141 is read from any of the blocks AB[1] to ABM and the data and the offset 142 within the block are input to the processor 102. The processor 102 calculates a physical address 143 from the input data.

The free-block management region 134 is used for a free-block management table 138. The free-block management region 134 includes blocks FB[1] to FB[K]. The blocks FB[1] to FB[K] store data on whether the blocks UB[1] to UB [K] are being used or not. In other words, by access to any of the blocks FB[1] to FB[K] of the free-block management table 138, whether the accessed block of the blocks UB[1] to UB[K] in the user data region 130 are being used or not can be determined.

Figure 9:
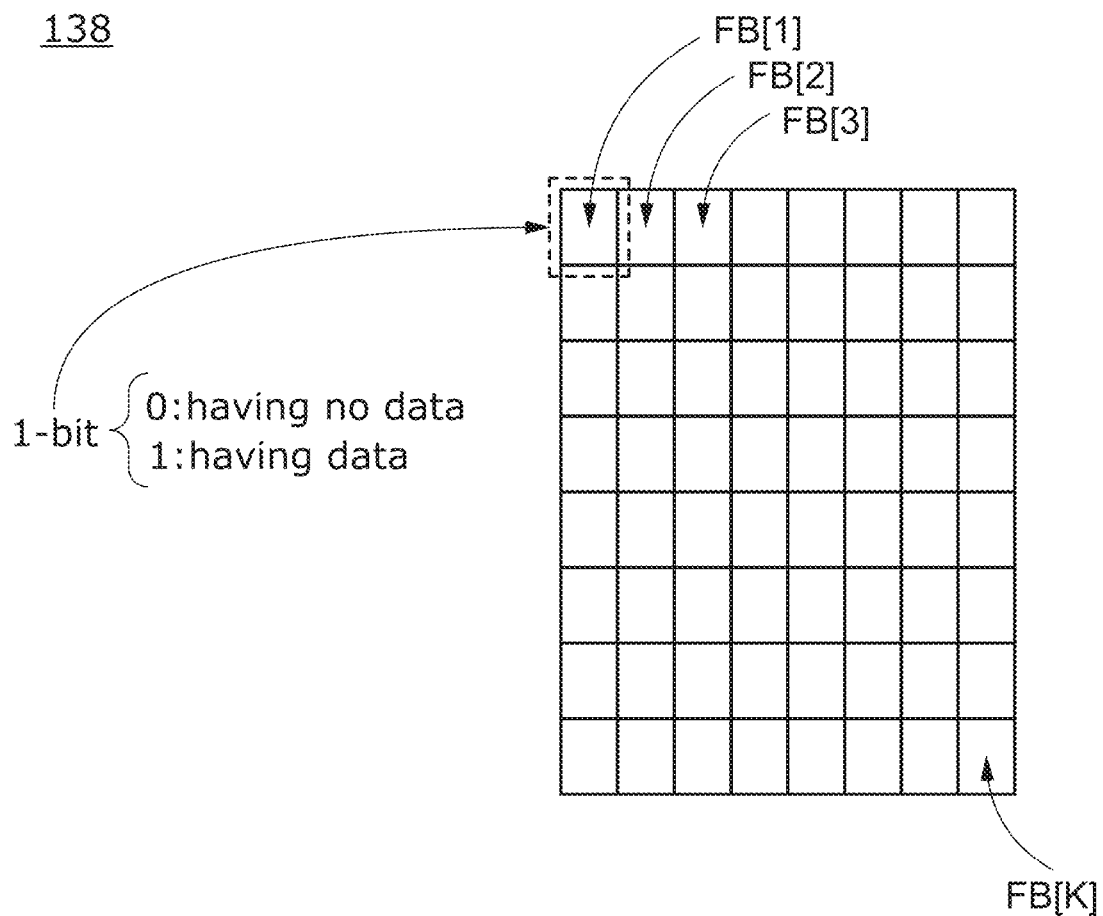
FIG. 9 is a schematic diagram illustrating a structure example of a free-block management table.

FIG. 9 illustrates an example of the free-block management table 138. Note that FIG. 9 illustrates the blocks FB[2] and FB[3] in addition to the blocks FB[1] and FB[K] and does not illustrate other blocks. The blocks FB[1] to FB[K] of the free-block management table 138 store 1-bit data of the blocks UB[1] to UB[K]. In FIG. 9, "0" indicates that the block UB has no data (is not being used), and "1" indicates that the block UB has data (is being used).

The memory cell 125 does not deteriorate in principle because it stores data by charging and discharging of the retention node. Therefore, the memory 104 is less likely to cause an error due to deterioration than a flash memory. Since the OS transistor is used as the write transistor, the memory cell 125 has high soft error tolerance. Accordingly, the memory system 100 decreases the need to correct an error every read access. Even in the memory 104, the error occurrence rate might become higher because retention time becomes longer due to variation in element electrical characteristics, for example. Consequently, error correction is very effective in improving retention characteristics and reliability of the memory 104.

Therefore, in this embodiment, the memory system 100 is constructed in such a manner that it can determine whether error correction by the ECC circuit 105 is needed or not by using the ECC management region 132, the address management region 133, and the free-block management region 134. Consequently, reliability and execution processing speed are increased and power consumption is reduced.

<<Operation Example of Memory System>>

The operation example of the memory system 100 is described with reference to flow charts in FIG. 10, FIG. 11, FIG. 12, FIGS. 13A and 13B, and FIG. 14. Operation shown in each flow chart is defined by firmware stored in the firmware region 131. Each circuit of the memory system 100 operates in such a manner that defined processing is executed after the processor 102 executes the firmware.

<<Power-On>>

Figure 10:
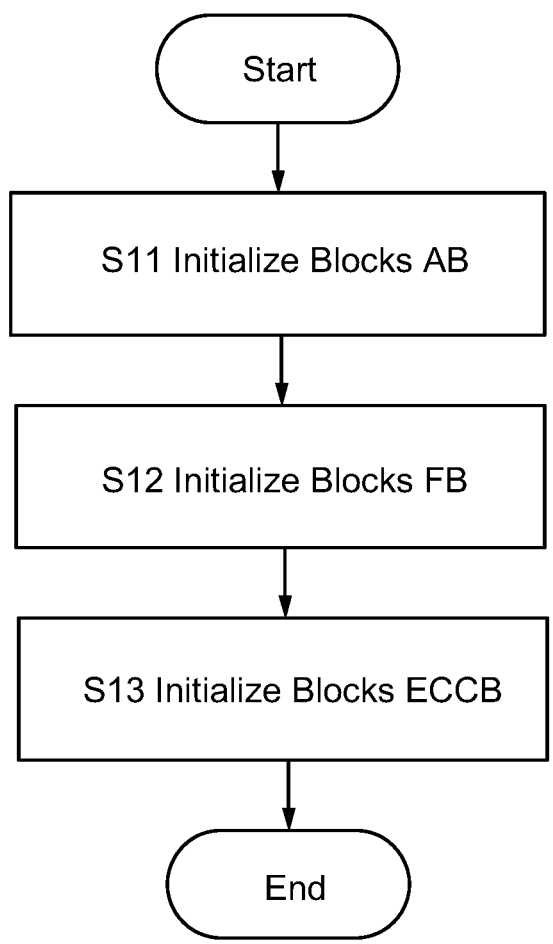
FIG. 10 is a flow chart illustrating an operation example of the memory system.

FIG. 10 is a flow chart illustrating an operation example of the memory system 100 when power is turned on. When power is turned on, the processor 102 accesses the work memory 103 and the memory 104 to perform Step S11 to Step S13.

In Step S11, the processor 102 accesses the address management region 133 of the memory 104 to initialize the blocks AB[1] to AB[K] of the logical address conversion table 136.

In Step S12, the processor 102 accesses the free-block management region 134 of the memory 104 to initialize the blocks FB[1] to FB[K] of the free-block management table 138 to "0."

In Step S13, the processor 102 accesses the ECC management region 132 of the memory 104 to initialize the blocks ECCB[1] to ECCB[K] of the ECC management table 135 to "0."

Note that the operation of the memory system 100 in this embodiment when power is turned on is not limited to the operation illustrated in the flow chart of FIG. 10. For example, the sequence of initializing the logical address conversion table 136, the free-block management table 138, and the ECC management table 135 is not particularly limited. Depending on circumstances or conditions, the sequence of Step S11 to Step S13 may be changed.

<<Write Access>>

Figure 11:
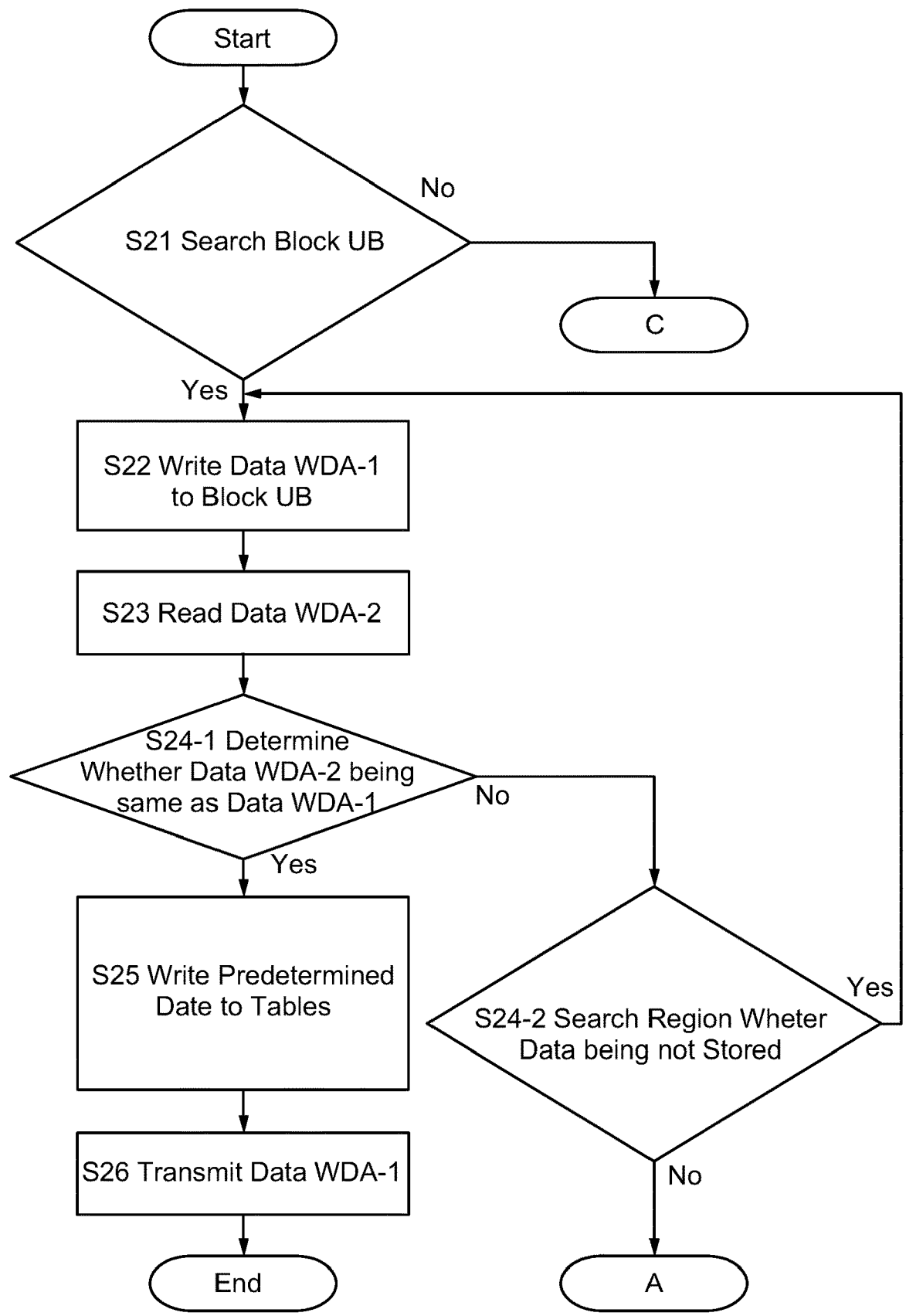
FIG. 11 is a flow chart illustrating an operation example of the memory system.

FIG. 11 is a flow chart illustrating an operation example of the memory system 100 in response to write access of the host device 110. When there is a data write request from the host device 110 to the memory system 100, the processor 102 performs Step S21 to Step S26. Here, write data transmitted from the host device 110 is referred to as data WDA-1.

In Step S21, the processor 102 accesses the free-block management region 134 of the memory 104 to search a block UB in which data is not stored from the free-block management table 138. Here, the searched block UB in which data is not stored is referred to as a block UB[x].

Note that when there is no block UB in which data is not stored here, the processor 102 goes to Step C in FIG. 11. When the processor 102 goes to Step C in FIG. 11, the processor 102 goes to Step C in the flow chart of FIG. 13B to continue the processing. The processing after Step C in the flow chart of FIG. 13B will be described later.

In Step S22, the data WDA-1 transmitted from the host device 110 is written to the user data region 130. The data WDA-1 is written to the block UB[x] searched in Step S21 or Step S24-2 to be described later. Data written to the block UB[x] is referred to as data WDA-2.

Note that the data WDA-1 transmitted from the host device 110 is also written to the work memory 103 temporarily.

In Step S23, the data WDA-2 written in Step S22 is read by the processor 102.

In Step S24-1, whether the data WDA-2 read by the processor 102 in Step S23 is the same as the data WDA-1 stored in the work memory 103 temporarily is determined.

When the data WDA-1 is the same as the data WDA-2 in Step S24-1, the processor 102 performs Step S25. In Step S25, the processor 102 accesses the address management region 133 and the free-block management region 134 to write predetermined data to the logical address conversion table 136 and the free-block management table 138. Specifically, in the logical address conversion table 136, the index data 141 of the logical address 140 that is transmitted from the host device 110 along with the data WDA-1 is written to a block AB[x] corresponding to the block UB [x], and in the free-block management table 138, data "1" is written to a block FB[x] corresponding to the block UB[x].

In Step S26, a signal that notifies completion of writing of the data WDA-1 is transmitted to the host device 110 through the interface 101.

In Step S24-1, when the data WDA-1 is not the same as the data WDA-2, that is, when there is a defective memory cell in the block UB[x], the processor 102 performs Step S24-2. In Step S24-2, whether there is another region in which data is not stored in the user data region is searched again. When there is another free block, the processor 102 returns to Step S22 to perform the processing again. When there is no other free block, the processor 102 goes to Step A in FIG. 11. When the processor 102 goes to Step A in FIG. 11, the processor 102 goes to Step A in the flow chart of FIG. 12 to continue the processing.

Figure 12:
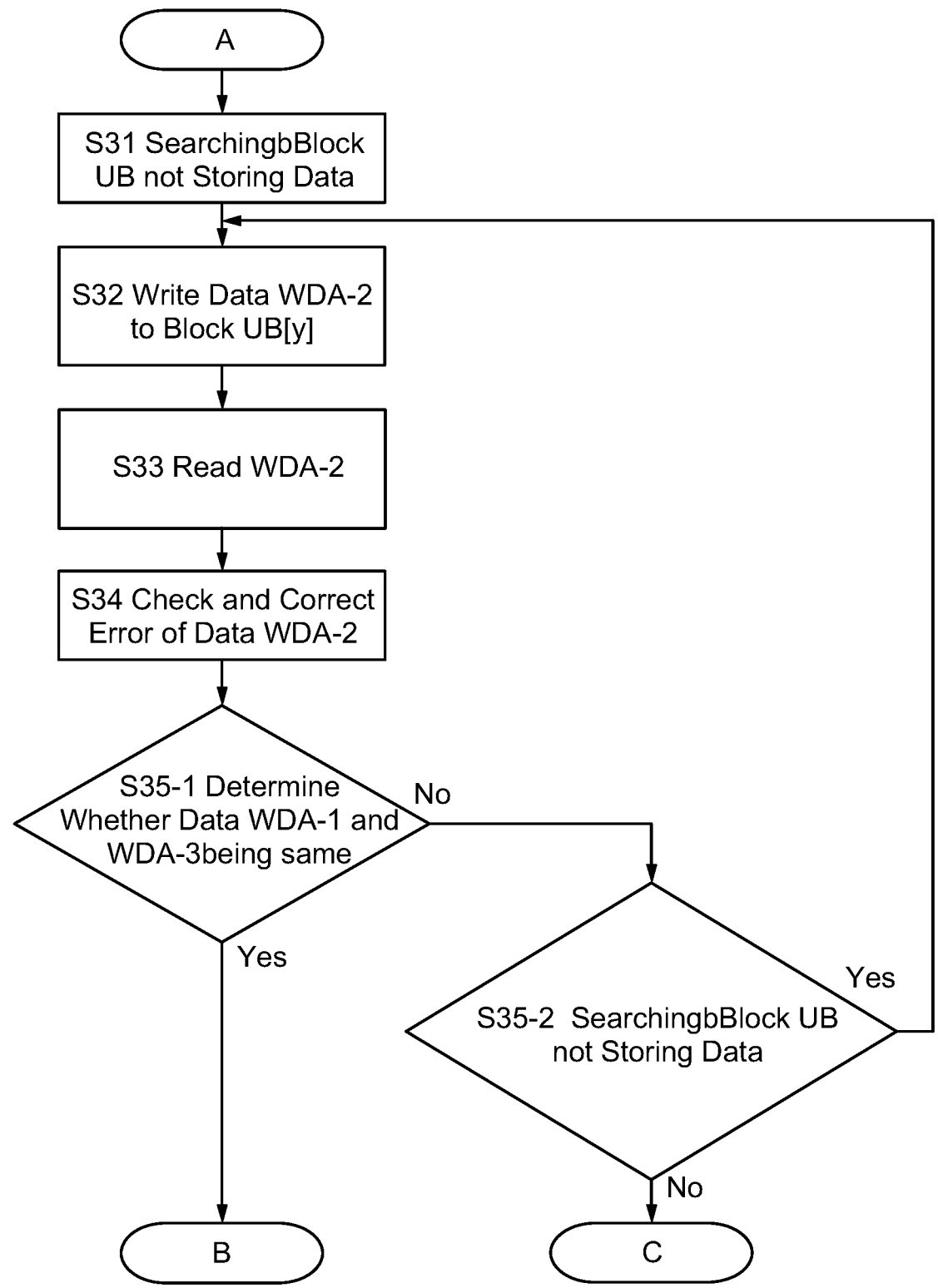
FIG. 12 is a flow chart illustrating an operation example of the memory system.

FIG. 12 is a flow chart illustrating an operation example of the memory system 100 when the data WDA-1 cannot be written to the memory system 100 from the host device 110 correctly in FIG. 11 (i.e., when the written data WDA-1 is different from the data WDA-2 that is written and read).

FIG. 12 is a flow chart illustrating operation when there are a free block in the user data region and defective memories in all the searched free blocks in the flow chart of FIG. 11. The flow chart in FIG. 12 illustrates operation in which a free block in the user data region is searched again, a block UB whose error is detected but can be corrected is searched, and data is stored in the block UB.

In Step S31, the processor 102 accesses the free-block management region 134 of the memory 104 to search a block UB in which data is not stored from the free-block management table 138. Here, the searched block UB in which data is not stored is referred to as a block UB[y].

In Step S32, the data WDA-1 transmitted from the host device 110 is written to the user data region 130. The data WDA-1 is written to the block UB[y] searched in Step S31. Data written to the block UB[y] is referred to as the data WDA-2.

Note that the data WDA-1 transmitted from the host device 110 is also written to the work memory 103 temporarily.

In Step S33, the data WDA-2 written in Step S32 is read by the processor 102.

In Step S34, the processor 102 accesses the ECC circuit 105, and the ECC circuit 105 checks and corrects an error of the data WDA-2 read in Step S32. Here, data whose error is corrected by the ECC circuit 105 is referred to as data WDA-3.

In Step S35-1, whether the data WDA-3 whose error is corrected in Step S34 is the same as the data WDA-1 stored in the work memory 103 temporarily is determined.

When the data WDA-1 is the same as the data WDA-3 in Step S35-1, the processor 102 goes to Step B in FIG. 12. When the processor 102 goes to Step B in FIG. 12, the processor 102 goes to Step B in the flow chart of FIG. 13A to continue the processing.

In Step S35-1, when the data WDA-1 is not the same as the data WDA-3, the processor 102 performs Step S35-2. In Step S35-2, whether there is another region in which data is not stored in the user data region is searched again. When there is another free block, the processor 102 returns to Step S32 to perform the processing again. When there is no other free block, the processor 102 goes to Step C in FIG. 12. When the processor 102 goes to Step C in FIG. 12, the processor 102 goes to Step C in the flow chart of FIG. 13B to continue the processing.

Figure 13A:
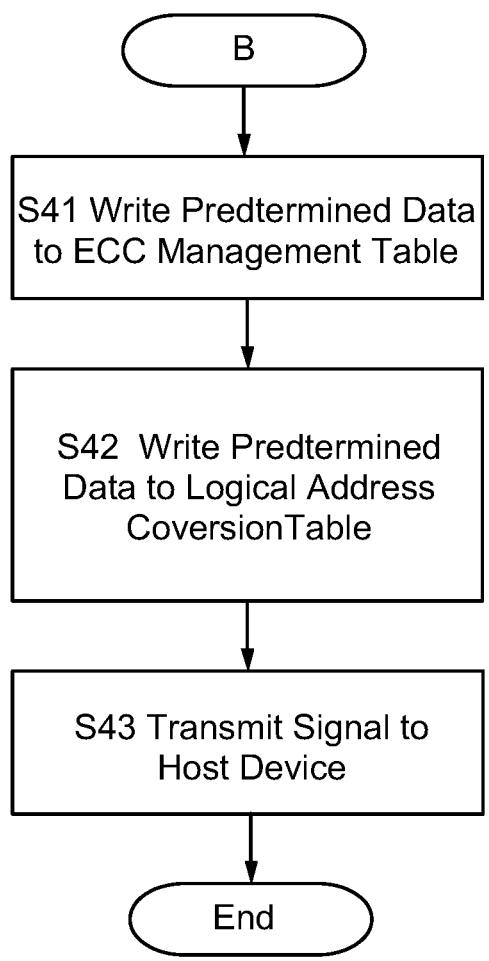
FIGS. 13A and 13B are flow charts each illustrating an operation example of the memory system.
Figure 13B:
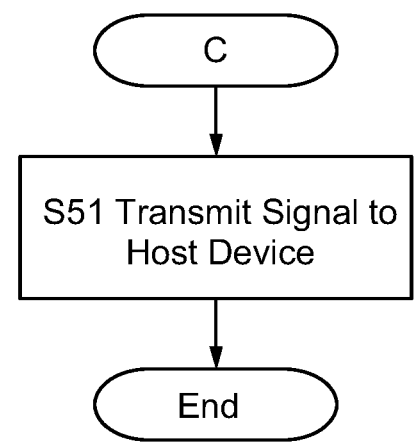

FIG. 13A is a flow chart illustrating an operation example of the memory system 100 after error check and correct processings are performed by the ECC circuit 105 in FIG. 12. In addition, FIG. 13B is a flow chart illustrating an operation example of the memory system 100 after the block UB in which data is not stored is not found in FIG. 11 and FIG. 12.

When the data WDA-3 subjected to processings up to Step B in FIG. 13A, that is, error check and correct processings in Step S35-1, is the same as the data WDA-1 that is requested to be written from the host device 110, the processor 102 performs Step S41. In Step S41, the processor 102 accesses the ECC management region 132 of the memory 104 to write predetermined data to the ECC management table 135. Specifically, in the ECC management table 135, data "1" is written to a block ECCB[y] corresponding to the block UB[y].

In Step S42, the processor 102 accesses the address management region 133 and the free-block management region 134 to write predetermined data to the logical address conversion table 136 and the free-block management table 138. Specifically, in the logical address conversion table 136, the index data 141 of the logical address 140 that is transmitted from the host device 110 along with the data WDA-1 is written to a block AB[y] corresponding to the block UB[y], and in the free-block management table 138, data "1" is written to a block FB[y] corresponding to the block UB[y].

Note that the order of Steps S41 and S42 is not limited to that in the flow chart of FIG. 13A. For example, Step S41 may be performed after Step S42.

In Step S43, a signal that notifies completion of writing of the data WDA-1 is transmitted to the host device 110 through the interface 101.

When the block UB in which data is not stored is not found in processings up to Step C in FIG. 11, that is, in Step S21, Step S51 in FIG. 13B is performed. In addition, when the data WDA-3 whose error is checked and corrected is not the same as the data WDA-1 that is requested to be written from the host device 110 in processings up to Step C in FIG. 12, that is, in Step S35-1 and there is no other free block in Step S35-2, Step S51 in FIG. 13B is performed.

In Step S51, a signal that notifies the fact that there is no region for writing the data WDA-1 is transmitted to the host device 110 through the interface 101.

<<Read Access>>

Figure 14:
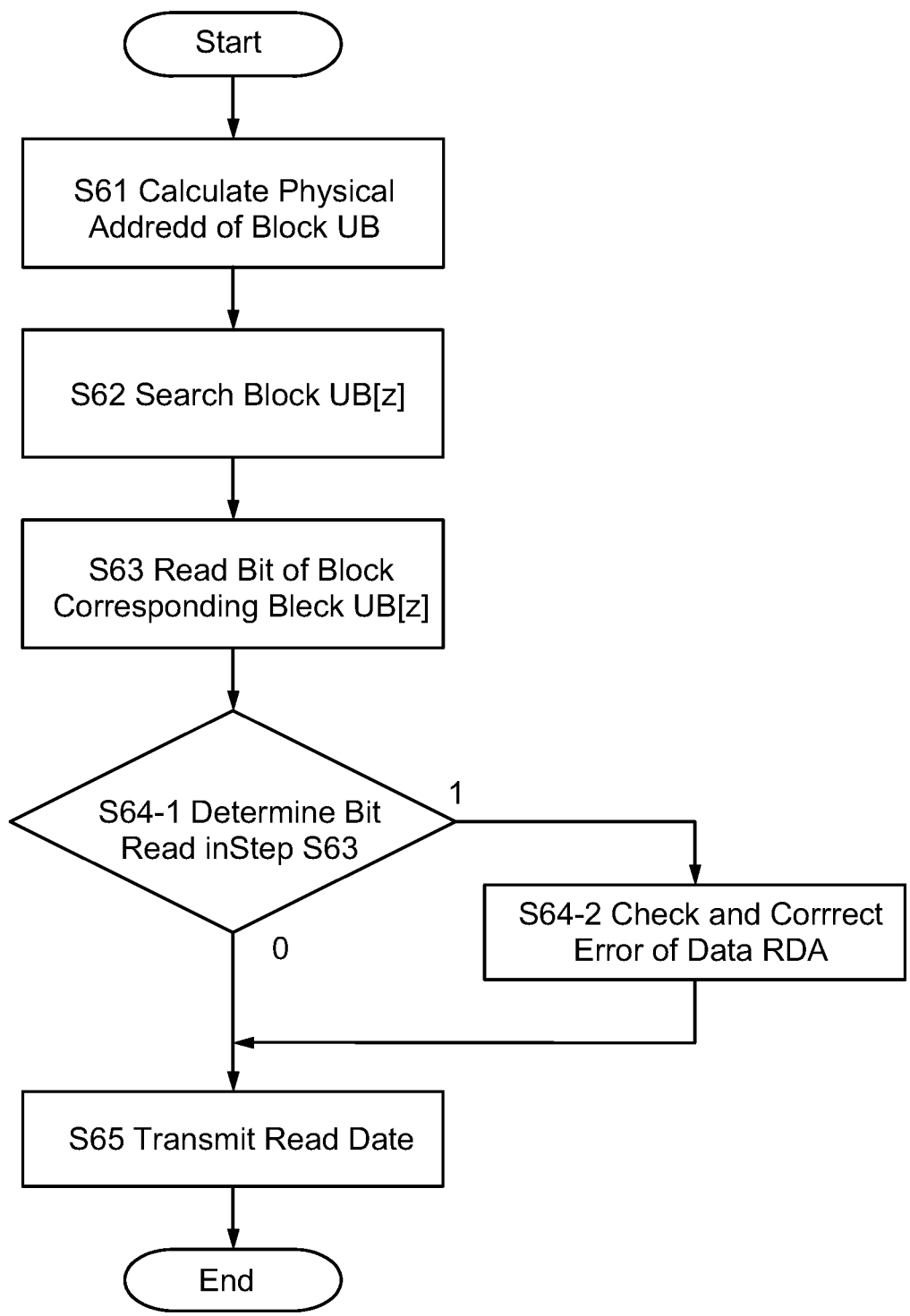
FIG. 14 is a flow chart illustrating an operation example of the memory system.

FIG. 14 is a flow chart illustrating an operation example of the memory system 100 in response to read access of the host device 110. When there is a data read request from the host device 110 to the memory system 100, the processor 102 performs Step S61 to Step S65. Here, data that is requested from the host device 110 and read from the memory system 100 is referred to as data RDA-1.

In Step S61, the processor 102 accesses the address management region 133 to calculate a physical address of a block UB that stores the data RDA-1 requested to be read from the host device 110. Here, the block UB that stores the data RDA-1 is referred to as a block UB[z].

In Step S62, the processor 102 accesses the user data region 130 of the memory 104 to search the block UB[z] based on a read physical address and read the data RDA-1 stored in the block UB[z].

In Step S63, the bit of a block corresponding to the block UB[z] is read from the ECC management region 132 by the processor 102.

In Step S64-1, the bit read in Step S63 is determined. When the bit of a block ECCB[z] corresponding to the block UB[z] that is stored in the ECC management region 132 is "0," the processor 102 goes to Step S65. When the bit of the block ECCB[z] corresponding to the block UB[z] that is stored in the ECC management region 132 is "1," the processor 102 goes to Step S64-2.

In Step S64-2, the processor 102 accesses the ECC circuit 105, and the ECC circuit 105 checks and corrects an error of the data RDA-1 read in Step S61. Here, data whose error is corrected by the ECC circuit 105 is referred to as data RDA-2.

In Step S65, the read data is transmitted to the host device 110 through the interface 101. Specifically, when the processor 102 goes to Step S65 directly from Step S64-1, the memory system 100 transmits the read data RDA-1 to the host device 110. When the processor 102 goes to Step S65 via Step S64-2, the memory system 100 transmits the data RDA-2 whose error is checked and corrected to the host device 110.

As described above, in this embodiment, error correction timing and frequency can be optimized. Accordingly, it is possible to increase access speed and reduce power consumption while maintaining data retention reliability.

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

Note that this embodiment can be combined with any of the other embodiments in this specification as appropriate.

Embodiment 2

In this embodiment, application examples of the memory system 100 are described. The memory system 100 can be applied to, for example, storage devices of electronic devices (e.g., information terminals, smartphones, e-book readers, digital cameras (including video cameras), video recording/reproducing devices, and navigation systems). Alternatively, the memory system 100 can be applied to removable storage devices such as memory cards (e.g., SD cards), universal serial bus (USB) memories, and solid state drives (SSD). FIGS. 15A to 15E schematically illustrate some structure examples of removable storage devices.

Figure 15A:
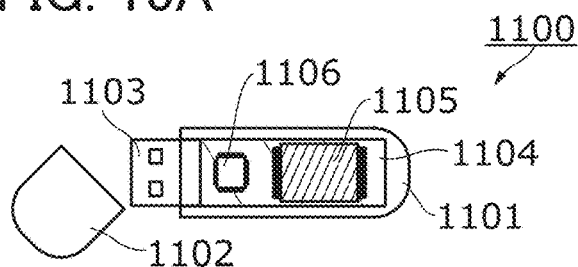
FIGS. 15A to 15E are schematic diagrams each illustrating a structure example of a removable storage device.

FIG. 15A is a schematic diagram of a USB memory. A USB memory 1100 includes a housing 1101, a cap 1102, a USB connector 1103, and a substrate 1104. The substrate 1104 is held in the housing 1101. The substrate 1104 includes circuits included in the memory system 100. For example, a memory chip 1105 and a controller chip 1106 are attached to the substrate 1104. The memory 104 is incorporated in the memory chip 1105. The processor 102, the work memory 103, the ECC circuit 105, and the like are incorporated in the controller chip 1106. The USB connector 1103 corresponds to the interface 101.

Figure 15B:
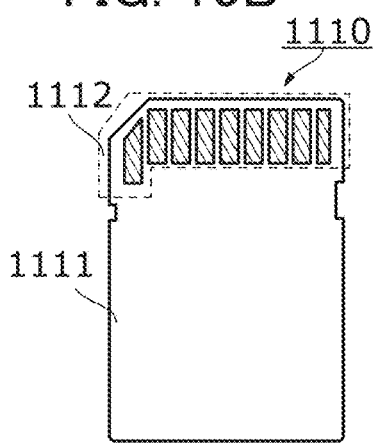
Figure 15C:
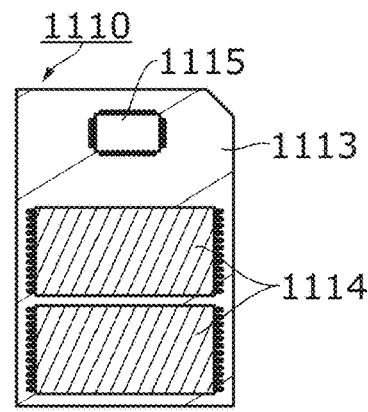

FIG. 15B is a schematic external diagram of an SD card, and FIG. 15C is a schematic diagram illustrating the internal structure of the SD card. An SD card 1110 includes a housing 1111, a connector 1112, and a substrate 1113. The connector 1112 corresponds to the interface 101. The substrate 1113 is held in the housing 1111. The substrate 1113 includes circuits included in the memory system 100. For example, a memory chip 1114 and a controller chip 1115 are attached to the substrate 1113. The memory 104 is incorporated in the memory chip 1114. The processor 102, the work memory 103, the ECC circuit 105, and the like are incorporated in the controller chip 1115.

When the memory chip 1114 is also provided on a back side of the substrate 1113, the capacity of the SD card 1110 can be increased. In addition, a wireless chip with a radio communication function may be provided on the substrate 1113. With such a wireless chip, the memory chip 1114 can read and write data by radio communication between the host device 110 and the SD card 1110.

Figure 15D:
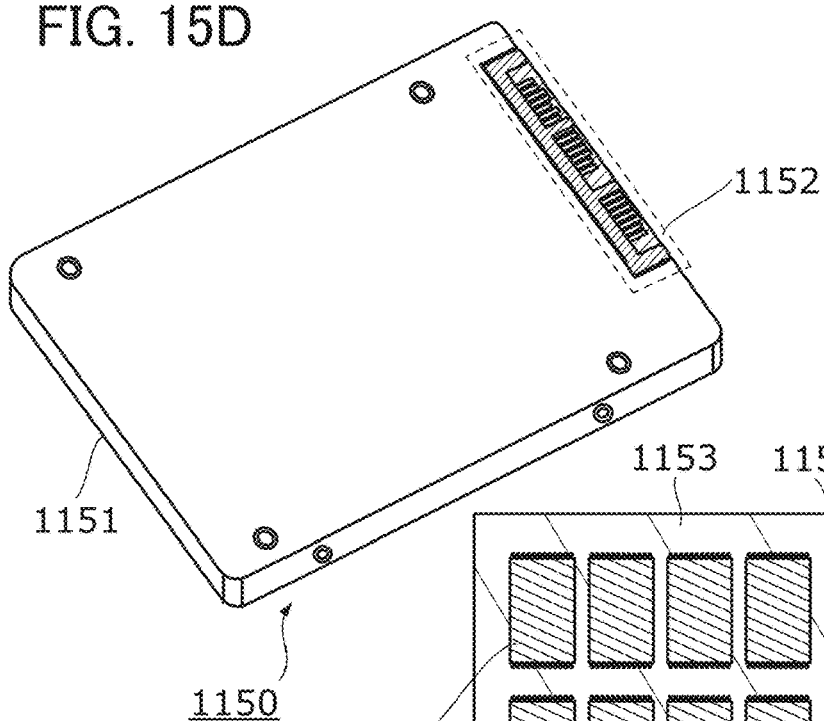
Figure 15E:
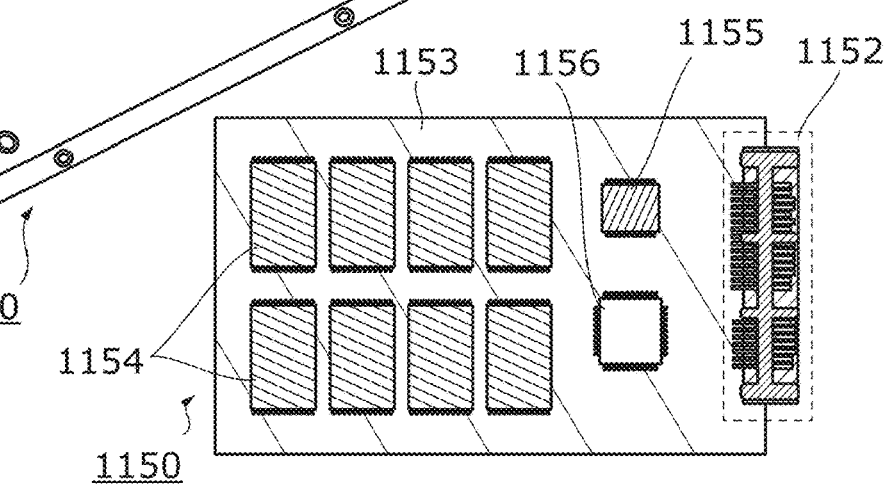

FIG. 15D is a schematic external diagram of an SSD, and FIG. 15E is a schematic diagram illustrating the internal structure of the SSD. An SSD 1150 includes a housing 1151, a connector 1152, and a substrate 1153. The connector 1152 corresponds to the interface 101. The substrate 1153 is held in the housing 1151. The substrate 1153 includes circuits included in the memory system 100. For example, a memory chip 1154, a memory chip 1155, and a controller chip 1156 are attached to the substrate 1153. The memory 104 is incorporated in the memory chip 1154. When the memory chip 1155 is also provided on a back side of the substrate 1153, the capacity of the SSD 1150 can be increased. The work memory 103 is incorporated in the memory chip 1155. For example, a DRAM chip may be used as the memory chip 1155. The processor 102, the ECC circuit 105, and the like are incorporated in the controller chip 1156. A memory functioning as the work memory 103 may also be provided in the controller chip 1156.

Note that this embodiment can be combined with any of the other embodiments in this specification as appropriate.

Embodiment 3

In this embodiment, an information processing system in which the host device 110 is combined with the memory system 100 is described.

<Structure Example of Information Processing System>

Figure 16:
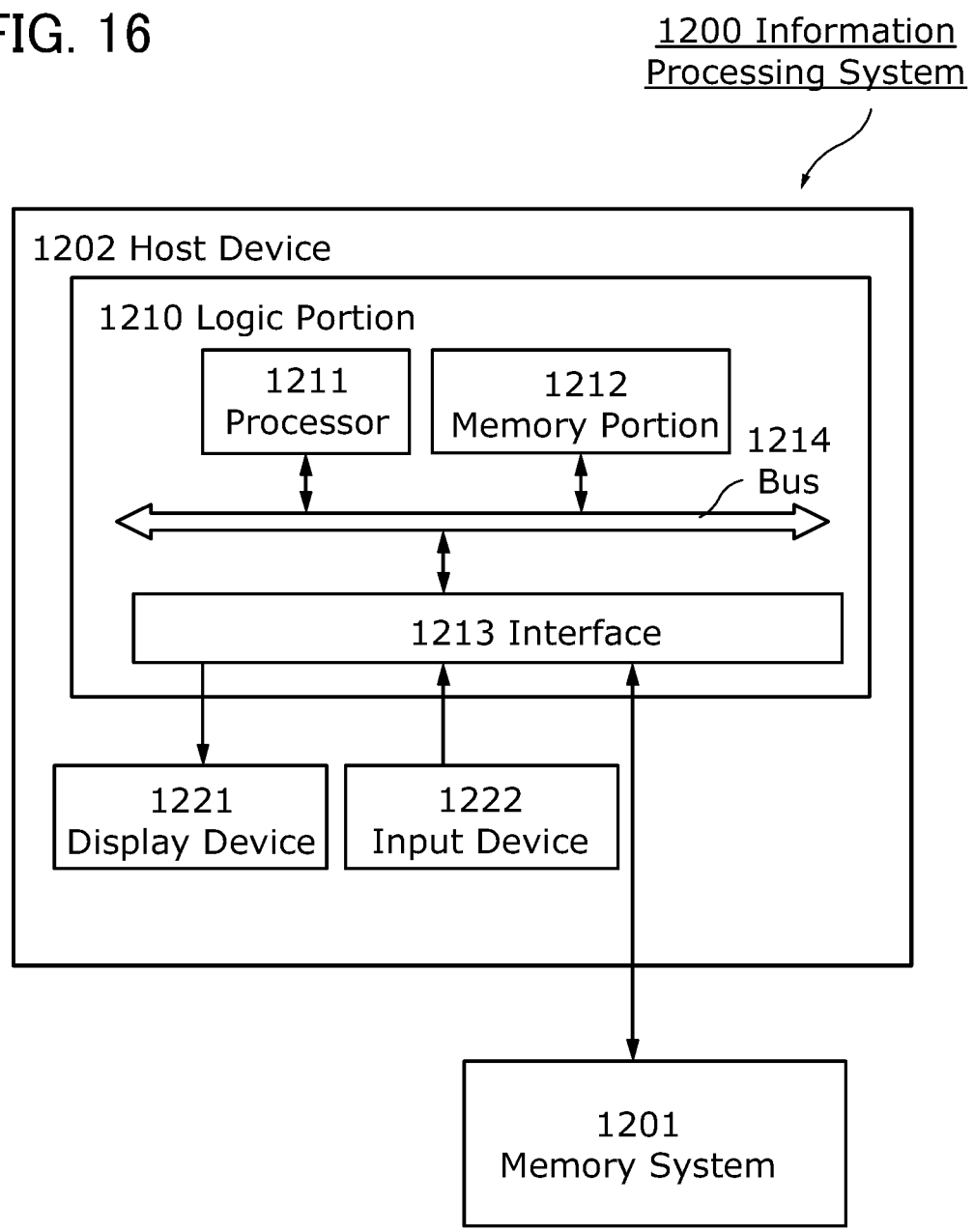
FIG. 16 is a block diagram illustrating a structure example of an information processing system.

FIG. 16 is a block diagram illustrating a structure example of an information processing system. An information processing system 1200 includes a memory system 1201 and a host device 1202.

The memory system 100 in Embodiment 1 can be applied to the memory system 1201. The memory system 1201 is used as, for example, a storage device of the host device 1202 and stores data such as a program, image data, or audio data.

The host device 1202 includes a logic portion 1210, a display device 1221, and an input device 1222.

The logic portion 1210 has a function of controlling the entire host device 1202. The logic portion 1210 includes a processor 1211, a memory portion 1212, an interface 1213, and a bus 1214. The processor 1211, the memory portion 1212, and the interface 1213 are connected to one another through the bus 1214. The processor 1211 functions as an arithmetic unit and a controller and controls the entire operation of each device in the host device 1202 in accordance with a program such as firmware. A CPU, a microprocessor (MPU), or the like can be used as the processor 1211. The memory portion 1212 stores a program executed by the processor 1211, data processed by the processor 1211, or the like.

The logic portion 1210 communicates with the display device 1221, the input device 1222, and the memory system 1201 through the interface 1213. For example, an input signal from the input device 1222 is transmitted to the logic portion 1210 through the interface 1213 and the bus 1214.

The display device 1221 is provided as an output device and constitutes a display portion of the information processing system 1200. The host device 1202 may include another output device such as a speaker or a printer in addition to the display device 1221. Alternatively, the host device 1202 does not necessarily include the display device 1221.

The input device 1222 is a device for inputting data to the logic portion 1210. A user can operate the information processing system 1200 by operating the input device 1222. Various human interfaces can be used as the input device 1222, and the information processing system 1200 may include a plurality of input devices 1222.

A touch sensor, a keyboard, a mouse, an operation button, a microphone (an audio input device), a camera (an imaging system), or the like can be used as the input device 1222. The information processing system 1200 may be operated with devices incorporated in the host device 1202 that detects sound, eye movement, gesture, or the like. For example, in the case where a touch sensor is provided as the input device 1222, this touch sensor may be incorporated in the display device 1221.

In the information processing system 1200, the memory system 1201 and the host device 1202 may be put in one housing or may be formed using a plurality of devices connected to each other with or without a wire. For example, examples of the former include a laptop personal computer (PC), a tablet information terminal, an e-book reader, a smartphone, a cellular phone, an audio terminal, and a video recording/reproducing device. Examples of the latter include a set of a desktop PC, a keyboard, a mouse, and a monitor. In addition, for example, there are an audiovisual (AV) system that includes a video recording/reproducing device, an audio device (e.g., a speaker or an amplifier), and a television set, a monitor system that includes a surveillance camera, a display device, and a video recording storage device.

<Electronic Component>

Figure 17A:
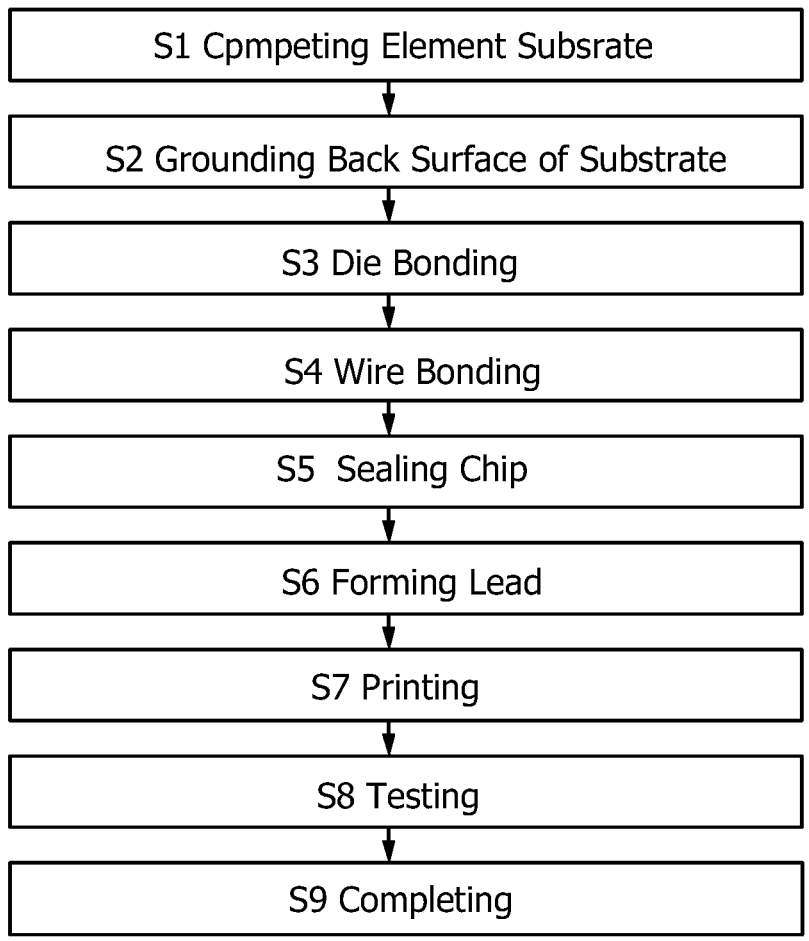
FIG. 17A is a flow chart showing an example of a method for manufacturing an electronic component.

FIG. 17A shows an example where the memory system described in Embodiment 1 is used as an electronic component. Note that the electronic component is also referred to as a semiconductor package or an IC package. This electronic component has a plurality of standards and names depending on a terminal extraction direction and a terminal shape. Examples of the electronic component are described in this embodiment.

A semiconductor device including transistors shown in Embodiment 1 is completed by integrating detachable components on a printed wiring board through an assembly process (post-process).

The post-process can be completed through the steps in FIG. 17A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, so that damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed wiring board in a later step.

Next, printing (marking) is performed on a surface of the package (Step S7). After a final testing step (Step S8), the electronic component is completed (Step S9).

The above electronic component includes the memory system described in Embodiment 1. Thus, a highly reliable electronic component can be obtained.

Figure 17B:
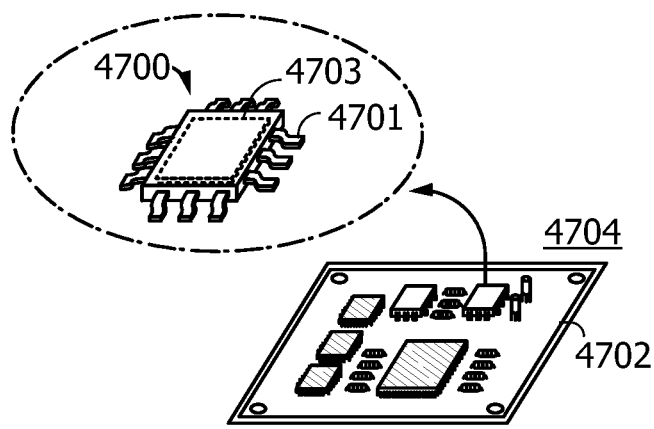
FIG. 17B is a schematic perspective view illustrating an example of the electronic component.

FIG. 17B is a perspective schematic diagram of a completed electronic component. FIG. 17B is a perspective schematic diagram illustrating a quad flat package (QFP) as an example of the electronic component. An electronic component 4700 in FIG. 17B includes a lead 4701 and a circuit portion 4703. The electronic component 4700 in FIG. 17B is mounted on a printed wiring board 4702, for example. A plurality of electronic components 7400 that are combined and electrically connected to each other over the printed wiring board 4702 can be mounted on an electronic device such as the information processing system. A completed circuit board 4704 is provided in an electronic device such as an information processing system.

<Specific Example of Information Processing System>

Next, specific examples of an information processing system that includes the electronic component are described.

FIGS. 18A to 18F schematically illustrate some electronic devices as specific examples of the information processing system 1200. The memory system 1201 is mounted on a housing of the information processing system in FIGS. 18A to 18F.

Figure 18A:
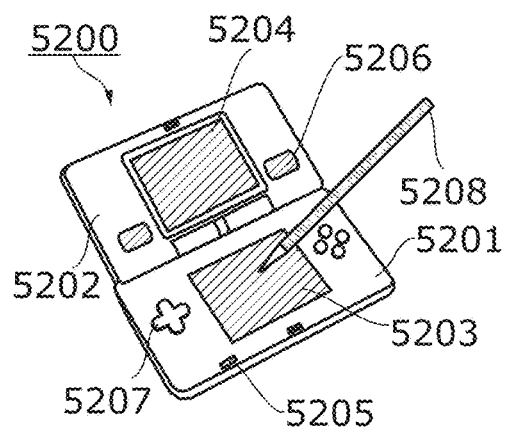
FIGS. 18A to 18F each illustrate an electronic device.

A portable game machine 5200 in FIG. 18A includes a first housing 5201, a second housing 5202, a display portion 5203, a display portion 5204, a microphone 5205, speakers 5206, an operation button 5207, a stylus 5208, and the like.

Figure 18B:
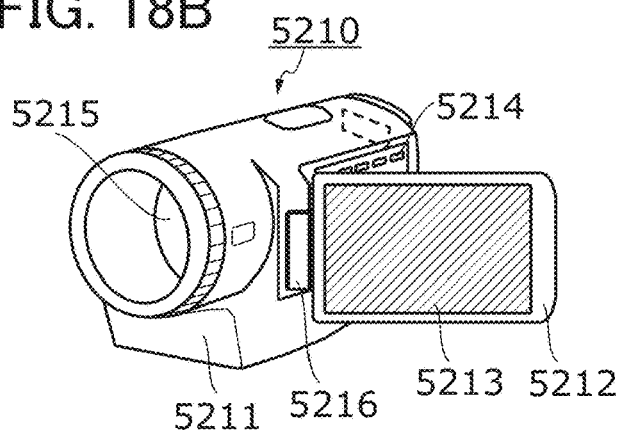

A video camera 5210 in FIG. 18B includes a first housing 5211, a second housing 5212, a display portion 5213, operation buttons 5214, a lens 5215, a joint 5216, and the like. The operation buttons 5214 and the lens 5215 are provided in the first housing 5211, and the display portion 5213 is provided in the second housing 5212. The first housing 5211 and the second housing 5212 are connected to each other with the joint 5216, and an angle between the first housing 5211 and the second housing 5212 can be changed with the joint 5216. An image on the display portion 5213 may be switched depending on the angle between the first housing 5211 and the second housing 5212 at the joint 5216.

Figure 18C:
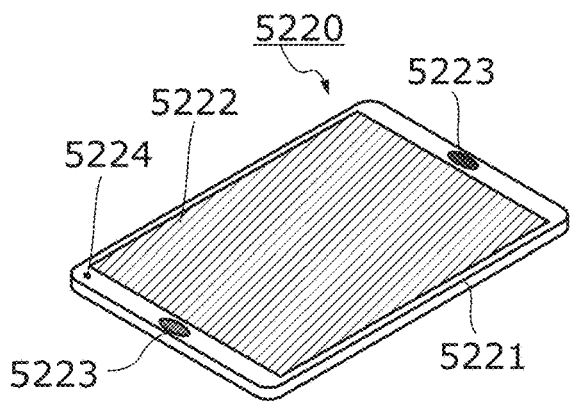

A tablet information terminal 5220 in FIG. 18C includes a display portion 5222 incorporated in a housing 5221, operation buttons 5223, and a speaker 5224.

Figure 18D:
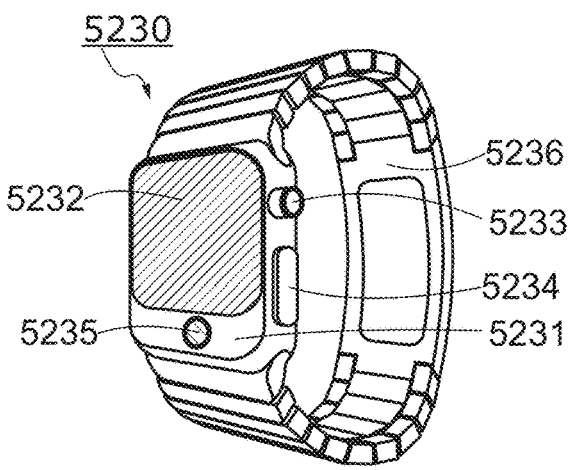

A watch-type information terminal 5230 in FIG. 18D is a kind of wearable computer, which includes a housing 5231, a display portion 5232, a first operation key 5233, a second operation key 5234, a third operation key 5235, and a belt 5236. The display portion 5232, the first operation key 5233, the second operation key 5234, and the third operation key 5235 are provided for the housing 5231. In case the belt 5234 would include a battery, a circuit, or the like, the housing 5231 and the belt 5234 may be formed integrally. The structure example of the watch-type information terminal 5230 is not limited to the structure in FIG. 18D. The structure may be changed by selecting the function. For example, the display portion 5232 may have a touch sensor function so that the watch-type information terminal 5230 can be operated by touch with the display portion 5232. Alternatively, for example, the third operation key 5235 may have a fingerprint authentication sensor to prevent the watch-type information terminal 5230 from being used by a third person.

Figure 18E:
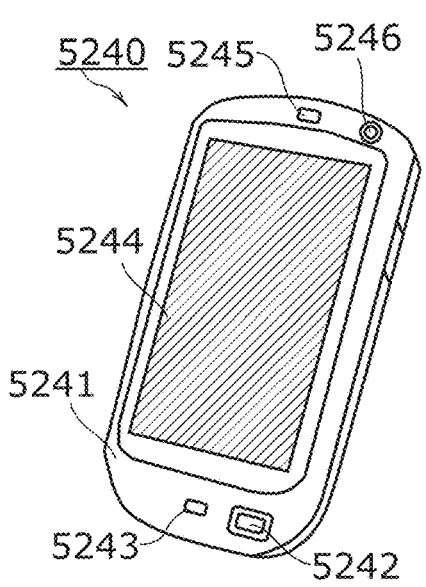

A smartphone 5240 in FIG. 18E includes a housing 5241, an operation button 5242, a microphone 5243, a display portion 5244, a speaker 5245, a camera lens 5246, and the like. An imaging device is incorporated in the housing 5241. Since the camera lens 5246 is provided on the same plane as the display portion 5244, a videophone is possible. For example, an LCD with a touch sensor function is used as the display portion 5244.

Figure 18F:
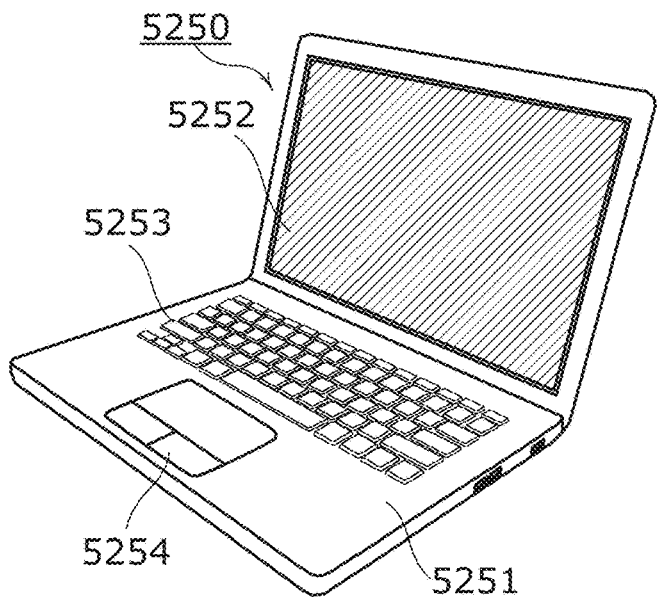

A laptop PC 5250 in FIG. 18F includes a housing 5251, a display portion 5252, a keyboard 5253, a pointing device 5254, and the like.

When a flexible substrate (e.g., a resin film) is used as the substrate of a display panel included in the display device 1221 in the information processing system 1200, the display device 1221 can be bent. Therefore, the information processing system 1200 can be used in a folded state or a bent state. FIGS. 19A to 19G schematically illustrate some information terminals as specific examples of the information processing system 1200.

An information terminal 5300 in FIGS. 19A to 19C includes display portions 5301 and a housing 5302 that supports the display portions 5301. The display portion 5301 in a bent state is supported by the housing 5302 so that information can be displayed on a side surface and a top surface of the information terminal 5300. A touch sensor is incorporated in the display portion 5301 and functions as an input/output device. Depending on a region of the display portion 5301 that is touched by a user, operation of the information terminal 5300 can be varied. For example, depending on touch operation of a side surface, a top surface, or a front surface of the information terminal 5300, the information terminal 5300 may execute different processing.

An information terminal 5310 in FIGS. 19D and 19E includes a display portion 5311, a display portion 5312, and a belt-like housing 5313. The housing 5313 supports the display portions 5311 and 5312. Since the housing 5313 is flexible, a user can use the information terminal 5310 while mounting the information terminal 5310 on an arm or the like.

An information terminal 5320 in FIGS. 19F and 19G includes a display portion 5321, a housing 5322, and a housing 5323. The display portion 5321 and the housing 5322 are flexible. Therefore, the information terminal 5320 can be folded in half at the housing 5322.

Next, an application example of a display device that can include the semiconductor device or the storage device in one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device that is a device including a display element, a light-emitting element, and a light-emitting device that is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS), such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, a piezoelectric ceramic display, and a quantum dot. Other than the above, a display element, a display device, a light-emitting element, or a light-emitting device may include display media whose contrast, luminance, reflectivity, transmittance, or the like is changed by electrical or magnetic effect. Examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum, silver, or the like. In such a case, a storage circuit such as an SRAM can be provided below the reflective electrodes, which leads to lower power consumption. Note that in the case where an LED chip is used, graphene or graphite may be provided below an LED chip electrode or a nitride semiconductor. Graphene or graphite may be a multi-layer film formed by overlap of a plurality of layers. When graphene or graphite is provided in this manner, a nitride semiconductor, for example, an n-type GaN semiconductor layer including crystals can be easily formed thereover. The LED chip can be formed by providing, for example, a p-type GaN semiconductor layer including crystals thereover. An AlN layer may be provided between graphene or graphite and the n-type GaN semiconductor layer including crystals. The GaN semiconductor layer included in the LED chip may be formed by MOCVD. Note that when graphene is provided, the GaN semiconductor layer included in the LED chip can be formed by sputtering. In a display element including MEMS, a dry agent may be provided in a space where a display element is sealed (or between an element substrate over which the display element is placed and a counter substrate opposite to the element substrate, for example). The dry agent can prevent MEMS and the like from becoming difficult to move or deteriorating easily because of moisture or the like.

Note that this embodiment can be combined with any of the other embodiments in this specification as appropriate.

Embodiment 4

A structure example of a storage device in one embodiment of the present invention is described with reference to FIG. 20.

Figure 20:
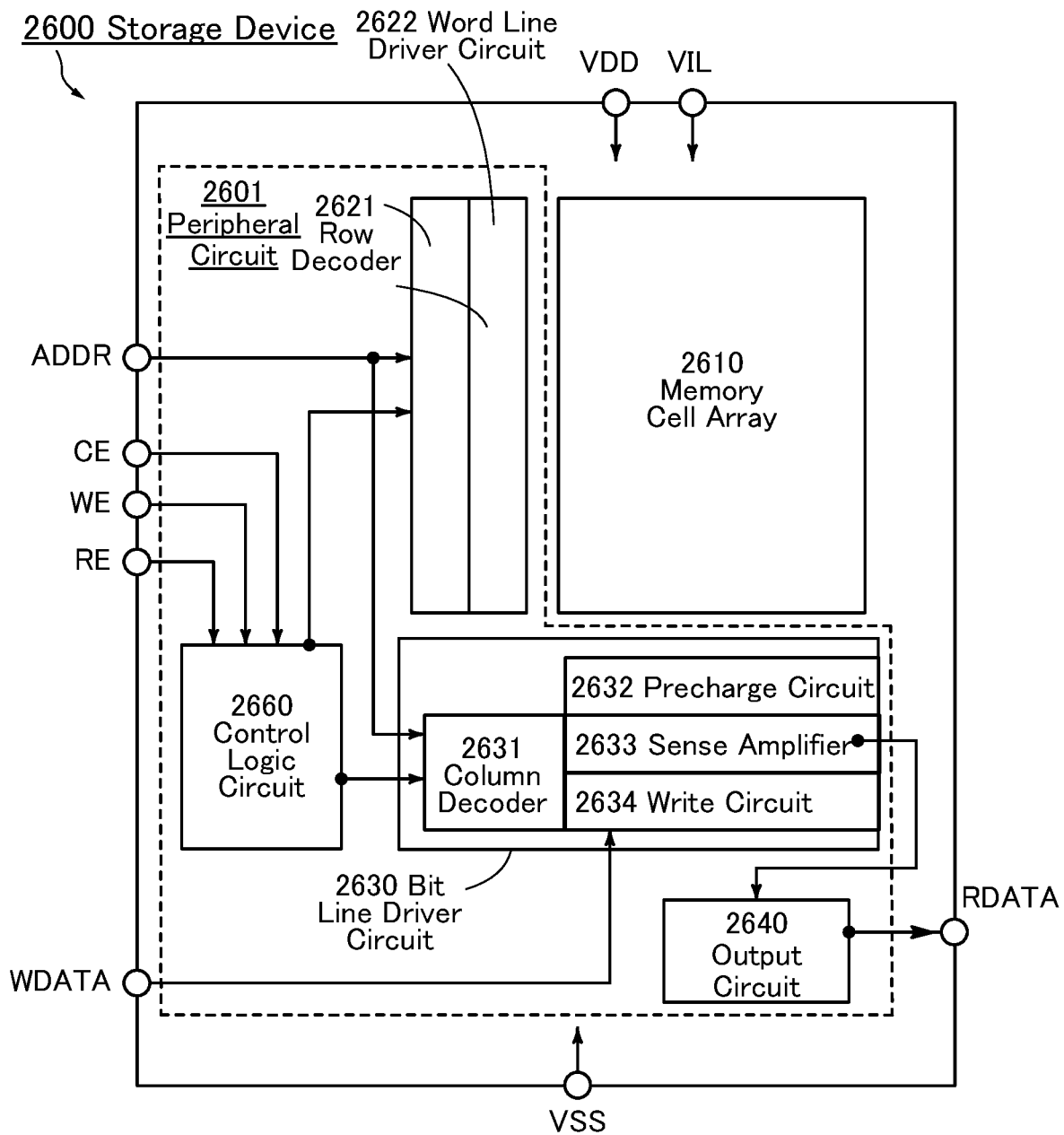
FIG. 20 is a block diagram illustrating an example of a storage device.

FIG. 20 illustrates a structure example of a storage device. A storage device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging the wiring BL (or the wiring RBL or WBL) and the wiring SL that are described in Embodiment 1 but not illustrated in FIG. 20. The sense amplifier 2633 has a function of amplifying a data signal read from the wiring BL (or the wiring RBL). The amplified data signal is output as a digital data signal RDATA from the storage device 2600 through the output circuit 2640.

As power supply voltages, low power supply voltage (VSS), high power supply voltage (VDD) for the peripheral circuit 2601, and high power supply voltage (VIL) for the memory cell array 2610 are supplied to the storage device 2600 from the outside.

Control signals (CE, WE, and RE), an address signal ADDR, and a data signal WDATA are input to the storage device 2600 from the outside. The address signal ADDR is input to the row decoder 2621 and the column decoder 2631, and the data signal WDATA is input to the write circuit 2634.

The control logic circuit 2660 processes the signals (CE, WE, and RE) input from the outside, and generates control signals for the row decoder 2621 and the column decoder 2631. CE, WE, and RE are a chip enable signal, a write enable signal, and a read enable signal, respectively. Signals processed by the control logic circuit 2660 are not limited to those listed above, and other control signals may be input as necessary.

Note that the decision whether the circuits and signals described above are used or not can be made as appropriate as needed.

When a p-channel Si transistor and a transistor including a channel formation region using an oxide semiconductor (preferably an oxide containing In, Ga, and Zn) described in a later embodiment are used in the memory device 2600, the storage device 2600 can be reduced in size. In addition, the storage device 2600 can be reduced in power consumption. Furthermore, the storage device 2600 can be increased in operation speed. In particular, by using only a p-channel transistor as the Si-transistor, manufacturing cost can be reduced.

Note that the structure example of this embodiment is not limited to that illustrated in FIG. 20. Depending on circumstances or conditions, the structure of the storage device 2600 may be changed. For example, in the case where any of the memory cells 151 to 155 described in Embodiment 1 is used for the storage device 2600, the number of wirings and the structure of the peripheral circuit may be changed as appropriate in accordance with the kind of memory cell.

Note that this embodiment can be combined with any of the other embodiments in this specification as appropriate.

Embodiment 5

In this embodiment, transistors of one embodiment of the disclosed invention are described.

Transistors in one embodiment of the present invention each preferably include an nc-OS or a CAAC-OS, which is described in Embodiment 7.

<Structure Example 1 of Transistor>

FIGS. 21A to 21C are a top view and cross-sectional views of a transistor 1400a. FIG. 21A is the top view. FIG. 21B is a cross-sectional view taken along dashed-dotted line A1-A2 in FIG. 21A, and FIG. 21C is a cross-sectional view taken along dashed-dotted line A3-A4 in FIG. 21A. Note that for simplification of the drawing, some components in the top view in FIG. 21A are not illustrated. The dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450; an insulating film 1401 over the substrate 1450; a conductive film 1414 over the insulating film 1401; an insulating film 1402 covering the conductive film 1414; an insulating film 1403 over the insulating film 1402; an insulating film 1404 over the insulating film 1403; a metal oxide 1431 and a metal oxide 1432 that are stacked in that order over the insulating film 1404; a conductive film 1421 in contact with top and side surfaces of the metal oxide 1432; a conductive film 1423 also in contact with the top and side surfaces of the metal oxide 1432; a conductive film 1422 over the conductive film 1421; a conductive film 1424 over the conductive film 1423; an insulating film 1405 over the conductive films 1422 and 1424; a metal oxide 1433 in contact with the metal oxides 1431 and 1432, the conductive films 1421 to 1424, and the insulating film 1405; an insulating film 1406 over the metal oxide 1433; a conductive film 1411 over the insulating film 1406; a conductive film 1412 over the conductive film 1411; a conductive film 1413 over the conductive film 1412; an insulating film 1407 covering the conductive film 1413; and an insulating film 1408 over the insulating film 1407. Note that the metal oxides 1431 to 1433 are collectively referred to as a metal oxide 1430.

The metal oxide 1432 is a semiconductor and functions as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 function as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 function as one of source and drain electrodes of the transistor 1400a. The conductive films 1423 and 1424 function as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 function as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 functions as a first gate insulating film of the transistor 1400a.

The conductive film 1414 functions as a second gate electrode of the transistor 1400a.

The potential applied to the conductive films 1411 to 1413 may be the same as or different from that applied to the conductive film 1414. The conductive film 1414 may be omitted depending on circumstances.

The insulating films 1401 to 1404 function as a base insulating film of the transistor 1400a. The insulating films 1402 to 1404 also function as a second gate insulating film of the transistor 1400a.

The insulating films 1405 to 1408 function as a protective insulating film or an interlayer insulating film of the transistor 1400a.

As illustrated in FIG. 21C, the side surface of the metal oxide 1432 is surrounded by the conductive film 1411. With this structure, the metal oxide 1432 can be electrically surrounded by an electric field of the conductive film 1411. Such a structure of a transistor in which a semiconductor is electrically surrounded by an electric field of a gate electrode is referred to as a surrounded channel (s-channel) structure. Therefore, a channel is formed in the entire metal oxide 1432 (bulk). In the s-channel structure, a large amount of current can flow between a source and a drain of a transistor, so that the on-state current of the transistor can be increased.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region functioning as a gate electrode is formed to fill an opening 1415 formed in the insulating film 1405 and the like, that is, in a self-aligning manner.

As illustrated in FIG. 21B, the conductive films 1411 and 1422 have a region where they overlap with each other with the insulating film positioned therebetween. The conductive films 1411 and 1423 also have a region where they overlap with each other with the insulating film positioned therebetween. These regions function as parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 22A:
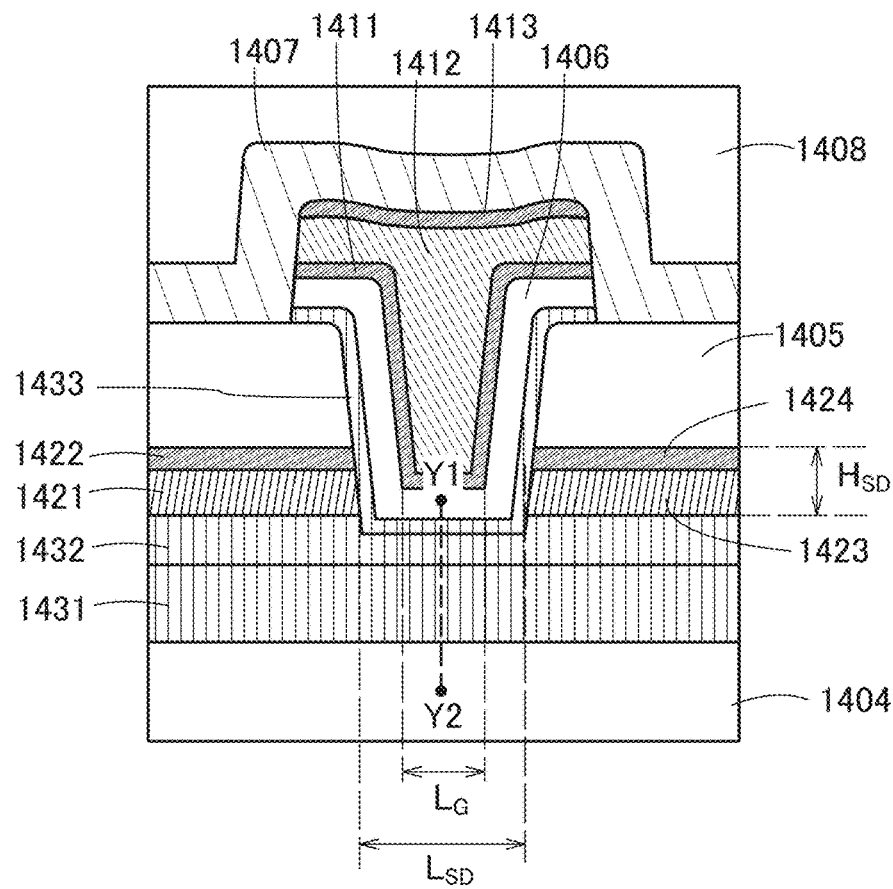
FIG. 22A is a cross-sectional view illustrating a structure example of a transistor.

FIG. 22A is an enlarged view of the center of the transistor 1400a. In FIG. 22A, width $L_G$ denotes the length of the bottom surface of the conductive film 1411 that faces and lies parallel to the top surface of the metal oxide 1432 with the insulating film 1406 and the metal oxide 1433 positioned therebetween. The width $L_G$ is the line width of the gate electrode. In FIG. 22A, width $L_{SD}$ denotes the length between the conductive films 1421 and 1423, i.e., the length between the source and drain electrodes.

The width $L_{SD}$ is generally determined by the minimum feature size. As illustrated in FIG. 22A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 22A, height $H_{SD}$ denotes the total thickness of the conductive films 1421 and 1422, or the total thickness of the conductive films 1423 and 1424.

The thickness of the insulating film 1406 is preferably less than or equal to the height $H_{SD}$ because the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, more preferably five times or more, the thickness of the insulating film 1406, because the parasitic capacitance is negligibly small. As a result, the transistor 1400*a* can operate at high frequency.

Components of the transistor 1400*a* are described below.
<<Metal Oxide Layer>>

First, a metal oxide that can be used as the metal oxides 1431 to 1433 is described.

The transistor 1400*a* preferably has low current (off-state current) flowing between a source and a drain in the off state. Examples of the transistor with low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

A CAAC-OS film which is described later is preferably used for the metal oxide 1432.

The metal oxides 1431 and 1433 include, for example, one or more elements other than oxygen included in the metal oxide 1432. Since the metal oxides 1431 and 1433 include one or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by sputtering, a sputtering target with the above composition is preferably used. For example, In:M:Zn is preferably 1:3:2 or 1:3:4.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by sputtering, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 22B:
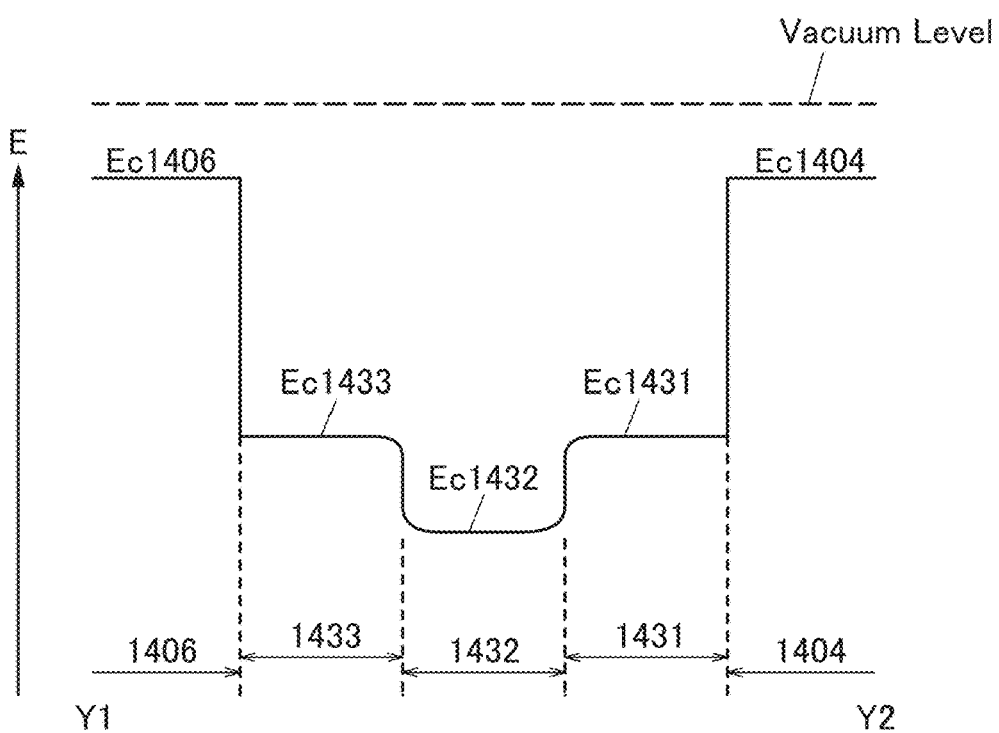
FIG. 22B is an energy band diagram of the transistor.

The function and effect of the metal oxide 1430, which includes a stack of the metal oxides 1431 to 1433, are described with reference to an energy band diagram of FIG. 22B. FIG. 22B shows the energy band structure of a portion taken along line Y1-Y2 in FIG. 22A, that is, the energy band structure of a channel formation region of the transistor 1400*a* and the vicinity thereof.

In FIG. 22B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as an electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having a higher electron affinity than those of the metal oxides 1431 and 1433. For example, as the metal oxide 1432, a metal oxide having an electron affinity higher than those of the metal oxides 1431 and 1433 by 0.07 eV or more and 1.3 eV or less, preferably 0.1 eV or more and 0.7 eV or less, more preferably 0.15 eV or more and 0.4 eV or less is used. Note that the electron affinity is an energy gap between the vacuum level and the bottom of the conduction band.

Indium gallium oxide has a low electron affinity and a high oxygen-blocking property. Therefore, the metal oxide 1433 preferably includes indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 1432 having the highest electron affinity among the metal oxides 1431 to 1433.

Therefore, electrons move mainly in the metal oxide 1432, not in the metal oxides 1431 and 1433. Hence, the on-state current hardly varies even when the interface state density, which inhibits electron movement, is high at the interface between the metal oxide 1431 and the insulating film 1404 or at the interface between the metal oxide 1433 and the insulating film 1406. The metal oxides 1431 and 1433 function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 µm×1 µm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (Ra) with the measurement area of 1 µm×1 µm is less than 1 nm, preferably less than 0.6 nm, further preferably less than 0.5 nm, and still further preferably less than 0.4 nm. The maximum difference (P-V) with the measurement area of 1 µm×1 µm is less than 10 nm, preferably less than 9 nm, more preferably less than 8 nm, still more preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies ($V_O$), donor levels are formed by entry of hydrogen into sites of oxygen vacancies in some cases. A state in which hydrogen enters sites of oxygen vacancies is denoted by $V_{OH}$ in the following description in some cases. $V_{OH}$ is a factor in decreasing the on-state current of the transistor because $V_{OH}$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, and still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region where the concentration of silicon measured by SIMS is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region where the concentration of silicon measured by SIMS is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$.

It is preferable to reduce the concentration of hydrogen in the metal oxides 1431 and 1433 in order to reduce the concentration of hydrogen in the metal oxide 1432. The metal oxides 1431 and 1433 each have a region where the concentration of hydrogen measured by SIMS is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. It is also preferable to reduce the concentration of nitrogen in the metal oxides 1431 and 1433 in order to reduce the concentration of nitrogen in the metal oxide 1432. The metal oxides 1431 and 1433 each have a region where the concentration of nitrogen measured by SIMS is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$.

The metal oxides 1431 to 1433 may be formed by sputtering, chemical vapor deposition (CVD), molecular beam epitaxy (MBE), pulsed laser deposition (PLD), atomic layer deposition (ALD), or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., more preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without the metal oxide 1431 or 1433 may be employed. Alternatively, any one of the semiconductors given as examples of the metal oxides 1431 to 1433 may be provided over or below the metal oxide 1431 or over or below the metal oxide 1433, i.e., a four-layer structure may be employed. Alternatively, an n-layer structure (n is an integer of 5 or more) in which any one of the semiconductors given as examples of the metal oxides 1431 to 1433 is provided at two or more of the following positions may be employed: over the metal oxide 1431, below the metal oxide 1431, over the metal oxide 1433, and below the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like can be used. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 preferably greater than or equal to 10 μm and less than or equal to 500 μm, more preferably greater than or equal to 15 μm and less than or equal to 300 μm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450 that is caused by dropping or the like can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 has a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage that is formed by reacting tetraethyl orthosilicate (TEOS), silane, or the like with oxygen, nitrous oxide, or the like.

After the insulating film 1402 is formed, the insulating film 1402 may be subjected to planarization treatment by CMP or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen at a proportion higher than that in the stoichiometric composition. Part of oxygen is released by heating from an oxide film containing oxygen at a proportion higher than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen at a proportion higher than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$, in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, ion implantation, ion doping, plasma immersion ion implantation, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment by CMP or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. The insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The use of a Cu—Mn alloy is further preferable because manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The use of a Cu—Mn alloy is further preferable because manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 1441 and 1442 are formed when, for example, the conductive films 1421 and 1423 extract oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, the combination of silicon oxide or silicon oxynitride with an insulator with a high relative dielectric constant makes the layered structure thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, the combination of silicon oxide or silicon oxynitride with a resin makes the layered structure thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. The insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing transmission of both oxygen and impurities such as hydrogen and moisture.

When the insulating film 1407 is formed by sputtering in an atmosphere containing oxygen or plasma-enhanced CVD with a gas containing oxygen, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, so that oxygen vacancies in the metal oxide 1430 can be reduced.

Figure 23A:
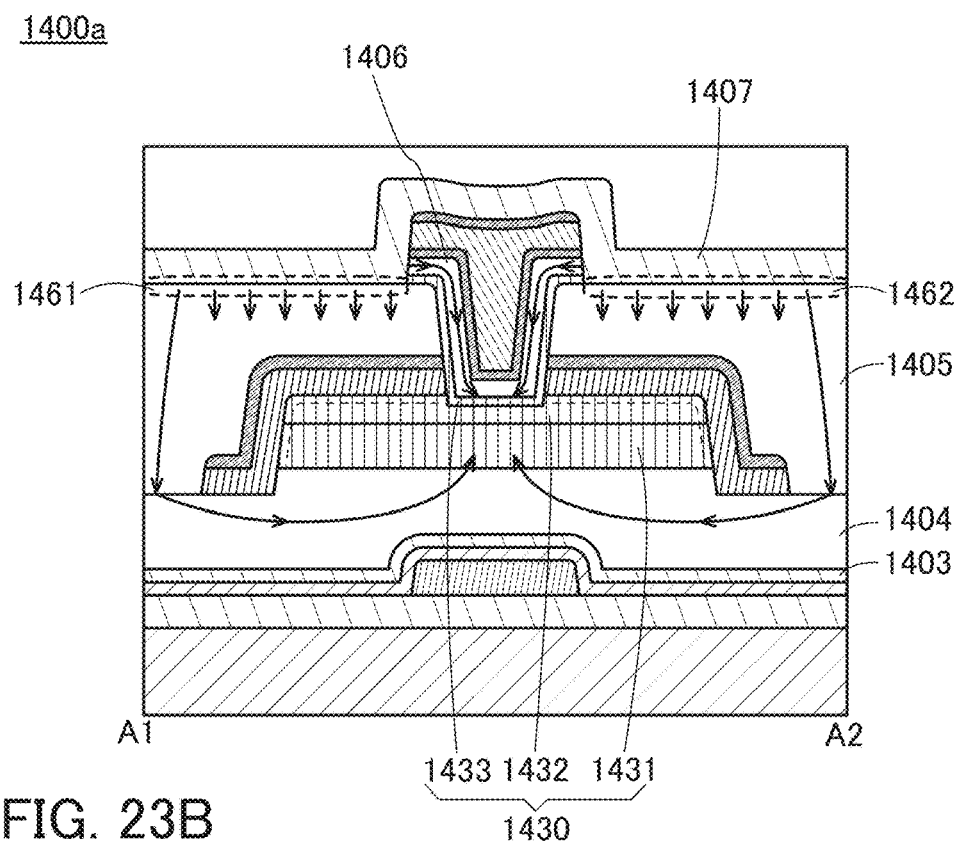
FIGS. 23A and 23B are cross-sectional views illustrating oxygen diffusion paths.
Figure 23B:
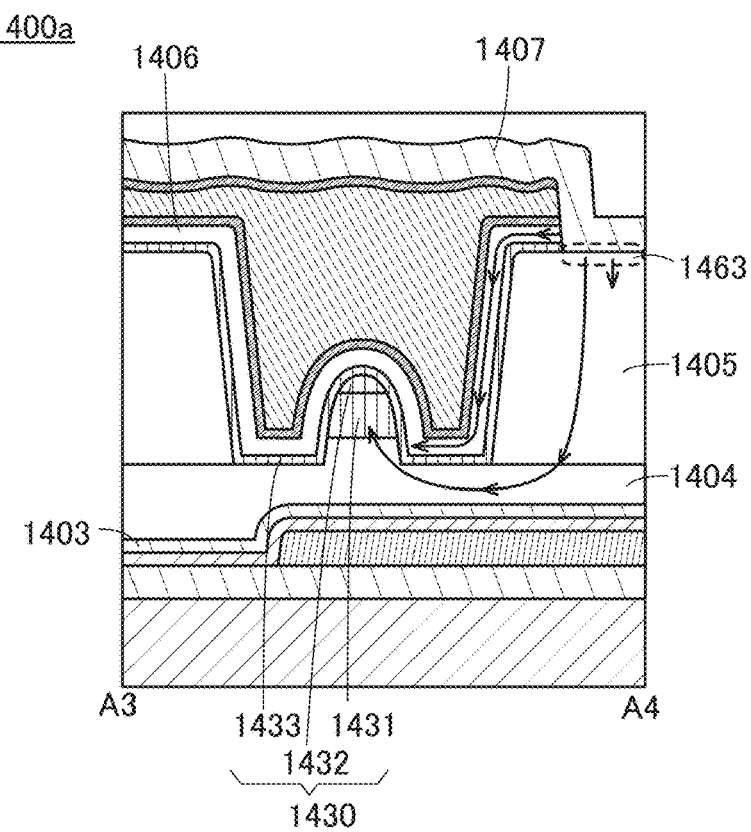

In schematic views of FIGS. 23A and 23B, oxygen added to the insulating films 1405 and 1406 in the formation of the insulating film 1407 is diffused in the insulating films through the second heat treatment and reaches the metal oxide 1430. In FIG. 23A, oxygen diffused in the cross-sectional view of FIG. 21B is indicated by arrows. In FIG. 23B, oxygen diffused in the cross-sectional view of FIG. 21C is indicated by arrows.

As illustrated in FIGS. 23A and 23B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused over the insulating film 1407. The insulating film 1403 also has a function of blocking oxygen and prevents oxygen from being diffused under the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by 20° C. or higher and 150° C. or lower, preferably 40° C. or higher and 100° C. or lower. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, for example, an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Structure Example 2 of Transistor>

The conductive film 1414 and the insulating films 1402 and 1403 can be omitted in the transistor 1400a illustrated in FIGS. 21A to 21C. An example of such a structure is illustrated in FIGS. 24A to 24C.

Figure 24A:
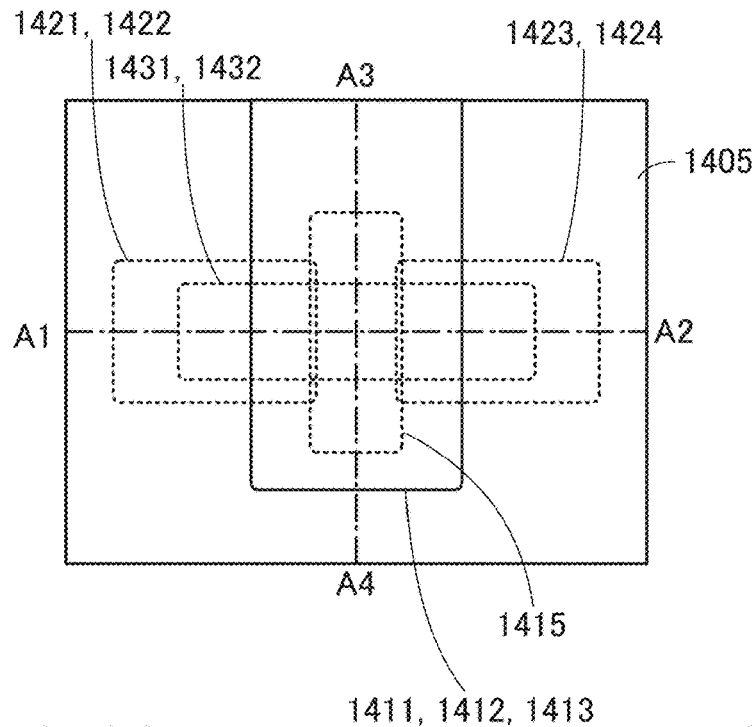
FIGS. 24A to 24C are a top view and cross-sectional views illustrating a structure example of a transistor.
Figure 24B:
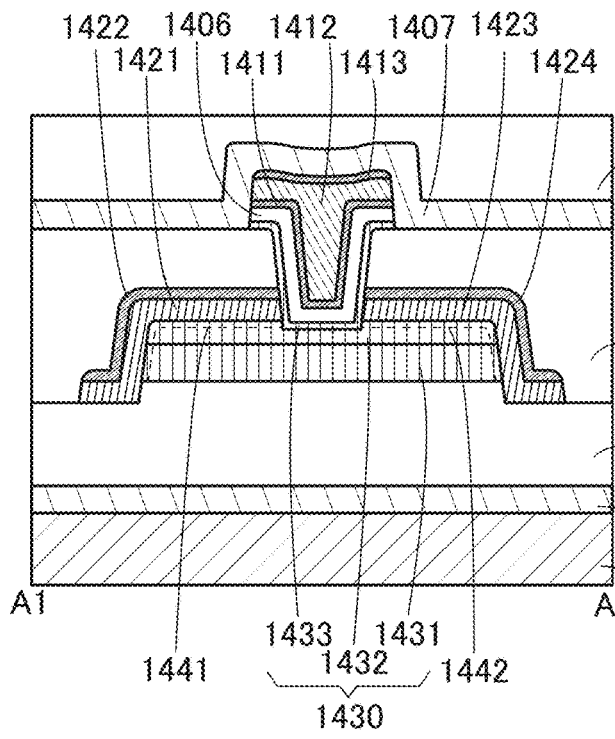
Figure 24C:
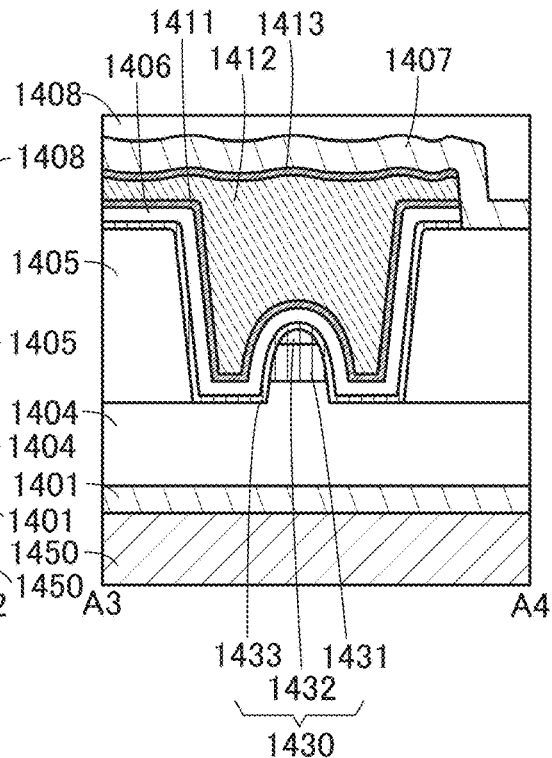

FIGS. 24A to 24C are a top view and cross-sectional views of a transistor 1400b. FIG. 24A is the top view. FIG. 24B is a cross-sectional view taken along dashed-dotted line A1-A2 in FIG. 24A, and FIG. 24C is a cross-sectional view taken along dashed-dotted line A3-A4 in FIG. 24A. Note that for simplification of the drawing, some components in the top view in FIG. 24A are not illustrated. The dashed-dotted line A1-A2 and the dashed-dotted line A3-A4 are sometimes referred to as a channel length direction of the transistor 1400b and a channel width direction of the transistor 1400b, respectively.

<Structure Example 3 of Transistor>

In the transistor 1400a illustrated in FIGS. 21A to 21C, parts of the conductive films 1421 and 1423 that overlap with the gate electrode (the conductive films 411 to 413) can be reduced in thickness. An example of such a structure is illustrated in FIGS. 25A to 25C.

Figure 25A:
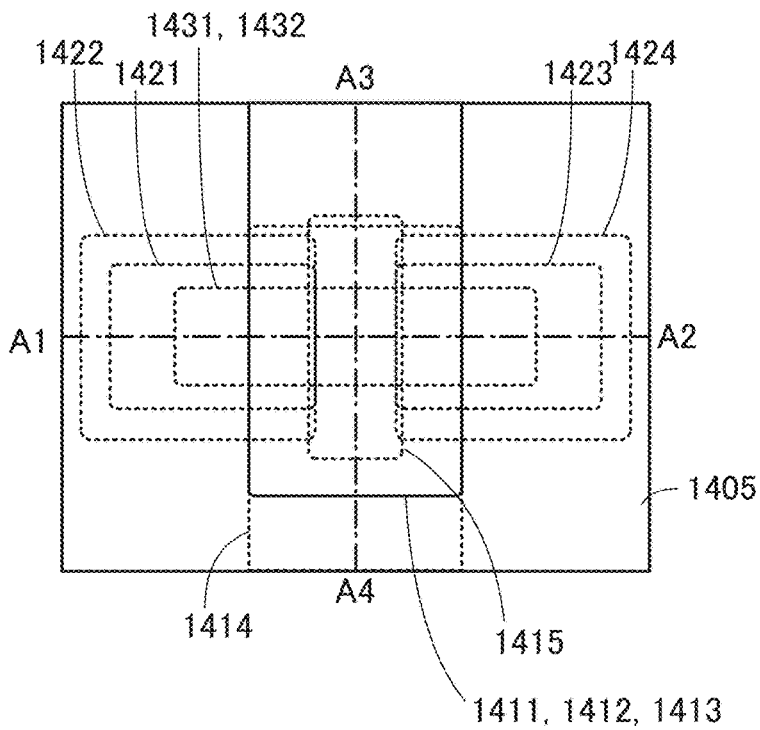
FIGS. 25A to 25C are a top view and cross-sectional views illustrating a structure example of a transistor.
Figure 25B:
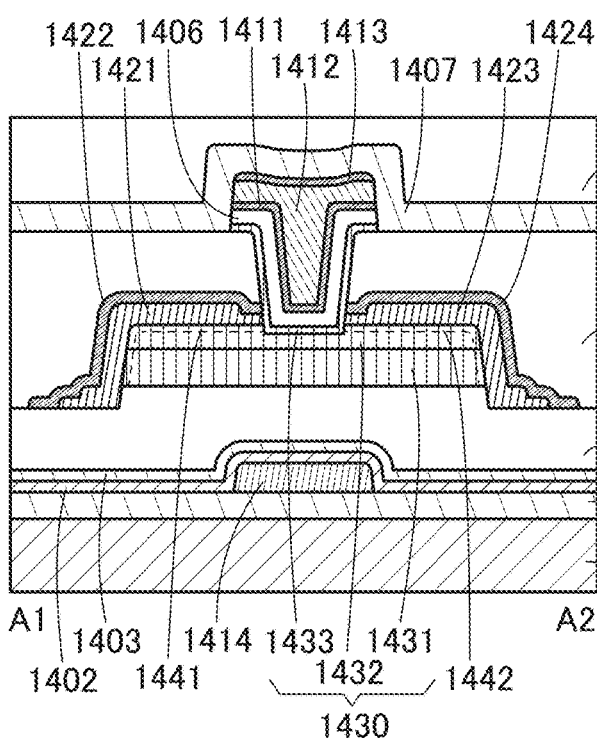
Figure 25C:
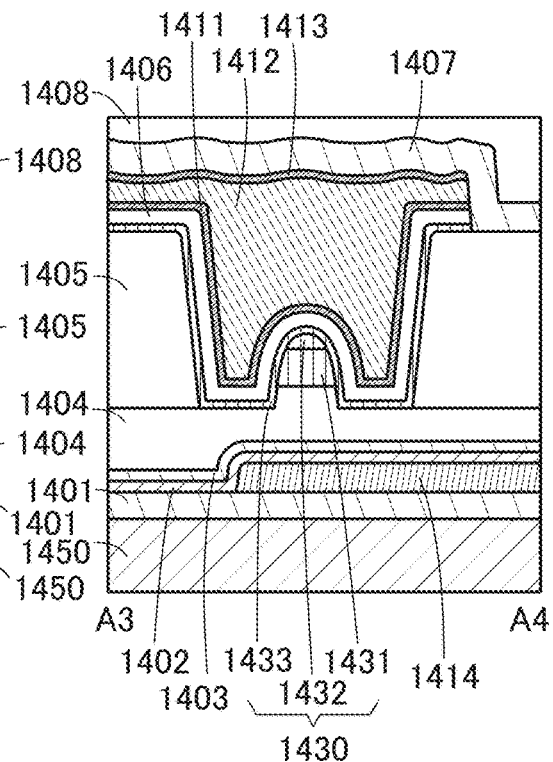

FIGS. 25A to 25C are a top view and cross-sectional views of a transistor 1400c. FIG. 25A is the top view. FIG. 25B is a cross-sectional view taken along dashed-dotted line A1-A2 in FIG. 25A, and FIG. 25C is a cross-sectional view taken along dashed-dotted line A3-A4 in FIG. 25A. Note that for simplification of the drawing, some components in the top view in FIG. 25A are not illustrated. The dashed-dotted line A1-A2 and the dashed-dotted line A3-A4 are sometimes referred to as a channel length direction of the transistor 1400c and a channel width direction of the transistor 1400c, respectively.

In the transistor 1400c illustrated in FIG. 25B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c that has the structure in FIG. 25B can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structure Example 4 of Transistor>

In the transistor 1400c illustrated in FIGS. 25A to 25C, the width of the metal oxides 1431 and 1432 can be increased in the A3-A4 direction. An example of such a structure is illustrated in FIGS. 26A to 26C.

Figure 26A:
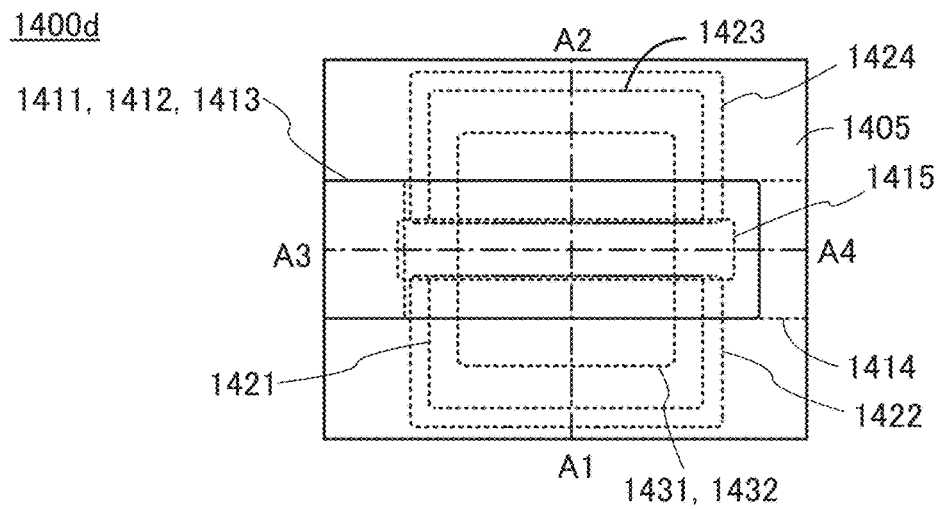
FIGS. 26A to 26C are a top view and cross-sectional views illustrating a structure example of a transistor.
Figure 26B:
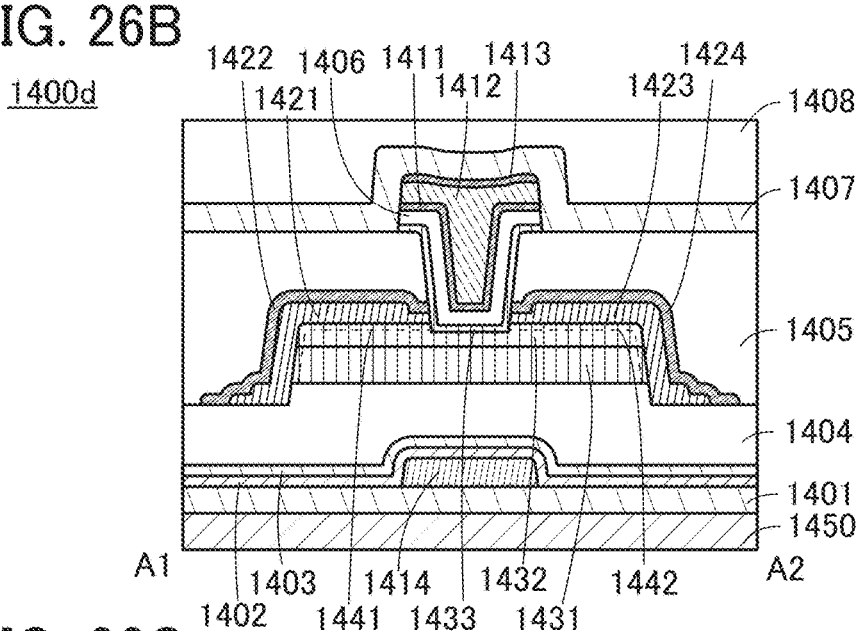
Figure 26C:
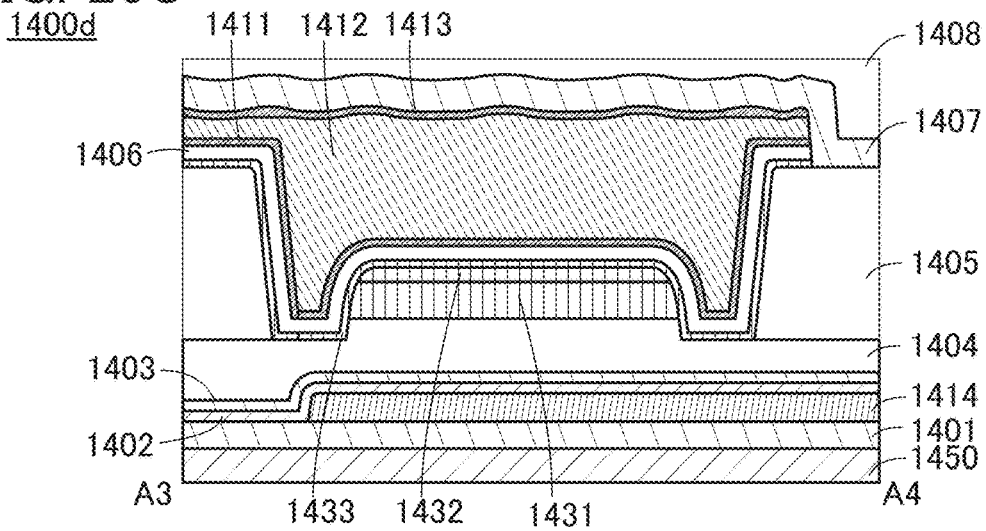

FIGS. 26A to 26C are a top view and cross-sectional views of a transistor 1400d. FIG. 26A is the top view. FIG. 26B is a cross-sectional view taken along dashed-dotted line A1-A2 in FIG. 26A, and FIG. 26C is a cross-sectional view taken along dashed-dotted line A3-A4 in FIG. 26A. Note that for simplification of the drawing, some components in the top view in FIG. 26A are not illustrated. The dashed-dotted line A1-A2 and the dashed-dotted line A3-A4 are sometimes referred to as a channel length direction of the transistor 1400d and a channel width direction of the transistor 1400d, respectively.

The transistor 1400d that has the structure in FIGS. 26A to 26C can have increased on-state current.

<Structure Example 5 of Transistor>

In the transistor 1400c illustrated in FIGS. 26A to 26C, a plurality of regions (fins) consisting of the metal oxides 1431 and 1432 may be provided in the A3-A4 direction. An example of such a structure is illustrated in FIGS. 27A to 27C.

Figure 27A:
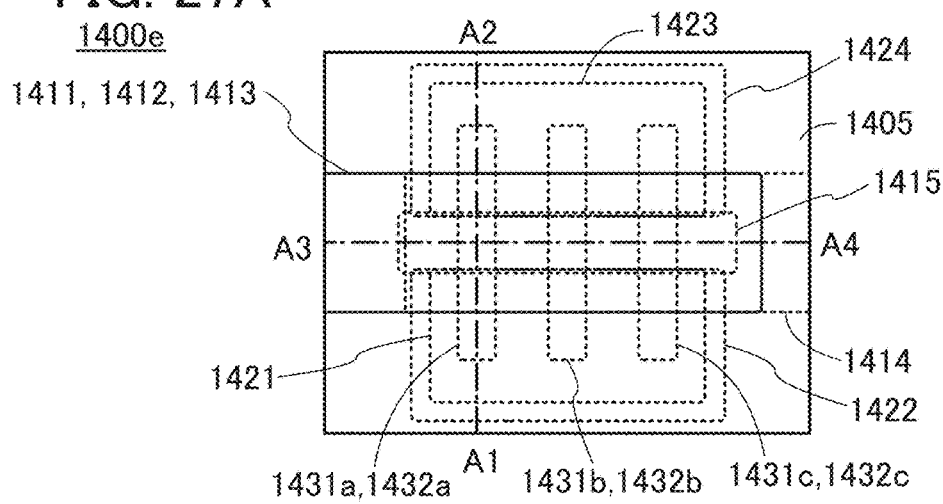
FIGS. 27A to 27C are a top view and cross-sectional views illustrating a structure example of a transistor.
Figure 27B:
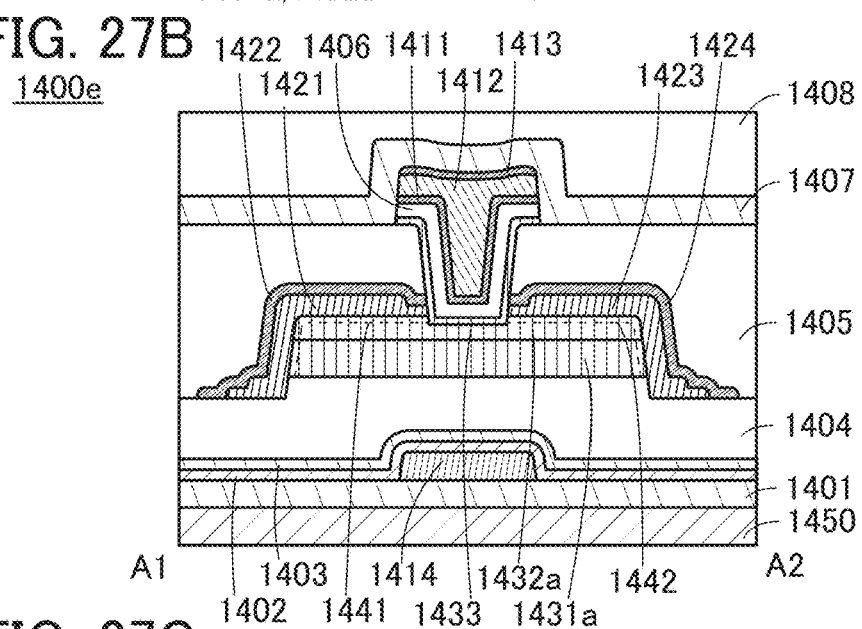
Figure 27C:
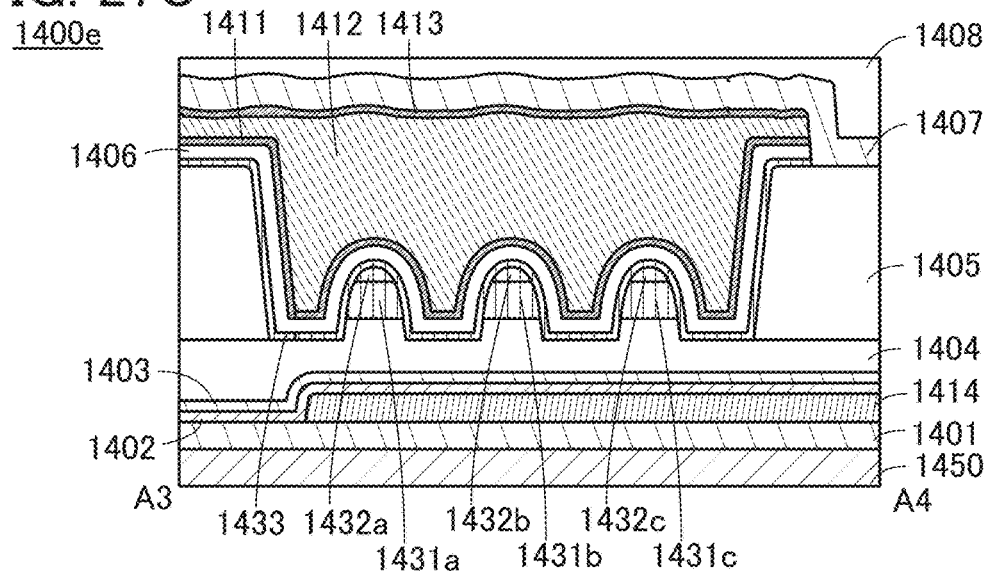

FIGS. 27A to 27C are a top view and cross-sectional views of a transistor 1400e. FIG. 27A is the top view. FIG. 27B is a cross-sectional view taken along dashed-dotted line A1-A2 in FIG. 27A, and FIG. 27C is a cross-sectional view taken along dashed-dotted line A3-A4 in FIG. 27A. Note that for simplification of the drawing, some components in the top view in FIG. 27A are not illustrated. The dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with high on-state current can be obtained.

<Structure Example 6 of Transistor>

FIGS. 28A to 28D are a top view and cross-sectional views of a transistor 1400f. FIG. 28A is the top view of the transistor 1400f. FIG. 28B is a cross-sectional view taken along dashed-dotted line A1-A2 in FIG. 28A, and FIG. 28C is a cross-sectional view taken along dashed-dotted line A3-A4 in FIG. 28A. The dashed-dotted line A1-A2 and the dashed-dotted line A3-A4 are sometimes referred to as a channel length direction and a channel width direction, respectively. The transistor 1400f has an s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating films 1407 and 1408. The insulating film 1409 functions as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. It is preferable that the side edge of the conductive film 1412 in the channel length direction be approximately aligned with the side edge of the insulating film 1406 in the channel length direction. Here, the insulating film 1406 functions as a gate insulating film of the transistor 1400f and the conductive film 1412 functions as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to that where the outer edge of the metal oxide 1433 is outside of the outer edge of the metal oxide 1431. For example, the outer edge of the metal oxide 1431 may be outside of the outer edge of the metal oxide 1433, or the outer edge of the metal oxide 1431 may be approximately aligned with the outer edge of the metal oxide 1433.

FIG. 28D is an enlarged view of part of FIG. 28B. As illustrated in FIG. 28D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As illustrated in FIG. 28D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as illustrated in FIG. 28D, the border between the regions 1461b and 1461d overlaps with the border between the side edges of the insulating films 1407 and 1409. The same applies to the border between the regions 1461c and 1461e. Here, parts of the regions 1461d and 1461e preferably overlap with part of a region (channel formation region) where the metal oxide 1432 and the conductive film 1412 overlap with each other. For example, preferably, the side edges of the regions 1461d and 1461e in the channel length direction are inside of the conductive film 1412 and the distance between the side edge of the conductive film 1412 and each of the side edges of the regions 1461d and 1461e is d. In that case, the thickness $t_{406}$ of the insulating film 1406 and the distance d preferably satisfy $0.25 t_{406} < d < t_{406}$.

In this manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed to satisfy the above range, the regions 1461d and 1461e can be prevented from being formed too deeply in the channel formation region and always conducted.

The regions 1461b to 1461e are formed by ion doping treatment such as ion implantation. Therefore, as illustrated in FIG. 28D, the boundary between the regions 1461d and 1461a sometimes gets closer to the boundary between the regions 1461d and 1461b with the depth in the direction from the top surface of the metal oxide 1433 to the bottom surface of the metal oxide 1431. The distance d in that case is the distance between the boundary between the regions 1461d and 1461a that is closest to the inner part of the conductive film 1412 in the direction of the dashed-dotted line A1-A2 and the side edge of the conductive film 1412 at the A1 side in the direction of the dashed-dotted line A1-A2. Similarly, the boundary between the regions 1461e and 1461a sometimes gets closer to the boundary between the regions 1461e and 1461c with the depth in the direction from the top surface of the metal oxide 1433 to the bottom surface of the metal oxide 1431. The distance d in that case is the distance between the boundary between the regions 1461e and 1461a that is closest to the inner part of the conductive film 1412 in the direction of the dashed-dotted line A1-A2 and the side edge of the conductive film 1412 at the A2 side in the direction of the dashed-dotted line A1-A2.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of the elements included in the insulating film 1407. Preferably, parts of the low-resistance regions 1451 and 1452 are substantially in contact with or overlap partly with the region (channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b and 1461c to 1461e other than the low-resistance regions 1451 and 1452, and the lowest in the region 1461a. The added elements refer to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device in this embodiment is not limited to this structure. For example, the low-resistance regions 1451 and 1452 are not necessarily formed in the case where the regions 1461b and 1461c have sufficiently low resistance.

<Structure Example 7 of Transistor>

Figure 29A:
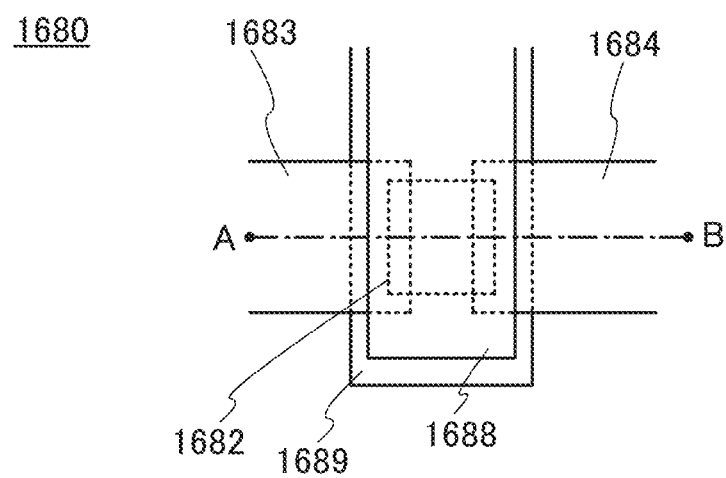
FIGS. 29A and 29B are a top view and a cross-sectional view illustrating a structure example of a transistor.
Figure 29B:
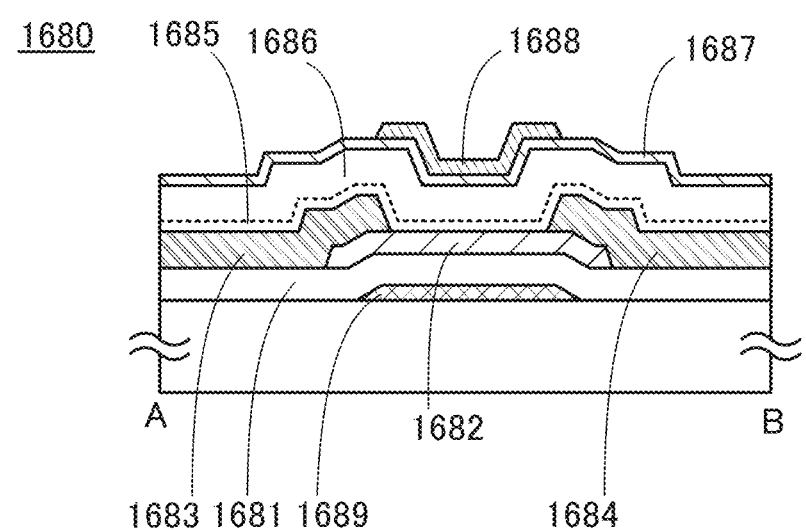

FIGS. 29A and 29B are a top view and a cross-sectional view illustrating a transistor 1680. FIG. 29A is the top view. FIG. 29B illustrates a cross section taken along dashed-dotted line A-B in FIG. 29A. In FIGS. 29A and 29B, some components are scaled up or down or omitted for easy understanding. In some cases, the direction of dashed-dotted line A-B is referred to as a channel length direction.

The transistor 1680 in FIG. 29B includes a conductive film 1689 functioning as a first gate, a conductive film 1688 functioning as a second gate, a semiconductor 1682, conductive films 1683 and 1684 functioning as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 positioned therebetween. The conductive film 1688 overlaps with the semiconductor 1682 with the insulating films 1685, 1686, and 1687 positioned therebetween. The conductive films 1683 and 1684 are connected to the semiconductor 1682.

The description of the conductive films 1411 to 1414 in FIGS. 21A to 21C may be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of the threshold voltage. Note that the conductive film 1688 may be omitted in some cases.

The description of the metal oxide 1432 in FIGS. 21A to 21C may be referred to for the details of the semiconductor 1682. The semiconductor 1682 may be a single layer or a stack including a plurality of semiconductor layers.

The description of the conductive films 1421 to 1424 in FIGS. 21A to 21C may be referred to for the details of the conductive films 1683 and 1684.

The description of the insulating film 1406 in FIGS. 21A to 21C may be referred to for the details of the insulating film 1681.

The insulating films 1685 to 1687 are sequentially stacked over the semiconductor 1682 and the conductive films 1683 and 1684 in FIG. 29B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the formation of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as illustrated in FIG. 29B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

An insulating film has a better blocking effect as the insulating film has a higher density and becomes denser or has a fewer dangling bonds and becomes more chemically stable. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

Note that this embodiment can be combined with any of the other embodiments in this specification as appropriate.

Embodiment 6

In this embodiment, structure examples of a device in which the structure example of the transistor described in Embodiment 5 is used for the memory cells 151 to 155 (hereinafter collectively referred to as a memory cell 150) described in Embodiment 1 are described with reference to FIGS. 30A and 30B, FIGS. 31A and 31B, FIGS. 32A and 32B, and FIGS. 33A and 33B.

<Structure Example 1 of Stack of Elements>

Figure 30A:
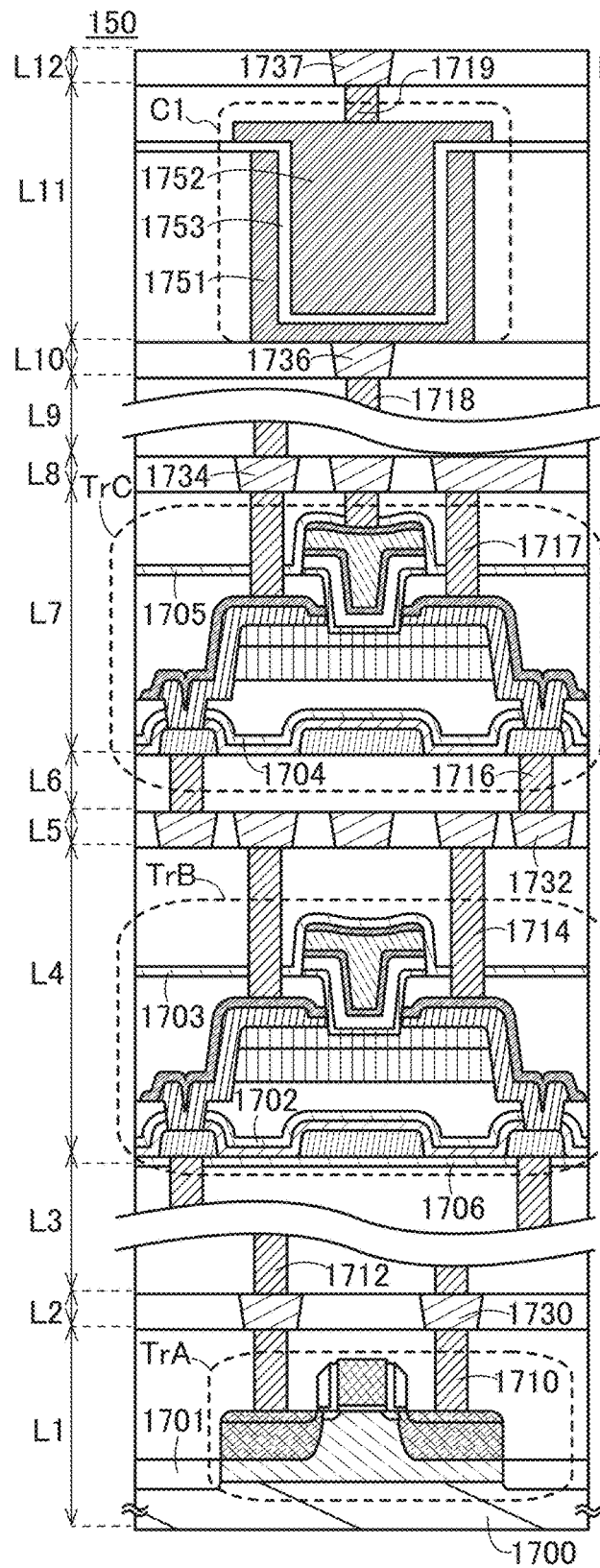
FIGS. 30A and 30B are cross-sectional views each illustrating a structure example of a memory cell.
Figure 30B:
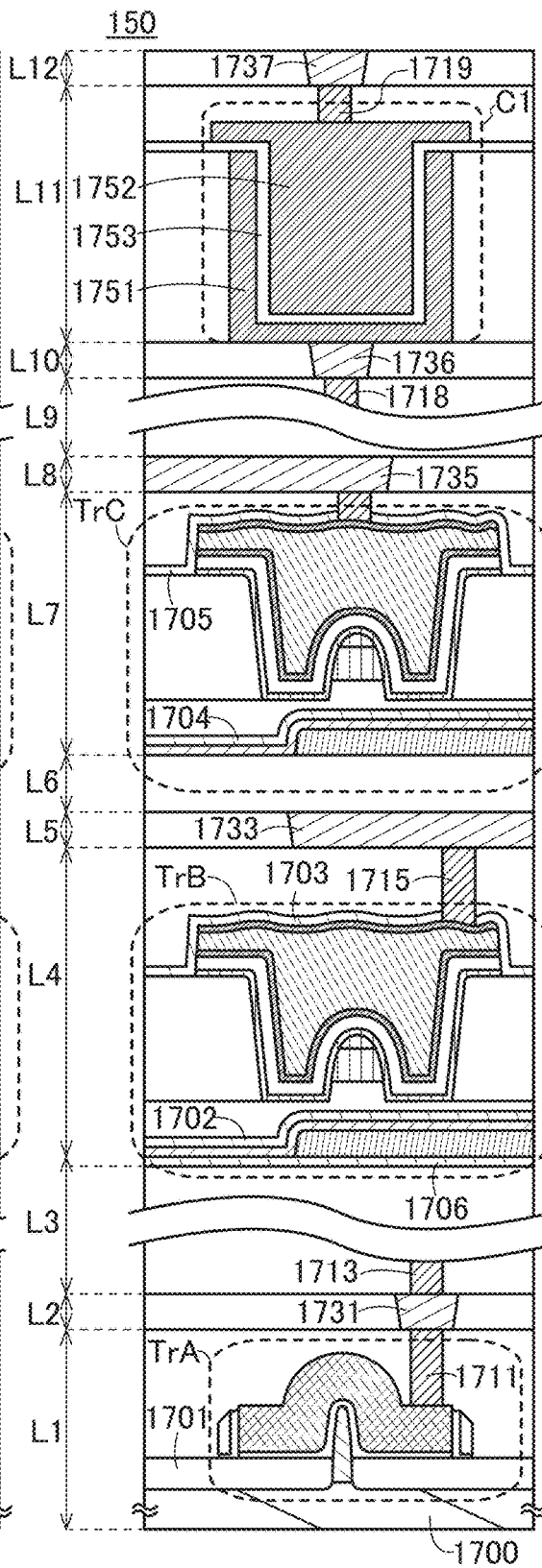

FIGS. 30A and 30B each illustrate part of a cross-sectional view of the memory cell 150. FIG. 30A is a cross-sectional view of transistors included in the memory cell 150 in a channel length direction. FIG. 30B is a cross-sectional view of transistors included in the memory cell 150 in a channel width direction.

The memory cell 150 in FIGS. 30A and 30B includes layers L1, L2, L3, L4, L5, L6, L7, L8, L9, L10, L11, and L12 in the order from the bottom.

The layer L1 includes a substrate 1700, a transistor TrA formed using the substrate 1700, an element isolation layer 1701, and a plurality of conductors such as a conductor 1710 and a conductor 1711.

The layer L2 includes a plurality of wirings such as a wiring 1730 and a wiring 1731.

The layer L3 includes a plurality of conductors such as a conductor 1712 and a conductor 1713 and a plurality of wirings (not illustrated).

The layer L4 includes an insulator 1706, a transistor TrB, an insulator 1702, an insulator 1703, and a plurality of conductors such as a conductor 1714 and a conductor 1715.

The layer L5 includes a plurality of wirings such as a wiring 1732 and a wiring 1733.

The layer L6 includes a plurality of conductors such as a conductor 1716.

The layer L7 includes a transistor TrC, an insulator 1704, an insulator 1705, and a plurality of conductors such as a conductor 1717.

The layer L8 includes a plurality of wirings such as a wiring 1734 and a wiring 1735.

The layer L9 includes a plurality of conductors such as a conductor 1718 and a plurality of wirings (not illustrated).

The layer L10 includes a plurality of wirings such as a wiring 1736.

The layer L11 includes a capacitor C1 and a plurality of conductors such as a conductor 1719. The capacitor C1 includes a first electrode 1751, a second electrode 1752, and an insulating film 1753.

The layer L12 includes a plurality of wirings such as a wiring 1737.

The OS transistor described in Embodiment 5 is preferably used as the transistors TrB and TrC. In FIGS. 30A and 30B, the transistor 1400c in FIGS. 25A and 25B is used as the transistors TrB and TrC.

The transistor TrA is preferably formed using a semiconductor material different from that for the transistors TrB and TrC. In FIGS. 30A and 30B, a Si transistor is used as the transistor TrA.

Note that in FIGS. 30A and 30B, the transistors TrB and TrC include the conductive film 1414 as a back gate electrode; however, the conductive film 1414 is not necessarily provided.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, a base film, or the like may be used as the substrate 1700. Alternatively, a semiconductor element may be formed using one substrate, and then transferred to another substrate. In FIGS. 30A and 30B, as an example, a single crystal silicon wafer is used as the substrate 1700.

The transistor TrA is described in detail with reference to FIGS. 32A and 32B. FIG. 32A is a cross-sectional view of the transistor TrA in the channel length direction, and FIG. 32B is a cross-sectional view of the transistor TrA in the channel width direction. The transistor TrA includes a channel formation region 1793 formed in a well 1792, low concentration impurity regions 1794 and high concentration impurity regions 1795 (also collectively referred to as an impurity region simply), conductive regions 1796 provided in contact with the impurity region, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 796 can be formed using metal silicide or the like.

In the transistor TrA in FIG. 32B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 33A:
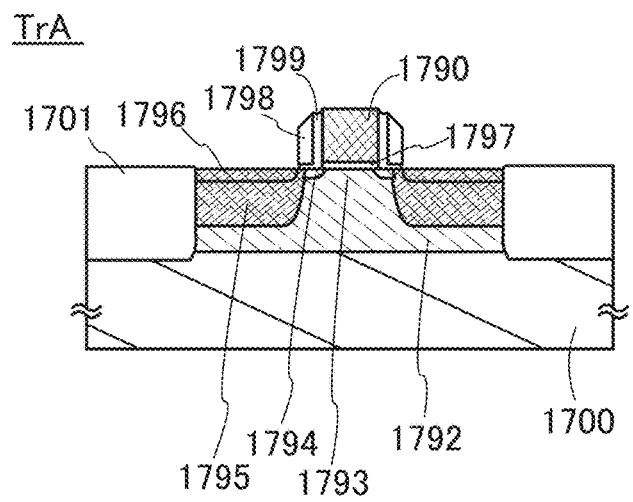
FIGS. 33A and 33B are cross-sectional views illustrating a structure example of a memory cell.
Figure 33B:
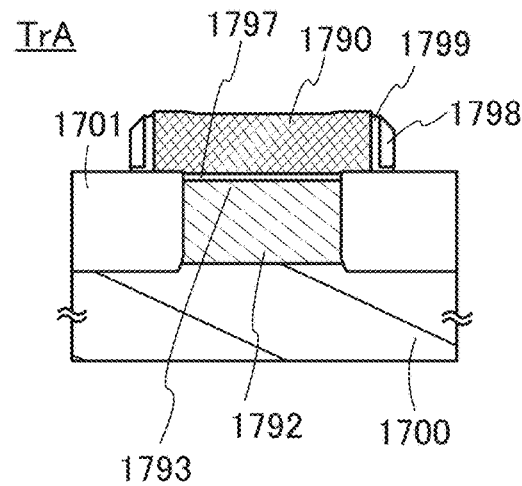

Note that the transistor TrA is not limited to the FIN-type transistor, and may be a planar-type transistor illustrated in FIGS. 33A and 33B. FIG. 33A is a cross-sectional view of the transistor TrA in the channel length direction, and FIG. 33B is a cross-sectional view of the transistor TrA in the channel width direction. The reference numerals in FIGS. 33A and 33B are the same as those in FIGS. 32A and 32B.

In FIGS. 30A and 30B, the insulators 1702 to 1706 preferably have a blocking effect against hydrogen, water, and the like. Water, hydrogen, and the like are factors that generate carriers in an oxide semiconductor; thus, such a blocking layer against hydrogen, water, and the like can improve the reliability of the transistors TrB and TrC. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), or cobalt (Co), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The use of a Cu—Mn alloy is further preferable because manganese oxide formed at the interface with an insulator containing oxygen has a function of preventing Cu diffusion.

In FIGS. 30A and 30B, regions without reference numerals and hatch patterns represent regions formed of an insulator. As the insulator, an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like can be used. Alternatively, in these regions, an organic resin such as a polyimide resin, a polyamide resin, an acrylic resin, a siloxane resin, an epoxy resin, or a phenol resin can be used. Note that in this specification, an oxynitride refers to a substance that contains more oxygen than nitrogen, and a nitride oxide refers to a substance that contains more nitrogen than oxygen.

In the case where OS transistors are used as the transistors TW1 to TW3 described in Embodiment 1, the transistors TW1 to TW3 are preferably formed in the layer L4 or L7.

In the case where Si transistors are used as the transistors TR1 to TR3 described in Embodiment 1, the transistors TR1 to TR3 are preferably formed in the layer L1.

In the case where OS transistors are used as the transistors TR1 to TR3 described in Embodiment 1, the transistors TR1 to TR3 are preferably formed in the layer L4 or L7.

The capacitor CS1 described in Embodiment 1 is preferably formed in the layer L11.

In the case where a driver circuit around the memory cell 150 is formed using an OS transistor, the OS transistor may be formed in the layer L4 or L7.

In the case where a driver circuit around the memory cell 150 is formed using a Si transistor, the Si transistor may be formed in the layer L1.

With the structure illustrated in FIGS. 30A and 30B, the area occupied by the memory cell 150 can be reduced, leading to higher integration of the memory cell.

Note that in the case where the memory cell 150 described in Embodiment 1 has the structure of FIGS. 30A and 30B, the number of transistors (TrA, TrB, and TrC) and the number of capacitors (C1) are sometimes different from those in FIGS. 30A and 30B. In that case, the structure of FIGS. 30A and 30B may be changed as appropriate; for example, the numbers of the layers L4, L7, and L11 are increased or decreased, or an element is additionally provided in a layer.

Although the transistors TrB and TrC included in the memory cell 150 in FIGS. 30A and 30B each have a back gate, the transistors TrB and TrC do not necessarily each have a back gate. For example, in the case where the circuit structures of the memory cells 151, 154, and 155 in FIGS. 3A and 3D to 3G described in the above embodiment are used, the transistors TrB and TrC do not need to each have a back gate.

<Structure Example 2 of Stack of Elements>

Figure 31A:
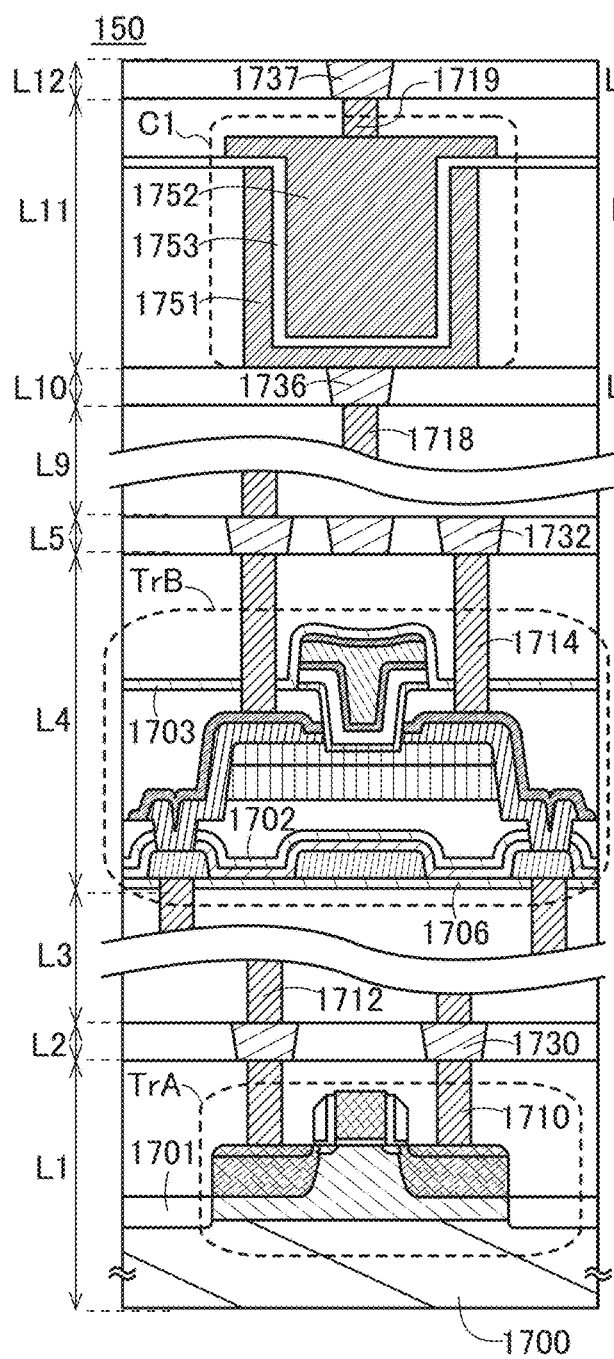
FIGS. 31A and 31B are cross-sectional views each illustrating a structure example of a memory cell.
Figure 31B:
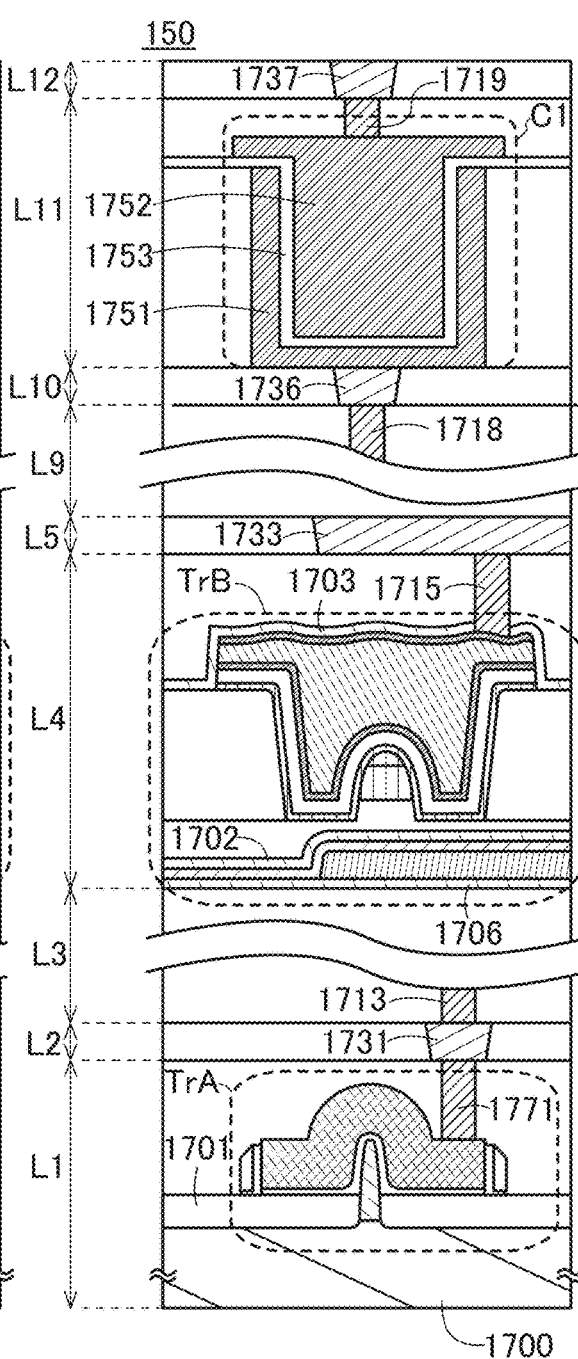

All the OS transistors in the memory cell 150 may be formed in the same layer. An example in that case is illustrated in FIGS. 31A and 31B. As in FIGS. 30A and 30B, FIG. 31A is a cross-sectional view of a transistor included in the memory cell 150 in the channel length direction, and FIG. 31B is a cross-sectional view of a transistor included in the memory cell 150 in the channel width direction.

The cross-sectional views of FIGS. 31A and 31B are different from those of FIGS. 30A and 30B in that the layers L6 to L8 are omitted and the layer L9 is formed on the layer L5. For other details in FIGS. 31A and 31B, the description of FIGS. 30A and 30B is referred to.

In the case where OS transistors are used as the transistors TW1 to TW3 described in Embodiment 1, the transistors TW1 to TW3 are preferably formed in the layer L4.

In the case where Si transistors are used as the transistors TR1 to TR3 described in Embodiment 1, the transistors TR1 to TR3 are preferably formed in the layer L1.

In the case where OS transistors are used as the transistors TR1 to TR3 described in Embodiment 1, the transistors TR1 to TR3 are preferably formed in the layer L4.

The capacitor CS1 described in Embodiment 1 is preferably formed in the layer L11.

In the case where a driver circuit around the memory cell 150 is formed using an OS transistor, the OS transistor may be formed in the layer L4.

In the case where a driver circuit around the memory cell 150 is formed using a Si transistor, the Si transistor may be formed in the layer L1.

With the structure illustrated in FIGS. 31A and 31B, the manufacturing process of the memory cell 150 can be simplified.

Note that in the case where the memory cell 150 described in Embodiment 1 has the structure of FIGS. 31A and 31B, the number of transistors (TrA, TrB, and TrC) and the number of capacitors (C1) are sometimes different from those in FIGS. 31A and 31B. In that case, the structure of FIGS. 31A and 31B may be changed as appropriate; for example, the numbers of the layers L4 and L11 are increased or decreased, or an element is additionally provided in a layer.

Although the transistor TrB included in the memory cell 150 in FIGS. 31A and 31B has a back gate, the transistor TrB does not necessarily have a back gate. For example, in the case where the circuit structures of the memory cells 151, 154, and 155 in FIGS. 3A and 3D to 3G described in the above embodiment are used, the transistor TrB does not need to have a back gate.

<Structure Example 1 of Stack of Memory Cell Arrays>

Although examples of layered structures of the transistor and the capacitor included in the memory cell 150 are described above, one embodiment of the disclosed invention is not limited thereto. For example, a plurality of memory cell arrays 120 including the memory cells 150 may be stacked.

Figure 34:
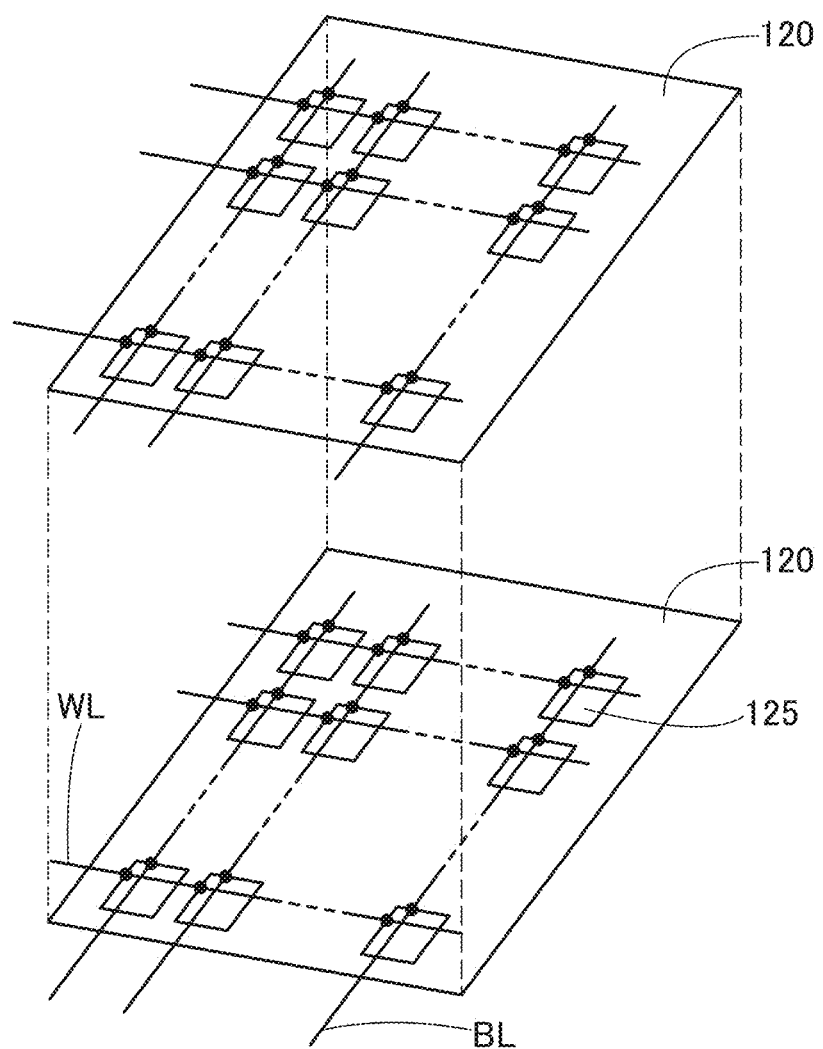
FIG. 34 is a block diagram illustrating a structure example of a memory cell array.

FIG. 34 illustrates a structure where a plurality of memory cell arrays 120 are stacked. Such a circuit structure can increase the capacitance of the memory 104 without an increase in circuit area. Note that although FIG. 34 illustrates a structure where two memory cell arrays 120 are stacked, three or more memory cell arrays 120 may be stacked.

In addition, in the case where an OS transistor is used for the memory cell 125, the memory cell 125 can retain multi-level data. Thus, the capacitance of the memory 104 can be increased without an increase in circuit area.

In other words, in the case where the structure where the memory cell arrays 120 are stacked and the memory cell 125 retains multi-level data, the memory 104 can have high memory capacitance. Note that the structure of a memory that has a layered structure and can retain multi-level data will be described in detail in a structure example 2 where memory cell arrays are stacked.

Furthermore, in the case where the circuit area of the memory 104 is reduced as described above, the area of a peripheral circuit, for example, a circuit that checks and corrects an error, such as an ECC circuit, can be increased. Consequently, the memory system 100 can be made more stable.

<Structure Example 2 of Stack of Memory Cell Arrays>

Figure 35A:
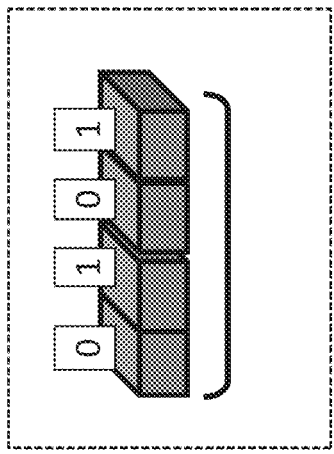
FIGS. 35A to 35D are conceptual diagrams, a circuit diagram, and a schematic diagram illustrating a structure example of a storage device.
Figure 35B:
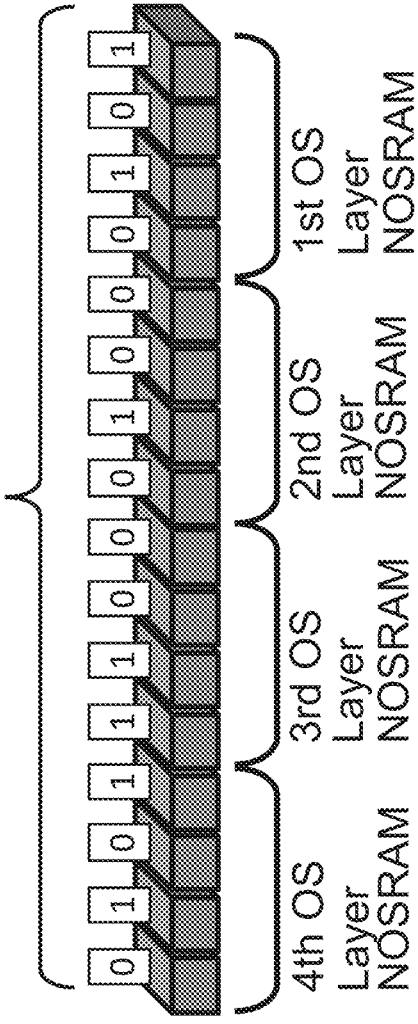
Figure 35D:
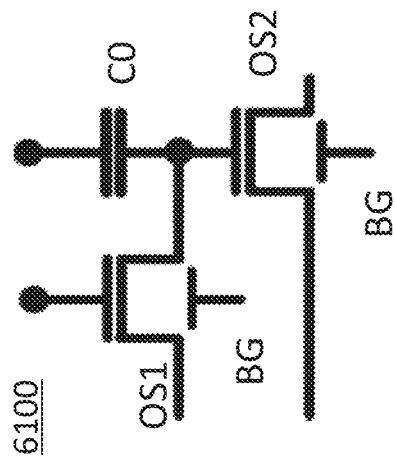
Figure 35C:
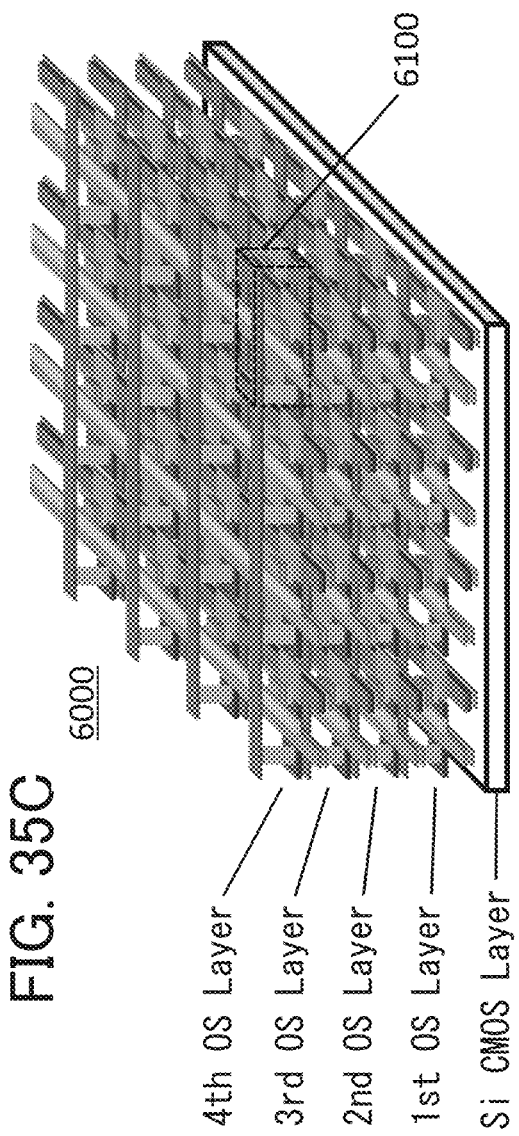

FIG. 35C is a schematic view of a layered structure of a nonvolatile memory that is manufactured using transistors whose channel formation regions include an oxide semiconductor (hereinafter referred to as OS-FETs). Note that in this specification, a nonvolatile memory using OS-FETs is sometimes referred to as a nonvolatile oxide semiconductor random access memory (NOSRAM).

FIGS. 35A and 35B are conceptual diagrams illustrating the case where NOSRAMs are stacked to provide a multi-level storage device. When a one-layer NOSRAM is the minimum unit of a memory cell, J-bit ($2^J$ values, where J is an integer of 1 or more) data is stored in one memory cell, and the memory cells are stacked in K layers (K is an integer of 2 or more), NOSRAMs with a K-layer structure can retain J×K-bit ($2^{J \times K}$ values) data in total. FIG. 35B is a conceptual diagram illustrating the case where one memory cell stores 4-bit data J=4). FIG. 35A is a conceptual diagram illustrating the case where the memory cells are stacked in four layers (K=4) and 4×4=16 bits are assumed as one word.

The circuit diagram in FIG. 35D shows a structure example of a memory cell 6100 that can retain the J-bit data. The memory cell 6100 preferably includes a transistor OS1, a transistor OS2, and a capacitor C0. One of a source and a drain of the transistor OS1 is electrically connected to a gate of the transistor OS2. One terminal of the capacitor C0 is electrically connected to the gate of the transistor OS2.

The transistors OS1 and OS2 are preferably OS-FETs. An OS-FET has extremely low off-state current; thus, data written to the gate of the transistor OS2 can be retained for a long time by turning off the transistor OS1.

Each of the transistors OS and OS2 preferably has a first gate and a second gate (BG). The first gate preferably includes a region that overlaps with the second gate with a channel formation region positioned therebetween. When the transistors OS1 and OS2 each have a second gate, the threshold voltage of the transistors can be controlled. Moreover, on-state current of the transistors can be increased.

The schematic view in FIG. 35C illustrates a structure example of a storage device 6000. The storage device 6000 includes the memory cells 6100 that are stacked. The storage device 6000 includes a CMOS layer including Si transistors and first to fourth OS layers including OS-FETs. The first to fourth OS layers are formed over the CMOS layer. The first to fourth OS layers each include the memory cell 6100. The CMOS layer has a function of controlling the memory cells.

Figure 36:
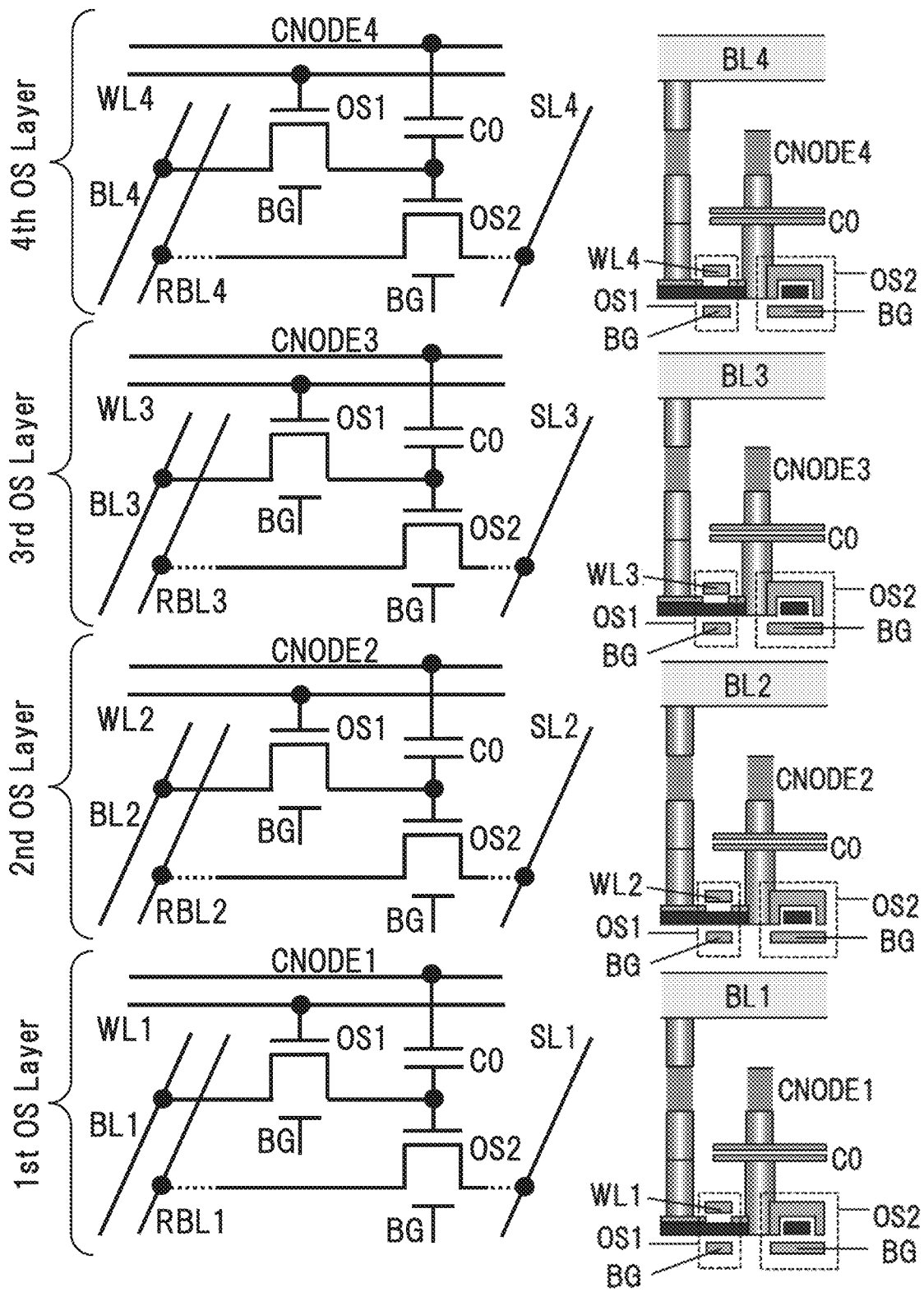
FIG. 36 illustrates circuit diagrams and cross-sectional views illustrating a structure example of a storage device.

FIG. 36 illustrates detailed structure examples of the first OS layer (referred to as "1st OS Layer" in FIG. 36), the second OS layer (referred to as "2nd OS Layer" in FIG. 36), the third OS layer (referred to as "3rd OS Layer" in FIG. 36), and the fourth OS layer (referred to as "4th OS Layer" in FIG. 36) in the storage device 6000. The left half of FIG. 36 illustrates circuit diagrams, and the right half of FIG. 36 illustrates cross-sectional views corresponding to the circuit diagrams.

In the first OS layer, the gate of the transistor OS1 is electrically connected to a wiring WL1. The other of the source and the drain of the transistor OS1 is electrically connected to a wiring BL1. One of a source and a drain of the transistor OS2 is electrically connected to a wiring SL1. The other of the source and the drain of the transistor OS2 is electrically connected to a wiring RBL1. The other terminal of the capacitor C0 is electrically connected to a wiring CNODE1.

In the second to fourth OS layers, for wirings WL2, WL3, and WL4, the description of the wiring WL1 is to be referred to; for wirings BL2, BL3, and BL4, the description of the wiring BL1 is to be referred to; for wirings SL2, SL3, and SL4, the description of the wiring SL1 is to be referred to; for wirings RBL2, RBL3, and RBL4, the description of the wiring RBL1 is to be referred to; and for wirings CNODE2, CNODE3, and CNODE4, the description of the wiring CNODE1 is to be referred to.

A flash memory has a limit on endurance and needs to erase old data when stored data is updated. The storage device 6000 does not have a limit on endurance, and data can be rewritten $10^{12}$ times or more. In addition, new data can be written to the storage device 6000 without erasing old data. The storage device 6000 can write and read data at lower voltage than a flash memory. Since OS-FETs can be easily stacked, the storage device 6000 can easily become a multi-level storage device.

Table 1 shows the technology node of the OS-FET included in the NOSRAM, the area occupied by the memory cell 6100 ($F^2$/cell, cell area), and the area per bit of the memory cell 6100 ($F^2$/bit, area per bit). Note that as the area per bit (hereinafter referred to as bit area), values obtained when the memory cells 6100 are stacked in four layers as illustrated in FIG. 35C and FIG. 36 are listed. Note that the technology node of an OS-FET primarily means the channel length of the OS-FET. Table 1 also shows, for comparison, values of a solid state drive (SSD) with 256 GB (gigabytes) fabricated using a three-dimensional NAND flash memory.

TABLE 1

| Technology node (Design rule) | $F^2$/cell | $F^2$/bit (4-layered) | Cell Area | Area per bit (4-layered) |
|---|---|---|---|---|
| 10 nm | ≥16.5 | ≥1.03 | 0.0016 µm² (1600 nm²) | 0.00010 µm² (100 nm²) |
| 15 nm | ≥16.5 | ≥1.03 | 0.0037 µm² (3700 nm²) | 0.00023 µm² (230 nm²) |
| 30 nm | ≥16.5 | ≥1.03 | 0.0150 µm² (15000 nm²) | 0.00095 µm² (950 nm²) |
| 3D-NAND | ≥5.2 | ≥2.6 | 0.0179 µm² (17900 nm²) | 0.00028 µm² (280 nm²) |

Figure 37:
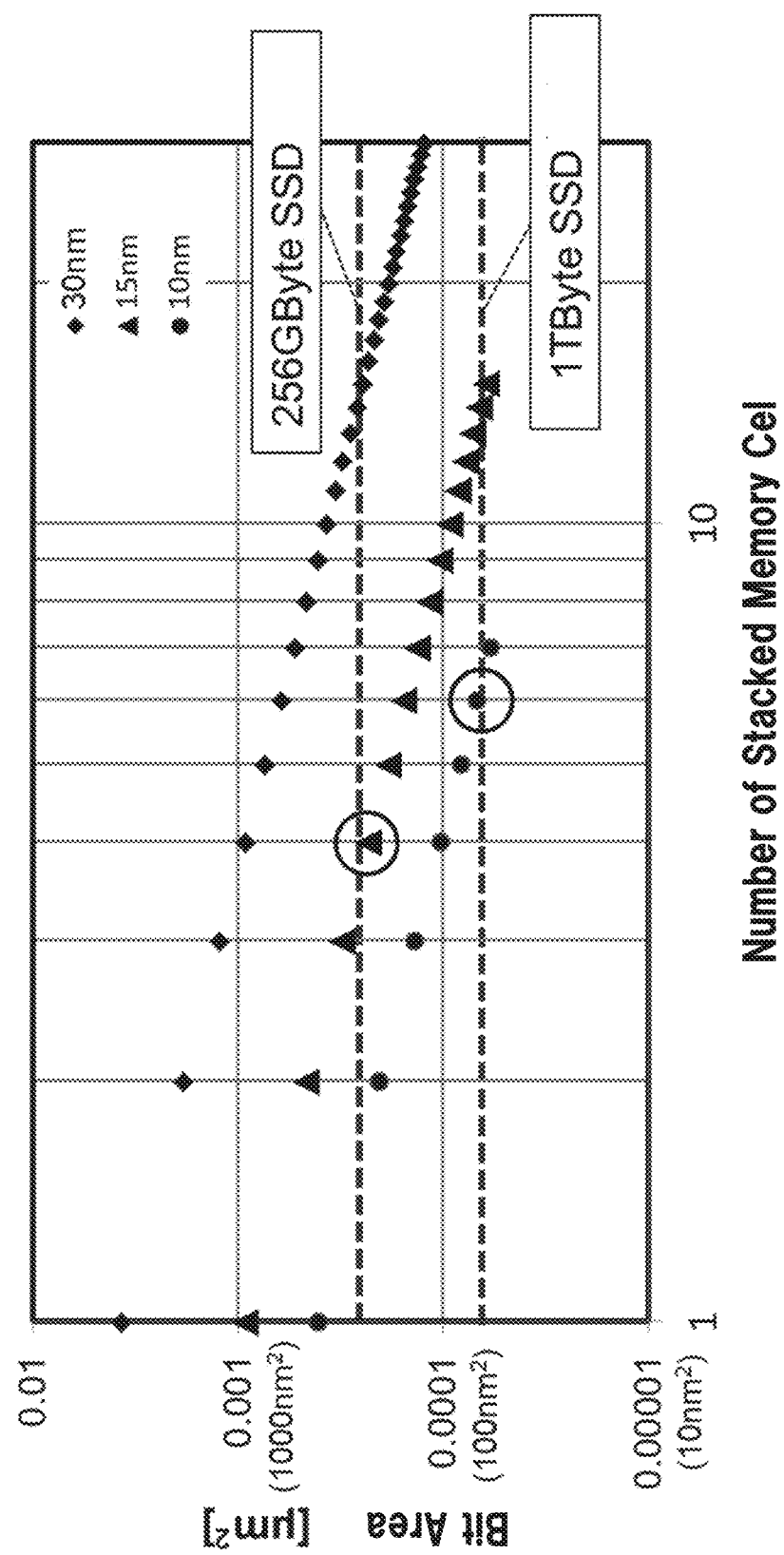
FIG. 37 shows relationship between the number of stacked memory cells and bit area of a storage device.

Next, the bit area as a function of the number of the memory cells 6100 stacked is discussed. FIG. 37 is a graph whose vertical axis represents the bit area and whose horizontal axis represents the number of memory cells 6100 stacked. From FIG. 37, the memory cells 6100 each of which is manufactured using an OS-FET with a 15-nm node and which are stacked in four layers as illustrated in FIG. 35C and FIG. 36 have substantially the same bit area as a 256-GB SSD. Furthermore, the memory cells 6100 each of which is manufactured using an OS-FET with the 10-nm node and which are stacked in six layers have substantially the same bit area as a 1-TB SSD. In other words, a storage device in which the memory cells 6100 each manufactured using an OS-FET with the 10-nm node are stacked in six layers can have a memory capacity of 1 TB or more.

Figure 38:
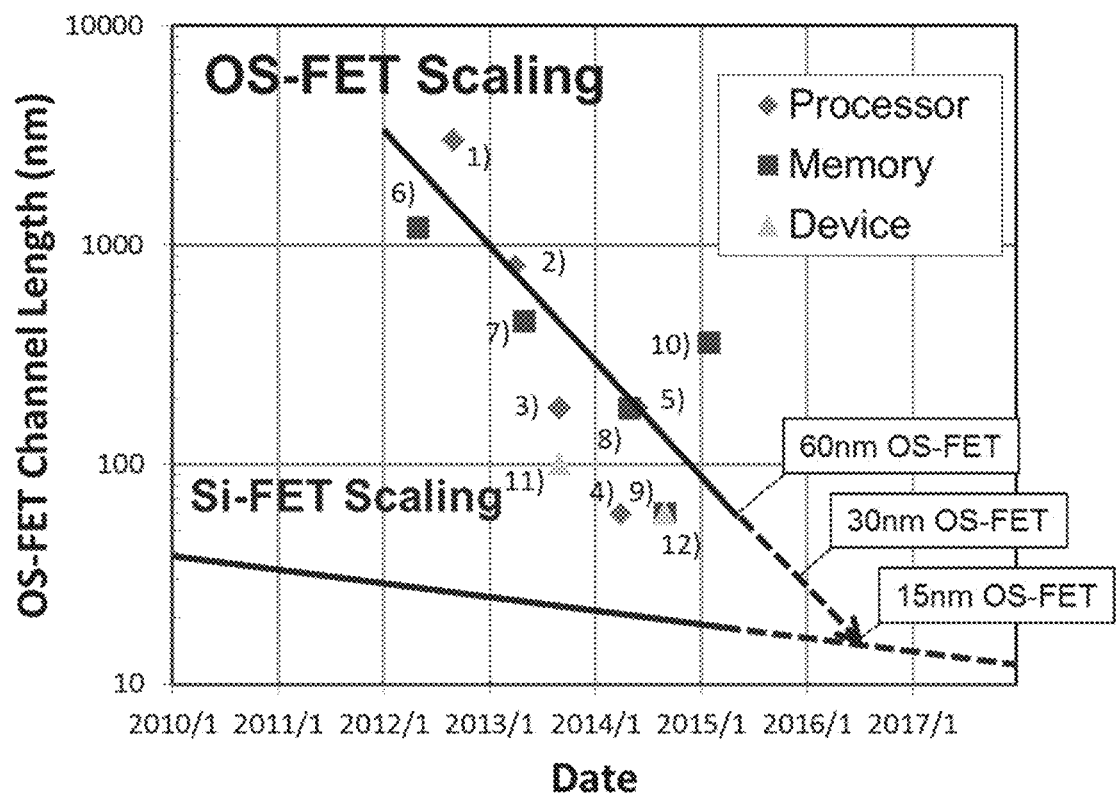
FIG. 38 shows changes in channel length of OS-FETs.

FIG. 38 shows changes in channel length of OS-FETs based on Non-Patent Documents 1 to 12. In FIG. 38, 1) to 12) respectively denote the channel lengths of OS-FETs disclosed in Non-Patent Documents 1 to 12. From FIG. 38, scaling of OS-FETs is such that the channel length is reduced by half in six months. For comparison, FIG. 38 also shows an example of Si transistors (hereinafter referred to as Si-FETs). The OS-FETs are miniaturized in a shorter period than the Si-FETs. FIG. 38 also reveals that the channel length of OS-FETs can reach that of Si-FETs in 2016.

Note that this embodiment can be combined with any of the other embodiments in this specification as appropriate.

Embodiment 7

Structures of an oxide semiconductor film applicable to the OS transistors described in the above embodiments are described in this embodiment.

<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 39A:
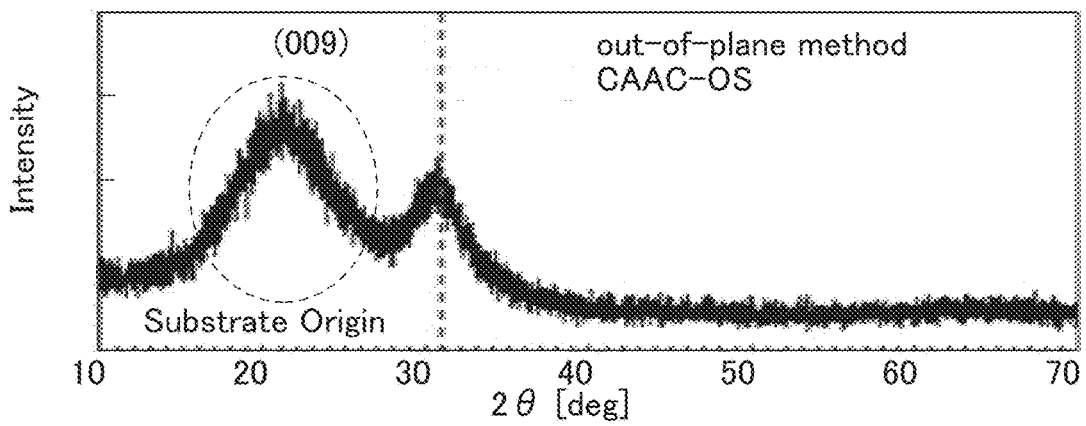
FIGS. 39A to 39E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 39A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 39B:
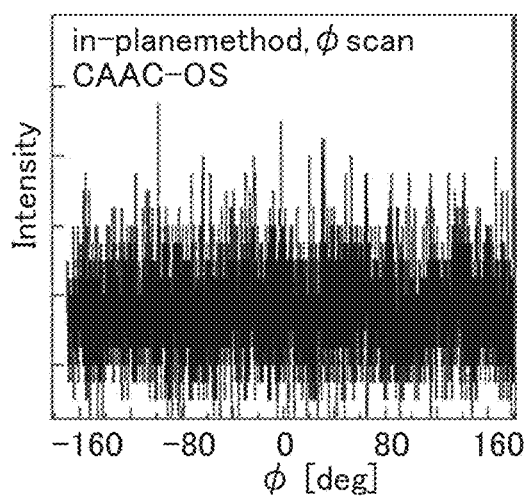
Figure 39C:
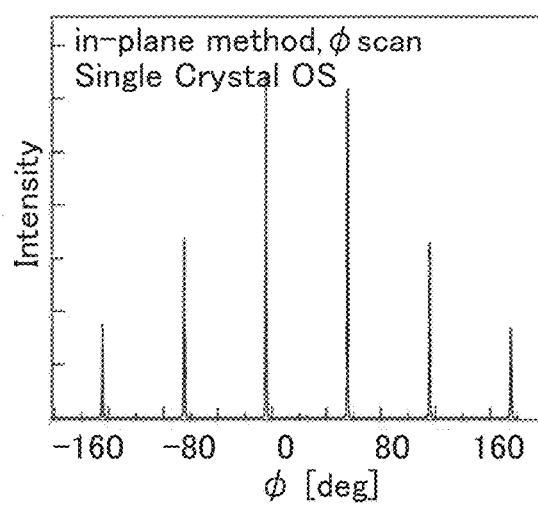

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (φ scan) is performed with 2θ fixed at around 56° and with the sample rotated using a normal vector to the sample surface as an axis (φ axis), as shown in FIG. 39B, a peak is not clearly observed. In contrast, in the case where single crystal $InGaZnO_4$ is subjected to φ scan with 2θ fixed at around 56°, as shown in FIG. 39C, six peaks which are derived from crystal planes equivalent to the (110) plane are observed. Accordingly, the structural analysis using XRD shows that the directions of a-axes and b-axes are irregularly oriented in the CAAC-OS.

Figure 39D:
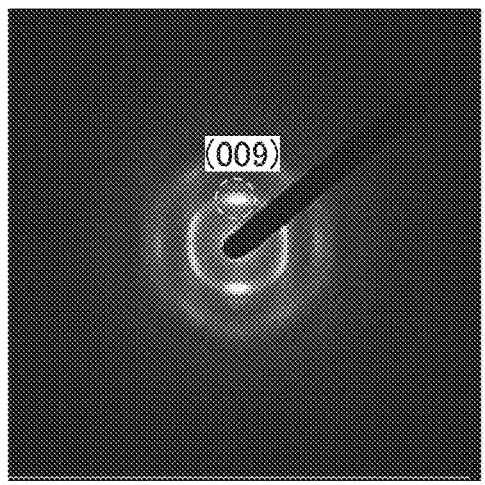
Figure 39E:
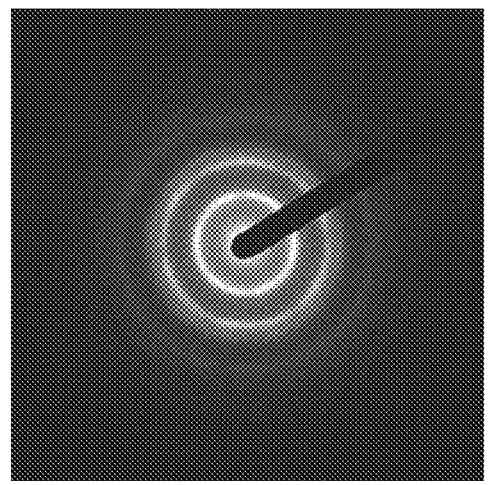

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 39D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 39E shows a diffraction pattern obtained in such a manner that an electron beam with a probe diameter of 300 nm is incident on the same sample in a direction perpendicular to the sample surface. As shown in FIG. 39E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 39E is considered to be derived from the (010) plane, the (100) plane, and the like of the $InGaZnO_4$ crystal. The second ring in FIG. 39E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 40A:
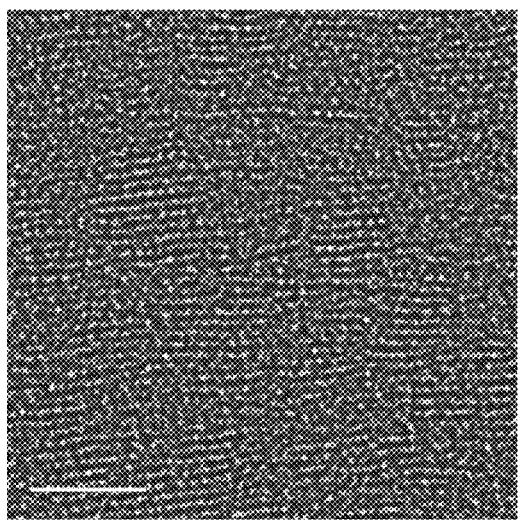
FIGS. 40A to 40E show a cross-sectional TEM image and plan-view TEM images of a CAAC-OS and images obtained through analysis thereof.

FIG. 40A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 40A shows pellets in which metal atoms are arranged in a layered manner. FIG. 40A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 40B:
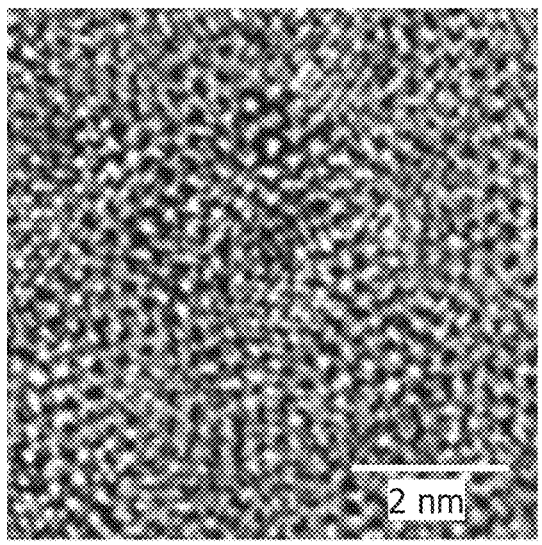
Figure 40C:
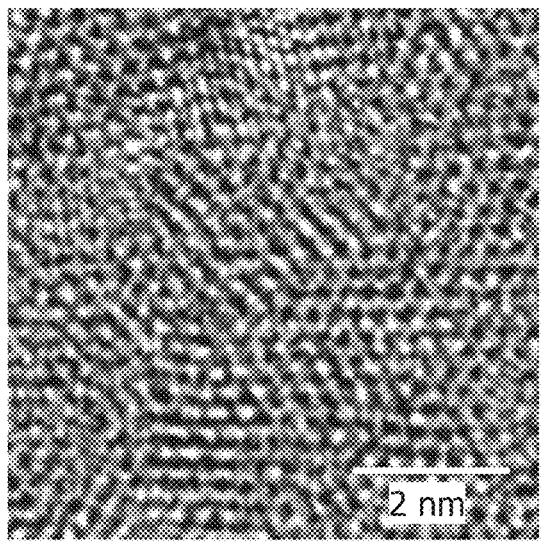
Figure 40D:
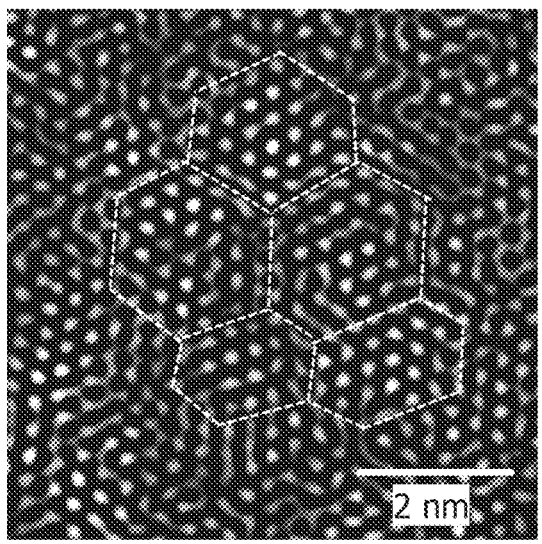
Figure 40E:
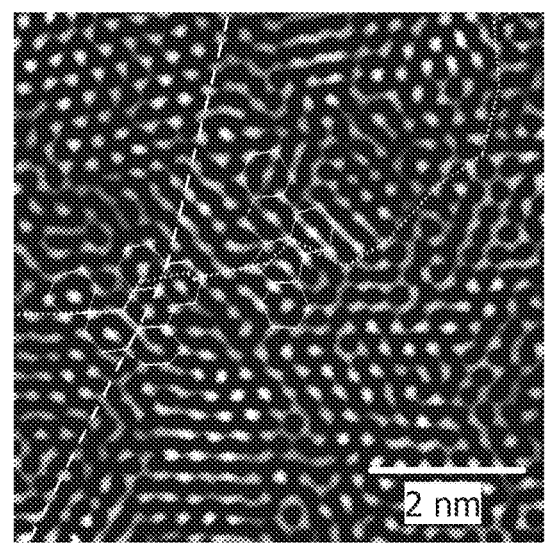

FIGS. 40B and 40C show Cs-corrected high-resolution TEM images of a plane of the CAAC-OS observed from a direction substantially perpendicular to the sample surface. FIGS. 40D and 40E are images obtained through image processing of FIGS. 40B and 40C. The method of image processing is as follows. The image in FIG. 40B is subjected to fast Fourier transform (FFT), so that an FFT image is obtained. Then, mask processing is performed such that a range of from 2.8 to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 40D, a portion where a lattice arrangement is broken is shown by a dashed lines. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 40E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<Nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 41A:
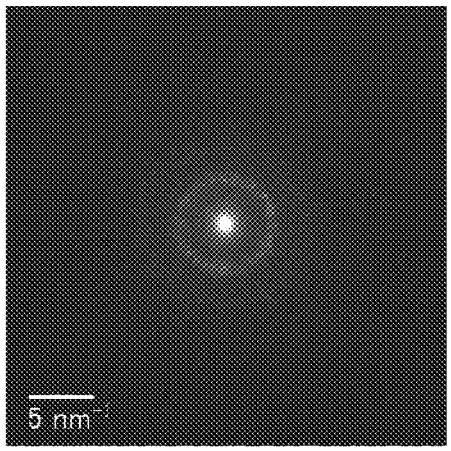
FIGS. 41A to 41D show electron diffraction patterns and a cross-sectional TEM image of an nc-OS.
Figure 41B:
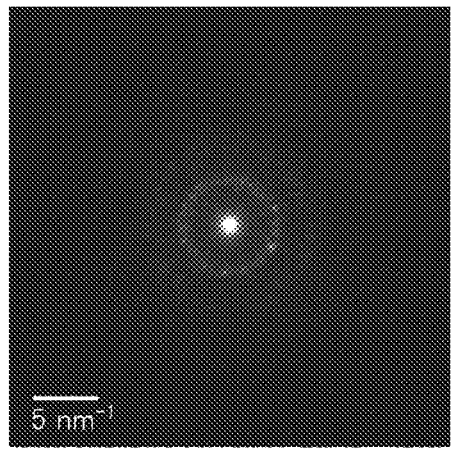

For example, when an electron beam with a probe diameter of 50 nm is incident on a 34-nm-thick region of a thinned nc-OS including an InGaZnO$_4$ crystal in a direction parallel to the formation surface, a ring-shaped diffraction pattern (nanobeam electron diffraction pattern) shown in FIG. 41A is observed. FIG. 41B shows a diffraction pattern obtained when an electron beam with a probe diameter of 1 nm is incident on the same sample. As shown in FIG. 41B, a plurality of spots are observed in a ring-like region. In other words, ordering in an nc-OS is not observed with an electron beam with a probe diameter of 50 nm but is observed with an electron beam with a probe diameter of 1 nm.

Figure 41C:
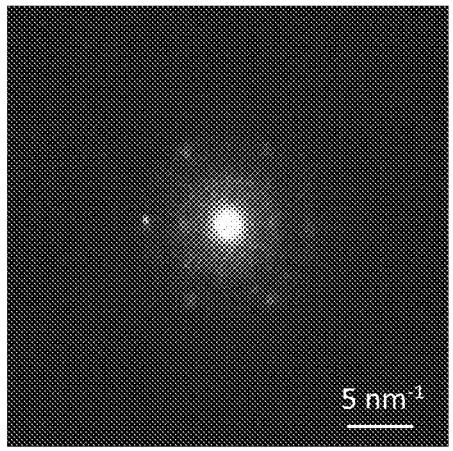

Furthermore, an electron diffraction pattern in which spots are arranged in an approximately hexagonal shape is observed in some cases as shown in FIG. 41C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 41D:
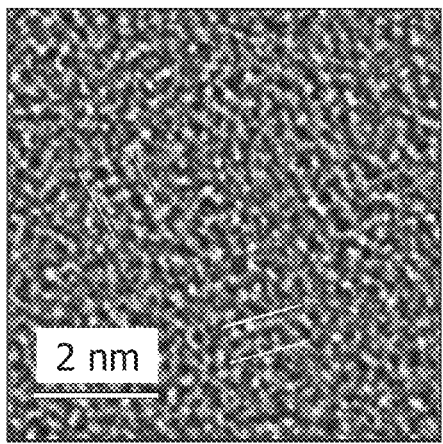

FIG. 41D shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines in FIG. 41D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<A-Like OS>

An a-like OS is an oxide semiconductor having a structure between the nc-OS and the amorphous oxide semiconductor.

Figure 42A:
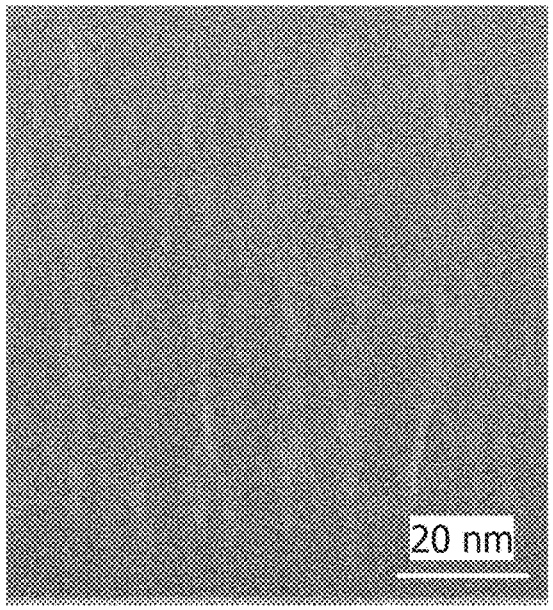
FIGS. 42A and 42B show cross-sectional TEM images of an a-like OS.
Figure 42B:
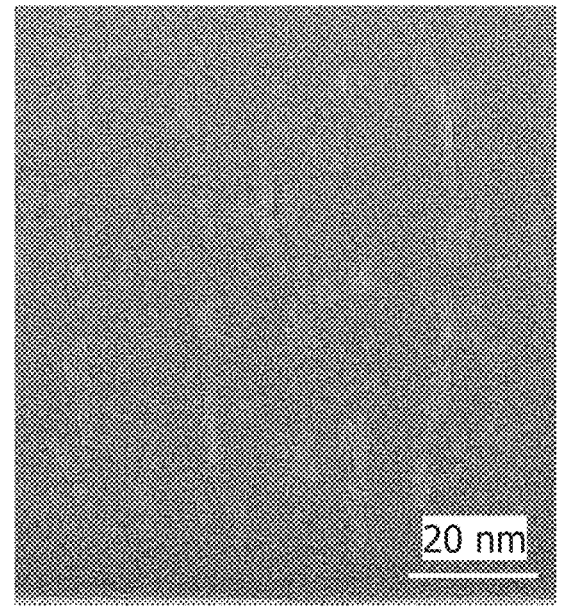

FIGS. 42A and 42B are high-resolution cross-sectional TEM images of an a-like OS. FIG. 42A is the high-resolution cross-sectional TEM image of the a-like OS at the start of electron irradiation. FIG. 42B is the high-resolution cross-sectional TEM image of a-like OS after electron (e$^-$) irradiation at $4.3 \times 10^8$ e$^-$/nm$^2$. FIGS. 42A and 42B show that stripe-like bright regions extending vertically are observed in the a-like OS from the start of electron irradiation. It can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 43:
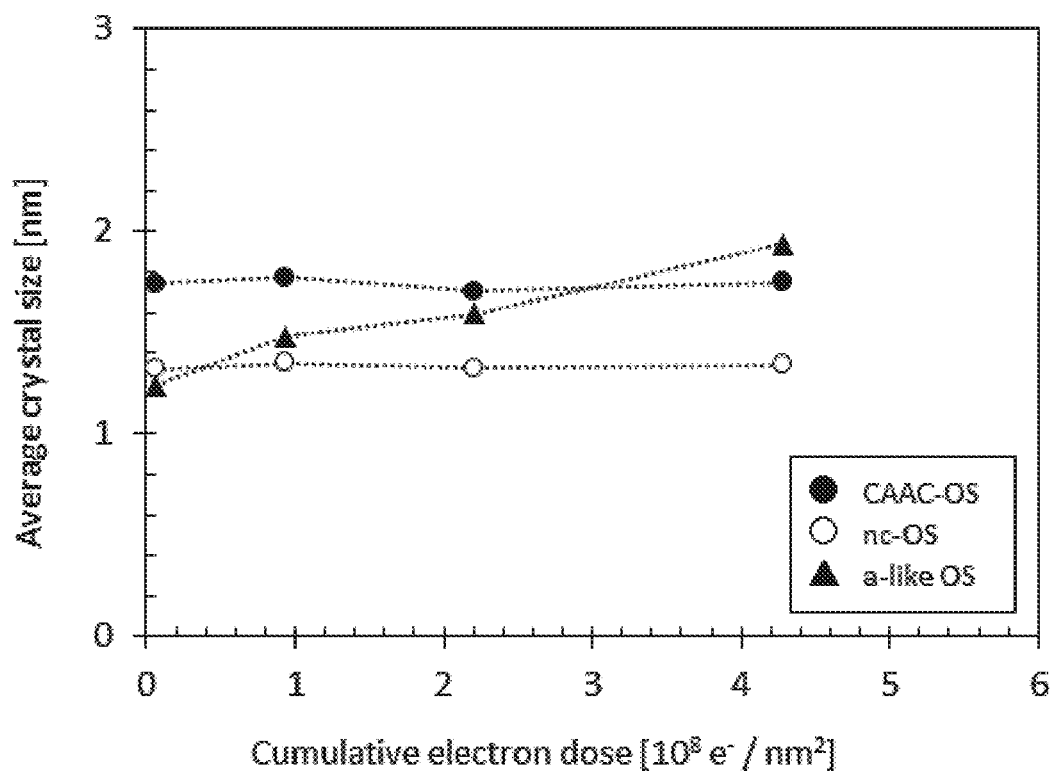
FIG. 43 shows changes in crystal parts of In—Ga—Zn oxides induced by electron irradiation.

FIG. 43 shows a change in the average size of crystal parts (at 22 to 30 points) in each sample. Note that the crystal part size corresponds to the length of the lattice fringe. FIG. 43 indicates that the crystal part size in the a-like OS increases with an increase in the cumulative electron dose in obtaining TEM images, for example. As shown in FIG. 43, a crystal part of approximately 1.2 nm (also referred to as an initial nucleus) at the start of TEM observation grows to a size of approximately 1.9 nm at a cumulative electron (e$^-$) dose of 4.2×10$^8$ e$^-$/nm$^2$. In contrast, the crystal part sizes in the nc-OS and the CAAC-OS show little change from the start of electron irradiation to a cumulative electron dose of 4.2×10$^8$ e$^-$/nm$^2$. As shown in FIG. 43, the crystal part sizes in the nc-OS and the CAAC-OS are approximately 1.3 nm and approximately 1.8 nm, respectively, regardless of the cumulative electron dose. For electron beam irradiation and TEM observation, a Hitachi H-9000NAR transmission electron microscope was used. The conditions of electron beam irradiation were as follows: accelerating voltage was 300 kV; current density was 6.7×10$^5$ e$^-$/(nm$^2$·s); and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (V$_O$) and impurities in the oxide semiconductor.

As the amount of oxygen vacancy in the oxide semiconductor increases, the density of defect states increases when hydrogen is bonded to the oxygen vacancy (this state is also referred to as V$_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than 8×10$^{15}$ cm$^{-3}$, preferably lower than 1×10$^{11}$ cm$^{-3}$, and more preferably lower than 1×10$^{10}$ cm$^{-3}$ and higher than or equal to 1×10$^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the I$_d$-V$_g$ characteristics of the transistor can be regarded as substantially intrinsic. Furthermore, an oxide semiconductor that has high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to 1×10$^5$ cm$^{-3}$ and lower than 1×10$^{18}$ cm$^{-3}$, more preferably higher than or equal to 1×10$^7$ cm$^{-3}$ and lower than or equal to 1×10$^{17}$ cm$^{-3}$, still more preferably higher than or equal to 1×10$^9$ cm$^{-3}$ and lower than or equal to 5×10$^{16}$ cm$^{-3}$, yet more preferably higher than or equal to 1×10$^{10}$ cm$^{-3}$ and lower than or equal to 1×10$^{16}$ cm$^{-3}$, and yet still more higher than or equal to 1×10$^{11}$ cm$^{-3}$ and lower than or equal to 1×10$^{15}$ cm$^{-3}$.

Note that this embodiment can be combined with any of the other embodiments in this specification as appropriate.

(Notes on the Description of the Specification and the Like)

The following are notes on the description of structures in the above embodiments.

Notes on One Embodiment of the Present Invention Described in Embodiments

One embodiment of the present invention can be constituted by combining the structure described in an embodiment with any of the structures described in the other embodiments as appropriate. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Notes on Ordinal Numbers

In this specification and the like, ordinal numbers such as "first," "second," and "third" are used in order to avoid confusion among components. Thus, the terms do not limit the number or order of components. In this specification and the like, a "first" component in one embodiment can be referred to as a "second" component in other embodiments or claims. Alternatively, in this specification and the like, a "first" component in one embodiment can be omitted in other embodiments or claims.

Notes on the Description for Drawings

Embodiments are described with reference to drawings. However, the embodiments can be implemented with various modes. It will be readily appreciated by those skilled in the art that modes and details can be changed in various ways without departing from the spirit and scope of the present invention. The present invention therefore should not be construed as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relationship between components with reference to drawings. The positional relationship between components is changed as appropriate in accordance with a direction in which each component is described. Thus, the positional relationship is not limited to that described with a term used in this specification and can be explained with another term as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed using the same material, or components formed at the same time are denoted by the same reference numerals in some cases, and the description thereof is not repeated in some cases.

Notes on Expressions that can be Rephrased

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, voltage and potential can be replaced with each other. The voltage refers to a potential difference from a reference potential. When the reference potential is a ground potential, for example, a voltage can be replaced with a potential. The ground potential does not necessarily mean 0 V. Potentials are relative values, and a potential supplied to a wiring or the like is sometimes changed depending on the reference potential.

In this specification and the like, the terms "film," "layer," and the like can be interchanged with each other depending on circumstances or conditions. For example, the term "conductive layer" can be changed into the term "conductive film" in some cases. Moreover, the term "insulating film" can be changed into the term "insulating layer" in some cases, or can be replaced with a word not including the term "film" or "layer." For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring," "signal line," "power supply line," and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

Notes on Definitions of Terms

The following are definitions of the terms mentioned in the above embodiments.
<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

An impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Furthermore, in the case where the semiconductor is a silicon layer, examples of an impurity which changes characteristics of the semiconductor include oxygen, Group 1 elements except hydrogen, Group 2 elements, Group 13 elements, and Group 15 elements.
<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.
<<Switch>>

In this specification and the like, a switch is conducting or not conducting (is turned on or off) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.
<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.
<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relationship shown in drawings and texts, without limiting to a predetermined connection relationship, for example, the connection relationship shown in the drawings and the texts.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in that order." When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that an angle formed between two straight lines is greater than or equal to −10° and less than or equal to 10°, and accordingly also includes the case where an angle is greater than or equal to −5° and less than or equal to 5°. The term "substantially parallel" indicates that an angle formed between two straight lines is greater than or equal to −30° and less than or equal to 30°. The term "perpendicular" indicates that an angle formed between two straight lines is greater than or equal to 80° and less than or equal to 100°, and accordingly also includes the case where an angle is greater than or equal to 85° and less than or equal to 95°. The term "substantially perpendicular" indicates that an angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial No. 2015-106706 filed with Japan Patent Office on May 26, 2015, the entire contents of which are hereby incorporated by reference.

What is claimed is:

1. A memory system comprising:
a memory including a user data region, a first management region, a second management region, and a third management region;
a circuit; and
a processor,
wherein the memory system is configured to receive write data and a logical address of the write data from an outside,
wherein the logical address includes index data and an offset,
wherein the user data region includes a user data block storing the write data,
wherein the circuit is configured to sequentially perform error check and correct processings on the write data read from the user data block,
wherein the first management region stores first data, the first data has a first value showing that the user data block does not store the write data or a second value showing that the user data block stores the write data,
wherein the second management region stores second data, the second data has a third value showing that the circuit does not perform the error check and correct processings on the write data read from the user data block or a fourth value showing that the circuit has performed the error check and correct processings on the write data read from the user data block,
wherein the third management region includes a plurality of memory blocks,
wherein the plurality of memory blocks store the index data and third data indicating address data of the user data block,
wherein when the write data is read from the user data block, in the third management region, the processor refers to the address data from the index data and calculates a physical address from the address data and the offset, and
wherein the memory system is configured to determine whether to perform the error check and correct processings on the write data read from the user data block on the basis of the second data.

2. The memory system according to claim 1,
wherein the first management region includes a plurality of first blocks,
wherein the user data region includes a plurality of user data blocks including the user data block,
wherein the plurality of first blocks are associated with the plurality of user data blocks, and
wherein when the write data is stored in one of the plurality of user data blocks, the processor sets a value of the first data to the second value in one of the plurality of first blocks corresponding to the one of the plurality of user data blocks.

3. The memory system according to claim 1,
wherein the second management region includes a plurality of second blocks,
wherein the user data region includes a plurality of user data blocks including the user data block,
wherein the plurality of second blocks are associated with the plurality of user data blocks, and
wherein when the error check and correct processings are performed on the write data read from one of the plurality of user data blocks, the processor sets a value of the second data to the fourth value in one of the plurality of second blocks corresponding to the one of the plurality of user data blocks.

4. The memory system according to claim 1, wherein when power is turned on, the processor erases the third data included in the plurality of memory blocks.

5. The memory system according to claim 1, wherein when power is turned on, the processor writes the first value to the first management region and writes the third value to the second management region.

6. The memory system according to claim 1,
wherein the memory includes a plurality of memory cells,
wherein each of the plurality of memory cells includes a retention node and a transistor configured to control charging and discharging of the retention node, and
wherein the transistor includes a channel formation region formed in an oxide semiconductor.

7. The memory system according to claim 1,
wherein the memory includes a plurality of memory cell arrays, and
wherein the memory includes a structure where the plurality of memory cell arrays overlap.

8. The memory system according to claim 1, wherein memory capacity of the memory is equal to or greater than one terabyte.

9. An information processing system comprising:
the memory system according to claim 1; and
a host device,
wherein the host device is connected to the memory system so that the host device can access the user data region.

10. A memory system comprising:
a memory including a user data region, a first management region, a second management region, and a third management region;
a circuit; and
a processor,
wherein the memory system is configured to receive write data and a logical address of the write data from an outside,
wherein the logical address includes index data and an offset,
wherein the user data region stores the write data,
wherein the circuit is configured to sequentially perform error check and correct processings on the write data stored in the user data region,
wherein the first management region stores first data, the first data has a first value showing that the user data region does not store the write data or a second value showing that the user data region stores the write data,
wherein the second management region stores second data on a history of the error check and correct processings,
wherein the third management region includes a plurality of memory blocks,
wherein the plurality of memory blocks store the index data and third data indicating address data of the user data block, and
wherein when the write data is read from the user data block, in the third management region, the processor refers to the address data from the index data and calculates a physical address from the address data and the offset.

11. The memory system according to claim 10,
wherein the memory includes a plurality of memory cells,
wherein each of the plurality of memory cells includes a transistor, and
wherein the transistor includes a channel formation region formed in an oxide semiconductor.

12. The memory system according to claim 10,
wherein the memory system is configured to determine whether to perform the error check and correct processings on the basis of the second data.

* * * * *